(12) United States Patent
Miyairi et al.

(10) Patent No.: US 8,143,170 B2
(45) Date of Patent: Mar. 27, 2012

(54) MANUFACTURING METHOD OF SEMICONDUCTOR DEVICE

(75) Inventors: Hidekazu Miyairi, Kanagawa (JP); Yuta Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 220 days.

(21) Appl. No.: 12/704,704

(22) Filed: Feb. 12, 2010

(65) Prior Publication Data

US 2010/0210078 A1    Aug. 19, 2010

(30) Foreign Application Priority Data

Feb. 13, 2009  (JP) ................. 2009-030647

(51) Int. Cl.
*H01L 21/302* (2006.01)
*H01L 21/461* (2006.01)
*H01L 21/027* (2006.01)
*H01L 21/00* (2006.01)
*H01L 21/84* (2006.01)
*H01L 21/30* (2006.01)
*H01L 21/46* (2006.01)

(52) U.S. Cl. .......... 438/735; 438/22; 438/149; 438/458; 438/942; 257/E21.023

(58) Field of Classification Search .............. 438/22, 438/149, 155, 458, 706–708, 717, 735, 942; 257/E21.023, E21.035, E21.231, E21.232, 257/E21.234, E21.257

See application file for complete search history.

(56) References Cited

U.S. PATENT DOCUMENTS

| | | | |
|---|---|---|---|
| 4,409,134 A | 10/1983 | Yamazaki | |
| 6,008,065 A | 12/1999 | Lee et al. | |
| 6,191,007 B1 | 2/2001 | Matsui et al. | |
| 6,335,231 B1 | 1/2002 | Yamazaki et al. | |
| 6,372,609 B1 | 4/2002 | Aga et al. | |
| 6,485,997 B2 | 11/2002 | Lee et al. | |
| 6,493,048 B1 | 12/2002 | Baek et al. | |
| 6,534,380 B1 | 3/2003 | Yamauchi et al. | |

(Continued)

FOREIGN PATENT DOCUMENTS

JP    64-084669 A    3/1989

(Continued)

OTHER PUBLICATIONS

Kim et al.; "A Novel Four-Mask-Count Process Architecture for TFT-LCDs"; SID Digest '00 : SID International Symposium Digest of Technical Papers; 2000; pp. 1006-1009; vol. 31.

*Primary Examiner* — Charles Garber
*Assistant Examiner* — Calvin Choi
(74) *Attorney, Agent, or Firm* — Fish & Richardson P.C.

(57) ABSTRACT

A single crystal semiconductor layer is provided over a base substrate with a second insulating film, a first conductive film, and a first insulating film interposed therebetween; an impurity element having one conductivity type is selectively added to the single crystal semiconductor layer, using a first resist mask; the first resist mask is removed; a second conductive film is formed over the single crystal semiconductor layer; a second resist mask having a depression is formed over the second conductive film; a first etching is performed on the first insulating film, the first conductive film, the second insulating film, the single crystal semiconductor layer, and the second conductive film, using the second resist mask; and a second etching with accompanying side-etching is performed on a part of the first conductive film to form a pattern of a gate electrode layer.

15 Claims, 49 Drawing Sheets

U.S. PATENT DOCUMENTS

| | | |
|---|---|---|
| 6,635,581 B2 | 10/2003 | Wong |
| 7,148,124 B1 | 12/2006 | Usenko |
| 7,223,643 B2 | 5/2007 | Ohnuma et al. |
| 2001/0049064 A1 | 12/2001 | Lee et al. |
| 2003/0183876 A1 | 10/2003 | Takafuji et al. |
| 2006/0290867 A1 | 12/2006 | Ahn et al. |
| 2007/0002249 A1 | 1/2007 | Yoo et al. |
| 2007/0126969 A1 | 6/2007 | Kimura et al. |
| 2007/0139571 A1 | 6/2007 | Kimura |
| 2007/0146591 A1 | 6/2007 | Kimura et al. |
| 2007/0222936 A1 | 9/2007 | Shih |
| 2009/0101906 A1 | 4/2009 | Hosoya et al. |
| 2009/0104723 A1 | 4/2009 | Hosoya et al. |
| 2009/0111198 A1 | 4/2009 | Fujikawa et al. |
| 2009/0117691 A1 | 5/2009 | Fujikawa et al. |
| 2009/0148970 A1 | 6/2009 | Hosoya et al. |
| 2009/0152559 A1 | 6/2009 | Miyairi et al. |

FOREIGN PATENT DOCUMENTS

| | | |
|---|---|---|
| JP | 03-011744 A | 1/1991 |
| JP | 03-161938 A2 | 7/1991 |
| JP | 05-326963 A | 12/1993 |
| JP | 2000-124092 A | 4/2000 |
| JP | 2003-179069 A | 6/2003 |
| JP | 2007-227440 A | 9/2007 |
| WO | 2008/099528 A1 | 8/2008 |

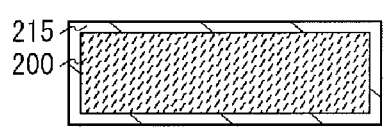
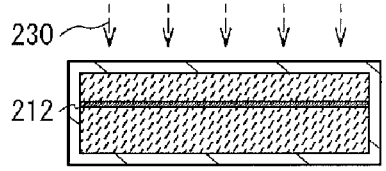
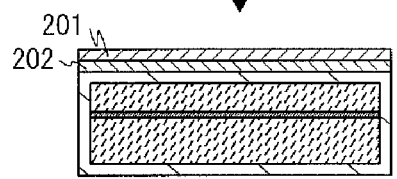
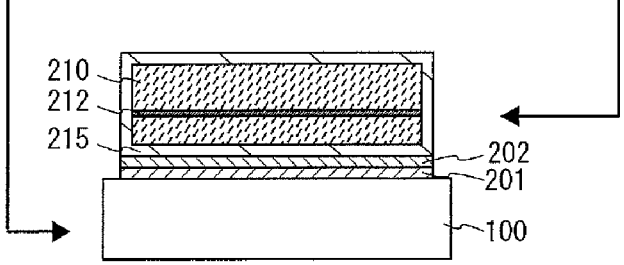
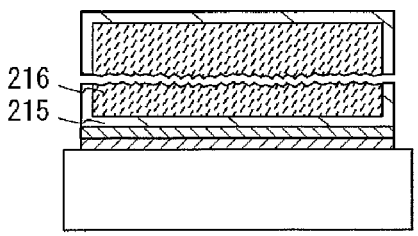

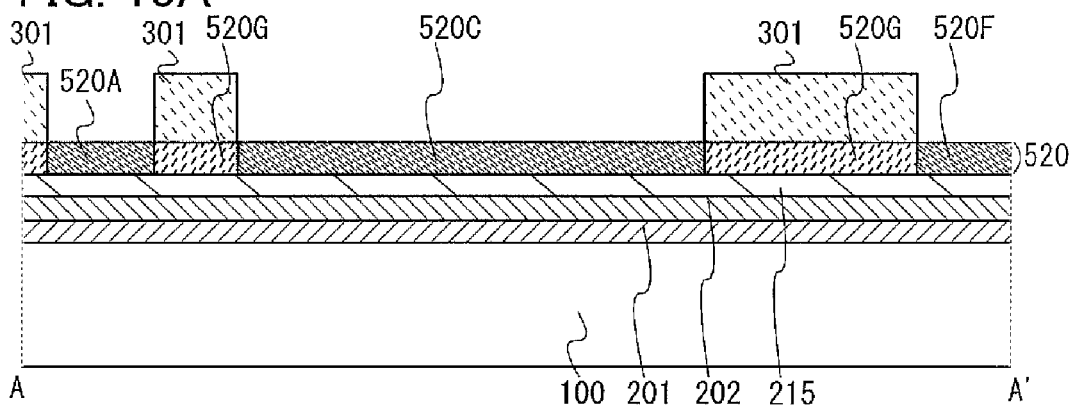
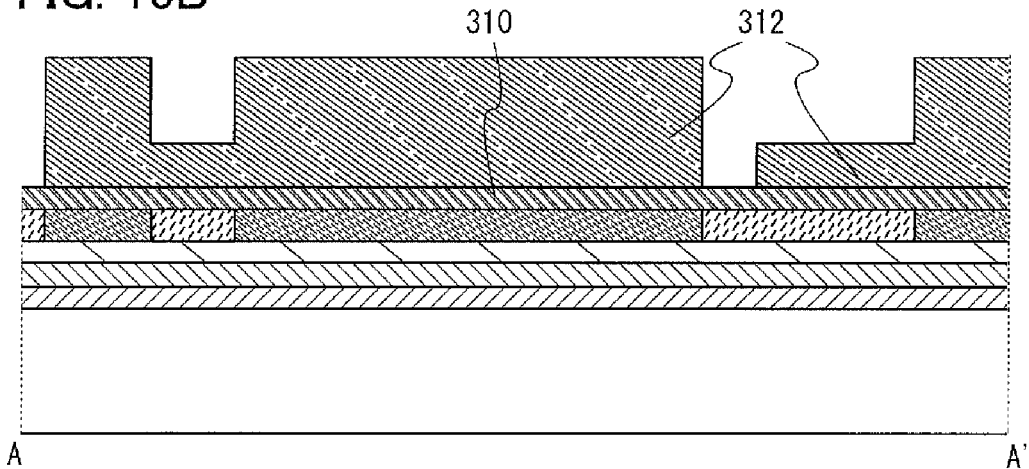
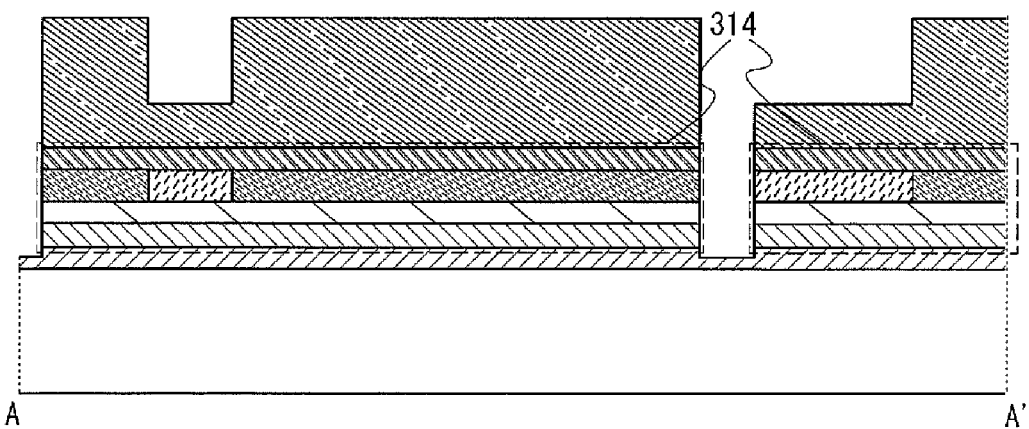

MANUFACTURING METHOD OF SEMICONDUCTOR DEVICE

BACKGROUND OF THE INVENTION

1. Field of the Invention

The present invention relates to a semiconductor device and a manufacturing method thereof. The semiconductor device in this specification means with which a thin film transistor is provided.

2. Description of the Related Art

In recent years, technological development of an SOI (silicon on insulator) substrate in which a single crystal semiconductor layer is formed over a substrate having an insulating surface has been promoted. Integrated circuits formed using an SOI substrate, which generally enable the parasitic capacitance of a transistor to be smaller than that in the case of using a silicon substrate, have been attracting attention in that they contribute to improvement of the operation speed and reduction of the power consumption. Therefore, applicability to high-performance semiconductor devices such as microprocessors and electronic devices such as ICs (integrated circuits) and electro-optical devices has been considered.

As an SOI substrate, for example, a semiconductor device in which a single crystal silicon layer is provided over an insulating substrate of heat-resistant glass or the like is known (see Patent Document 1). This semiconductor device has a structure in which a silicon layer obtained by a hydrogen ion implantation separation method is attached onto an insulating silicon film which covers the entire surface of a crystallized glass substrate having a distortion point of 750° C. or more.

It is demanded that electronic devices such as electro-optical devices have high reliability and that high productivity and less production cost are provided for a production method thereof. As a method for increasing productivity and reducing production cost, simplification of the manufacturing process is given.

In electronic devices such as electro-optical devices, thin film transistors are mainly used. In manufacturing thin film transistors, reduction in the number of photomasks used in photolithography is demanded for simplification of the manufacturing process. As the number of photomasks increases by one, the following steps are further needed: resist application, prebaking, light exposure, development, postbaking, and the like, and moreover other steps before and after the aforementioned steps, such as film deposition and etching and further resist removal, cleaning, drying, and the like. Thus the increase in the number of photomasks in the manufacturing process by one results in the significant increase in the number of steps. Therefore, many techniques for reducing the number of photomasks in a manufacturing process have been developed (for example, see Patent Document 2).

Many conventional techniques for reducing the number of photomasks use a complicated step such as backside light exposure, resist reflow, or a lift-off method, which requires a special apparatus. There has been a concern that yield is reduced due to various problems caused by such a complicated technique. Moreover, electrical characteristics of thin film transistors have been sacrificed in many cases.

As typical means for reducing the number of photomasks in a manufacturing process of a thin film transistor, a technique using a multi-tone mask (called a half-tone mask or a gray-tone mask) is widely known. A technique for reducing the number of manufacturing steps by using a multi-tone mask is given in, for example, Patent Document 3.

[Reference]
[Patent Document 1] Japanese Published Patent Application No. 2000-124092
[Patent Document 2] Japanese Published Patent Application No. 2003-179069
[Patent Document 3] Japanese Published Patent Application No. 2007-227440

SUMMARY OF THE INVENTION

An object of an embodiment of the present invention is, in a manufacturing method of a thin film transistor, to reduce the number of photomasks used in a photolithography method to less than the conventional number of photomasks.

According to one embodiment of the present invention, in a method for manufacturing a thin film transistor, the following is performed: a first insulating film, a first conductive film, and a thin-film stack in which a second insulating film, a single crystal semiconductor layer, and a second conductive film are stacked in this order are formed over a substrate having an insulating surface; a resist mask having a depression is formed over the second conductive film; a first etching is performed to expose the first conductive film and form a pattern of the thin-film stack; and a second etching is performed on the first conductive film to form a pattern of a gate electrode layer. In this embodiment, the second etching is performed under such conditions as to side-etch the first conductive film.

According to one embodiment of the present invention, the following is performed: a first insulating film is formed over a single crystal semiconductor substrate; the single crystal semiconductor substrate provided with the first insulating film is irradiated with accelerated ions, so that a fragile region is formed at a predetermined depth from the top surface of the single crystal semiconductor substrate; a first conductive film is formed over the first insulating film; a second insulating film is formed over the first conductive film; the second insulating film is attached to a base substrate and thermal treatment is performed thereon, thereby separating the single crystal semiconductor substrate in the fragile region to form a single crystal semiconductor layer over the base substrate; a first resist mask is formed at least over a region which forms a channel formation region of the single crystal semiconductor layer; an impurity element having one conductivity type is selectively added to a region of the single crystal semiconductor layer, which is not covered with the first resist mask; the first resist mask is removed and a second conductive film is formed over the single crystal semiconductor layer; a second resist mask having a depression is formed over the second conductive film; a first etching is performed on the first insulating film, the first conductive film, the second insulating film, the single crystal semiconductor layer, and the second conductive film by using the second resist mask to expose at least the first conductive film; a second etching with accompanying side-etching is performed on a part of the first conductive film to form a pattern of a gate electrode layer; the second resist mask is made to recede, so that a part of the second conductive film, which is just below the depression of the second resist mask is exposed and a third resist mask is formed; and a third etching is performed using the third resist mask on the part of the second conductive film to form a source and drain electrode layers.

According to one embodiment of the present invention, the following is performed: a first insulating film is formed over a single crystal semiconductor substrate; the single crystal semiconductor substrate provided with the first insulating film is irradiated with accelerated ions, so that a fragile region is formed at a predetermined depth from the top surface of the single crystal semiconductor substrate; a first conductive film is formed over the first insulating film; a second insulating film is formed over the first conductive film; the second insulating film is attached to a base substrate and thermal treatment is performed thereon, thereby separating the single crystal semiconductor substrate in the fragile region to form a single crystal semiconductor layer over the base substrate; a semiconductor film containing an impurity element having one conductivity type is formed over the single crystal semiconductor layer; a second conductive film is formed over the semiconductor film containing the impurity element; a first resist mask having a depression is formed over the second conductive film; a first etching is performed on the first insulating film, the first conductive film, the second insulating film, the single crystal semiconductor layer, the semiconductor film containing the impurity element, and the second conductive film by using the first resist mask to expose at least the first conductive film; a second etching with accompanying side-etching is performed on a part of the first conductive film to form a pattern of a gate electrode layer; the first resist mask is made to recede, so that a part of the second conductive film, which is just below the depression of the first resist mask is exposed and a second resist mask is formed; and a third etching is performed using the second resist mask, on the part of the second conductive film and a part of the semiconductor film containing the impurity element to form a source and drain electrode layers and a source and drain regions.

According to one embodiment of the present invention, the following is performed: a first insulating film is formed over a single crystal semiconductor substrate; the single crystal semiconductor substrate provided with the first insulating film is irradiated with accelerated ions, so that a fragile region is formed at a predetermined depth from the top surface of the single crystal semiconductor substrate; a first conductive film is formed over the first insulating film; a second insulating film is formed over the first conductive film; the second insulating film is attached to a base substrate and thermal treatment is performed thereon, thereby separating the single crystal semiconductor substrate in the fragile region to form a single crystal semiconductor layer over the base substrate; a first resist mask is formed at least over a region which forms a channel formation region of the single crystal semiconductor layer; an impurity element having one conductivity type is selectively added to a region of the single crystal semiconductor layer, which is not covered with the first resist mask; the first resist mask is removed and a second resist mask is formed at least over the region which forms a channel formation region of the single crystal semiconductor layer; an impurity element having the conductivity type which is opposite to the one conductivity type of the impurity element is selectively added to a region of the single crystal semiconductor layer, which is not covered with the second resist mask; the second resist mask is removed and a second conductive film is formed over the single crystal semiconductor layer; a third resist mask having a depression is formed over the second conductive film; a first etching is performed on the first insulating film, the first conductive film, the second insulating film, the single crystal semiconductor layer, and the second conductive film by using the third resist mask to expose at least the first conductive film; a second etching with accompanying side-etching is performed on a part of the first conductive film to form a pattern of a gate electrode layer; the third resist mask is made to recede to remove a depression of the second resist mask, so that a part of the second conductive film, which overlap the depression of the second resist mask is exposed and a fourth resist mask is formed; and a third etching is performed using the fourth resist mask, on the part of the second conductive film to form a source and drain electrode layers.

In the above-described embodiment, as the first etching, either dry etching or wet etching may be used. The first etching can be performed by one step when dry etching is employed as the first etching; or the first etching may be performed by a plurality of steps when wet etching is employed as the first etching. As the second etching, either dry etching or wet etching may be used. However, as described above, the first conductive film is side-etched by the second etching. Therefore, it is preferable to employ wet etching as the second etching. Control of the etching conditions of dry etching enables isotropic etching; therefore, side-etching can be performed even by dry etching.

In the above-described embodiment, since the second etching is performed under such conditions as to side-etch the first conductive film, the first conductive film recedes more inside than the side surface of the patterned thin-film stack. Accordingly, the side surface of the gate electrode layer which is formed using the first conductive film by the second etching is positioned more inside than the side surface of the patterned thin-film stack. Furthermore, the distance between the side surface of the patterned gate electrode layer and the side surface of the patterned thin-film stack is uniform or substantially uniform.

Note that the "pattern of the gate electrode layer" means, for example, a top view layout of a metal wiring which forms a gate electrode, a gate wiring, a capacitor electrode, and a capacitor wiring.

Here, the "side-etching" means etching in which a film is etched in not only a thickness direction of the film (a direction perpendicular to the substrate surface or a direction perpendicular to the surface of a base film of the film) but also in a direction perpendicular to the thickness direction (a direction parallel to the substrate surface or a direction parallel to the surface of the base film of the film).

In the above-described embodiment, it is preferable that the resist mask having a depression be formed using a multi-tone mask.

In the above-described embodiment, it is preferable that a pixel electrode be formed selectively so as to connect to the source and drain electrode layers of a thin film transistor.

It is also preferable that the etching is performed under such conditions as to cause unintentional etching as little as possible.

In this specification, a film "having heat resistance" means any film that maintains the form of a film at a temperature in a later step and can maintain required functions and characteristics of the film.

In this specification also, a "gate wiring" means a wiring which is electrically connected to a gate electrode of a thin film transistor. The gate wiring is formed using a gate electrode layer, and is sometimes referred to as a scan line.

Further, in this specification, a "source wiring" is a wiring which is electrically connected to a source electrode or a drain electrode of a thin film transistor. The source wiring is formed using a source electrode layer or a drain electrode layer, and is sometimes referred to as a signal line.

With the use of one embodiment of the present invention, the number of steps for manufacturing a thin film transistor can be significantly reduced. Further, the thin film transistor manufactured according to one embodiment of the present invention can be applied to a display device, which can reduce the number of steps for manufacturing a display device significantly as well. More specifically, with the use of one embodiment of the present invention, in which side-etching is used to form a gate electrode layer so that the formation of a mask for forming the gate electrode layer can be omitted, the number of photomasks used for etching can be reduced. It is also possible to perform etching in manufacturing a thin film transistor with the use of one photomask (multi-tone mask). Accordingly, the number of steps for manufacturing a thin film transistor or a display device can be significantly reduced and misalignment of a photomask for etching can be prevented.

With the use of one embodiment of the present invention, a thin film transistor has a cavity in contact with an end portion of a gate electrode layer, which leads to a reduction of leakage current between a gate electrode and a drain electrode.

According to one embodiment of the present invention, a semiconductor device with high integration, high operation speed, and low power consumption can be attained.

BRIEF DESCRIPTION OF THE DRAWINGS

FIGS. 1A to 1G illustrate an example of a method for manufacturing a thin film transistor.

FIGS. 15A to 15C illustrate an example of a method for manufacturing a thin film transistor and a display device.

DETAILED DESCRIPTION OF THE INVENTION

Figure 2A:
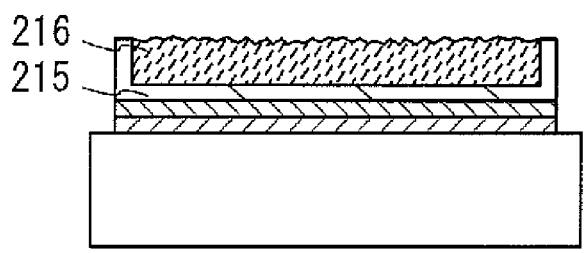
FIGS. 2A to 2C illustrate an example of a method for manufacturing a thin film transistor.

Hereinafter, embodiments of the present invention will be described in detail with reference to accompanying drawings. Note that the present invention is not limited to the description below, and it is easily understood by those skilled in the art that a variety of changes and modifications can be made without departing from the spirit and scope of the present invention. Therefore, the present invention is not to be construed as being limited to the description of the embodiments below. Note that reference numerals may be used in common to denote portions among different drawings in explaining the structure of the present invention with reference to drawings. The same hatching pattern is applied to similar or the same portions and denoted by no reference numeral in some cases.

Embodiment 1

In Embodiment 1, an example of the method for manufacturing a thin film transistor will be described using FIGS. 1A to 1G, FIGS. 2A to 2C, FIGS. 3A to 3F, FIGS. 4A and 4B, FIGS. 5A to 5D, and FIGS. 6A and 6B.

First, a base substrate 100 and a single crystal semiconductor substrate 200 are prepared (see FIGS. 1A and 1B).

As the base substrate 100, a substrate including an insulator can be used. Specifically, as examples thereof, a glass substrate, a quartz substrate, a ceramic substrate, and a sapphire substrate can be given. Note that by containing a larger amount of barium oxide (BaO) than boric acid, a glass substrate is heat-resistant and of more practical use. Therefore, it is preferable that a glass substrate containing more BaO than $B_2O_3$ be used. Alternatively, a single crystal semiconductor substrate (for example, a single crystal silicon substrate) may be used as the base substrate 100. In Embodiment 1, the case of using a glass substrate as the base substrate 100 is described. A glass substrate which can have a larger size and is inexpensive used as the base substrate 100 enables cost reduction.

The surface of the base substrate 100 is preferably cleaned in advance. Specifically, the base substrate 100 may be subjected to ultrasonic cleaning with a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. Through such cleaning treatment, the surface planarity of the base substrate 100 can be improved and abrasive particles left on the surface of the base substrate 100 can be removed. The surface of the base substrate 100 may be grinded before cleaning to improve the planarity.

As the single crystal semiconductor substrate 200, a single crystal semiconductor substrate formed using an element belonging to Group 14 of the periodic table, such as a single crystal silicon substrate, a single crystal germanium substrate, or a single crystal silicon germanium substrate, can be used. A compound semiconductor substrate of gallium arsenide, indium phosphide, or the like can alternatively be used. Commercial silicon substrates are typically circular with diameters of 5 inches (about 127 mm), 6 inches (about 150 mm), 8 inches (about 200 mm), 12 inches (about 300 mm), and 16 inches (about 400 mm). The shape of the single crystal semiconductor substrate 200 is not limited to a circular shape and, for example, a single crystal semiconductor substrate which is processed into a rectangular shape or the like can be used as well. The single crystal semiconductor substrate 200 can be manufactured by a CZ method or FZ (floating zone) method.

In view of removal of contaminants, it is preferable that the surface of the single crystal semiconductor substrate 200 be cleaned with a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like. Dilute hydrofluoric acid and ozone water may be discharged alternately for cleaning.

Next, a first insulating film 215 is provided on the surface of the single crystal semiconductor substrate 200 (see FIG. 1C).

The first insulating film 215 can be, for example, formed using a single layer or a stacked layer of a silicon oxide film, a silicon oxynitride film, and the like. As examples of the method for manufacturing the first insulating film 215, a thermal oxidation method, a CVD method, a sputtering method, and the like are given. In the case where an oxide film is formed using a CVD method, it is preferable to form a silicon oxide film using organosilane such as tetraethoxysilane (abbreviation: TEOS, chemical formula: $Si(OC_2H_5)_4$) in view of the productivity. Metal oxide such as aluminum oxide may be provided by a CVD method or a sputtering method. Provision of an insulating film including metal oxide can prevent contamination of a semiconductor film which is caused by diffusion of an impurity such as alkali metal from the base substrate. Although the first insulating film 215 is provided on the top surface, bottom surface, and side surface of the single crystal semiconductor substrate 200 in the drawings, the first insulating film 215 may be provided only on the top surface of the single crystal semiconductor substrate 200 as well.

In this embodiment, for example, thermal oxidation treatment is performed on the single crystal semiconductor substrate 200 to form the first insulating film 215 (a $SiO_x$ film in this embodiment). The thermal oxidation treatment is preferably performed in an oxidizing atmosphere to which a halogen is added.

For example, thermal oxidation treatment is performed on the single crystal semiconductor substrate 200 in an oxidizing atmosphere to which chlorine is added, so that an oxide film can be formed. In that case, the first insulating film 215 is a film containing chlorine atoms. The first insulating film 215 functions as a gate insulating film of a thin film transistor.

The thermal oxidation treatment in an oxidizing atmosphere to which chlorine is added as a halogen may be performed at a temperature in the range of 900° C. to 1150° C., so that a gettering effect using the halogen can be provided for the single crystal semiconductor substrate 200. The gettering effect can have an effect of removing a metal impurity. That is, by the action of the halogen, impurities such as metal turn into volatile chloride to be released into air and removed. Further, the first insulating film 215 provided can prevent an impurity such as sodium from moving from the base substrate after attachment to the base substrate and contaminating the single crystal semiconductor substrate 200.

The halogen atoms contained in the first insulating film 215 are not limited to chlorine atoms. A fluorine atom may be contained in the first insulating film 215. As a method for making the surface of the single crystal semiconductor substrate 200 contain fluorine atoms, there are the following: a method in which the single crystal semiconductor substrate 200 is soaked in an HF solution and then subjected to thermal oxidation treatment in an oxidizing atmosphere; a method in which thermal oxidation treatment is performed in an oxidizing atmosphere to which $NF_3$ is added; and the like.

Next, the single crystal semiconductor substrate 200 is irradiated with ions 230 accelerated by an electrical field, thereby forming a fragile region 212 where the crystal structure is damaged, at a predetermined depth in the single crystal semiconductor substrate 200 (see FIG. 1D). The depth at which the fragile region 212 is formed can be controlled by the kinetic energy, mass, charge, incidence angle of the ions 230, and the like. The fragile region 212 is formed at about the same depth as the average penetration depth of the ions 230. Therefore, the thickness of a single crystal semiconductor layer that is to be separated from the single crystal semiconductor substrate 200 can be controlled by controlling the average penetration depth of the ions 230. For example, the average penetration depth may be controlled such that the thickness of the single crystal semiconductor layer is greater than or equal to 200 nm and less than or equal to 500 nm, preferably about greater than or equal to 50 nm and less than or equal to 200 nm.

The above-described ion irradiation treatment can be performed with an ion-doping apparatus or an ion-implantation apparatus. A typical example of the ion-doping apparatus is a non-mass-separation type apparatus in which plasma excitation of a process gas is performed and an object that is to be processed is irradiated with all kinds of ion species generated. In this apparatus, the object that is to be processed is irradiated with ion species of plasma without mass separation. In contrast, an ion-implantation apparatus is a mass-separation type apparatus. In the ion-implantation apparatus, mass separation of ion species of plasma is performed and an object that is to be processed is irradiated with ion species each having a predetermined mass.

In Embodiment 1, an example is described in which an ion-doping apparatus is used to add hydrogen to the single crystal semiconductor substrate 200. A gas containing hydrogen is used as a source gas. As for the ions used for the irradiation, it is preferable that the proportion of $H_3^+$ be high. Specifically, it is preferable that the proportion of $H_3^+$ be set to 50% or higher (more preferably, 80% or higher) with respect to the total amount of $H^+$, $H_2^+$, and $H_3^+$. Higher proportion of $H_3^+$ enables the efficiency of ion irradiation to improve.

Next, a first conductive film 202 is formed over the surface of the first insulating film 215. The first conductive film 202 is formed using a conductive material. The first conductive film 202 can be formed using, for example, a conductive material such as a metal material, e.g., titanium, molybdenum, chromium, tantalum, tungsten, aluminum, copper, neodymium, or niobium, or an alloy material including any of these metal materials as a main component. Note that as the first conductive film 202, a material which has such heat resistance as to withstand thermal treatment performed in a later step and is prevented from being unintentionally etched or corroded as much as possible in a later step is selected. The material of the first conductive film 202 is not limited to a particular material as long as these conditions are satisfied.

The first conductive film 202 can be formed by, for example, a sputtering method, a CVD method (including a thermal CVD method and a plasma CVD method), or the like. The formation method of the first conductive film 202 is not limited to a particular method. In this embodiment, a molybdenum film is formed by a sputtering method.

Next, a second insulating film 201 is formed over the first conductive film 202. The second insulating film 201 can be formed, for example, using a single layer or a stacked layer selected from a silicon oxide film, a silicon nitride film, silicon oxynitride film, and the like. As a method for forming the second insulating film 201, a CVD method, a sputtering method, or the like can be used. In the case where the second insulating film 201 is formed using a CVD method, it is preferable to form a silicon oxide film using organosilane such as tetraethoxysilane (abbreviation: TEOS, chemical formula: $Si(OC_2H_5)_4$) in view of the productivity. The second insulating film 201 functions as a base film in a final structure, and is formed, for example, using a silicon oxynitride film by a CVD method in this embodiment.

Further, a third insulating film may be provided over the base substrate, though not shown in the drawing. In that case, it is preferable that a silicon oxide film using organosilane such as tetraethoxysilane (abbreviation: TEOS, chemical formula: $Si(OC_2H_5)_4$) be used as the second insulating film 201 and a silicon oxynitride film be used as the third insulating film. The materials for the combination of the second insulating film 201 and the third insulating film are not limited to them. Further, in that structure, the third insulating film functions as a bonding layer in an attachment step, and functions as a base film in a final structure.

Alternatively, the first insulating film 215 may be provided for the single crystal semiconductor substrate 200, and the first conductive film 202 may be provided over the base substrate 100 and the second insulating film 201 may be provided over the first conductive film 202. In that case, the first insulating film 215, the first conductive film 202, and the second insulating film 201 can be formed using their respective materials described above. It is preferable that a $SiO_x$ film, a molybdenum film, a silicon oxynitride film be used as the first insulating film 215, the first conductive film 202, and the second insulating film 201 respectively; however, the combination thereof is not limited to this and can be selected as appropriate. In that structure, the first insulating film 215 and the second insulating film 201 function as bonding layers in an attachment step, and function as gate insulating films of a thin film transistor in a final structure.

Note that in this specification, silicon oxynitride means a substance in which the oxygen content is higher than the nitrogen content, e.g., a substance containing oxygen, nitrogen, silicon, and hydrogen at concentrations ranging from 50 atomic % to 70 atomic %, 0.5 atomic % to 15 atomic %, 25 to 35 atomic %, and 0.1 atomic % to 10 atomic %, respectively. Silicon nitride oxide means a substance in which the nitrogen content is higher than the oxygen content, e.g., a substance containing oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. The above ranges are ranges in the measurement using Rutherford backscattering spectrometry (RBS), hydrogen forward scattering spectrometry (HFS), or the like. Further, the total for the content ratio of the constituent elements is maximum at 100 atomic %.

Next, the surface of the base substrate 100 and the surface of the single crystal semiconductor substrate 200 are disposed to face each other, and the surface of the base substrate 100 and the surface of the second insulating film 201 are bonded to each other (see FIG. 1F).

In this embodiment, the base substrate 100 and the single crystal semiconductor substrate 200 are in close contact with each other with the first insulating film 215, the first conductive film 202, and the second insulating film 201 interposed therebetween, and a pressure greater than or equal to 0.1 $N/cm^2$ and less than or equal to 50 $N/cm^2$, preferably a pressure about greater than or equal to 0.1 $N/cm^2$ and less than or equal to 20 $N/cm^2$ is applied to one portion of the single crystal semiconductor substrate 200. Accordingly, bonding between the base substrate 100 and the second insulating film 201 starts from the portion at which the pressure is applied, which forms a bonding spontaneously over the entire surface. This bonding step is performed under the action of the Van der Waals force, hydrogen bonding, or the like and can be performed at room temperature.

It is preferable that the surface of the base substrate 100 and the surface of the single crystal semiconductor substrate 200 be smooth. Specifically, it is preferable that each of the surface of the base substrate 100 and the surface of the single crystal semiconductor substrate 200 have a mean surface roughness (Ra) of 0.5 nm or less and a root-mean-square roughness (Rms) of 0.6 nm or less, more preferably Ra of 0.3 nm or less and Rms of 0.4 nm or less. In the case where a glass substrate is used as the base substrate 100, polishing treatment may be performed on the surface of the glass substrate in advance.

Note that before the base substrate 100 and the single crystal semiconductor substrate 200 are bonded to each other, the second insulating film 201 formed over the single crystal semiconductor substrate 200 and the base substrate 100 are preferably subjected to surface treatment. As the surface treatment, plasma treatment, ozone treatment, megasonic cleaning, two-fluid cleaning (a method for spraying functional water such as pure water or hydrogen-containing water with a carrier gas such as nitrogen), or a combination thereof can be performed. Ultrasonic cleaning with a hydrochloric acid/hydrogen peroxide mixture (HPM), a sulfuric acid/hydrogen peroxide mixture (SPM), an ammonium hydroxide/hydrogen peroxide mixture (APM), or the like may also be performed. In particular, plasma treatment may be performed on at least one of the surface of the base substrate 100 and the surface of the second insulating film 201 and then ozone treatment, megasonic cleaning, two-fluid cleaning, or the like is performed, thereby removing dust such as an organic substance on the surface of the second insulating film 201 and/or the surface of the base substrate 100 and making the surface of the second insulating film 201 and/or the surface of the base substrate 100 hydrophilic. As a result, bonding strength between the second insulating film 201 and the base substrate 100 can be increased.

Further, after the base substrate 100 and the second insulating film 201 are bonded to each other, it is preferable to perform thermal treatment to increase the bonding strength. The temperature of this thermal treatment is set to a temperature at which separation is not caused in the fragile region 212 (for example, a temperature greater than or equal to room temperature and less than 400° C.). The base substrate 100 and the second insulating film 201 may be bonded to each other while being heated at a temperature in this temperature range. The thermal treatment can be performed using a heating furnace such as a diffusion furnace and a resistance heating furnace, a rapid thermal annealing (RTA) apparatus, a microwave heating apparatus, or the like.

Next, the single crystal semiconductor substrate 200 is separated in the fragile region 212 by thermal treatment, so that a single crystal semiconductor layer 216 is provided over the base substrate 100 with the second insulating film 201, the first conductive film 202, and the first insulating film 215 interposed therebetween (see FIGS. 1G and 2A).

By the thermal treatment, the element added is separated out into microvoids which are formed in the fragile region 212 and the internal pressure is increased. The increased pressure causes a crack in the fragile region 212, so that the single crystal semiconductor substrate 210 is separated in the fragile region 212. Because the second insulating film 201 is bonded to the base substrate 100, the single crystal semiconductor layer 216 separated from the single crystal semiconductor substrate 200 is left over the base substrate 100.

Then, if necessary, a step for planarizing the surface of the single crystal semiconductor layer 216 may be performed. The planarization of the single crystal semiconductor layer 216 may be performed by any method for planarizing the entire surface of the single crystal semiconductor layer uniformly. As this step, a reverse sputtering method and a method in which irradiation with laser light is performed to improve the planarity of the surface can be given as examples thereof. Note that the present invention is not limited to this, and there is no particular limitation on the treatment as long as the planarity can be improved.

The reverse sputtering method is performed, for example, in a plasma sate generated by introducing an inert gas, an Ar gas, or the like into a high-vacuum chamber and applying an electric field to a surface that is to be processed. In plasma, electrons and positive ions of Ar exist and the positive ions of Ar are accelerated in a cathode direction. The surface that is to be processed is sputtered with the accelerated positive ions of Ar. At this time, a projection of the surface that is to be processed is sputtered preferentially, thereby forming a planarized single crystal semiconductor layer 220 (see FIG. 2C).

Figure 2B:
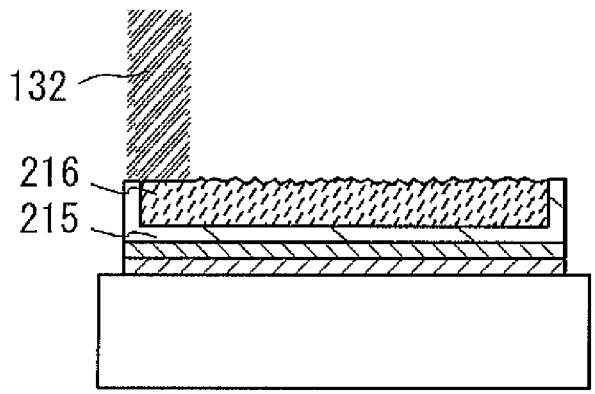
Figure 2C:
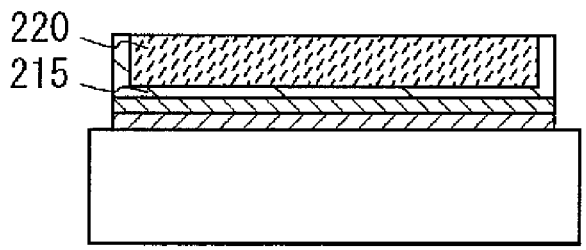

In the case where the surface planarity is improved by irradiation with laser light, the surface of the single crystal semiconductor layer 216 is irradiated with a laser light 132, so that the single crystal semiconductor layer 220 in which the surface planarity is improved and defects are reduced is formed (see FIGS. 2B and 2C).

Note that it is preferable that the single crystal semiconductor layer 216 be partly melted by the irradiation with the laser light 132. This is because, complete melting causes disordered nucleation after the single crystal semiconductor layer 216 becomes the state in a liquid phase, so that the crystallinity thereof decreases. On the other hand, partial melting allows crystal growth to be performed on the basis of a non-melted solid-phase portion; thus, the crystallinity can be improved as compared to the case where the single crystal semiconductor layer 216 is completely melted. In addition, incorporation of oxygen, nitrogen, or the like from the first insulating film 215 can be suppressed. Note that "partial melting" mentioned above means melting by laser light irradiation to a depth smaller than the depth of an interface on the first insulating film 215 side (i.e., smaller than the thickness of the single crystal semiconductor layer 216). That is, it refers to a state in which the upper portion of the single crystal semiconductor layer 216 is melted into a liquid phase whereas the lower portion thereof is not melted and remains in the solid phase. Further, complete melting means melting such that the single crystal semiconductor layer 216 is melted to be in the liquid state, to the depth of the interface between the single crystal semiconductor layer 216 and the first insulating film 215.

It is preferable to use a pulsed laser for the above laser-light irradiation. This is because a pulsed laser light having high energy can be emitted instantaneously and facilitates formation of a partial melting state. The repetition rate is preferably, but not limited to, about greater than or equal to 1 Hz and less than or equal to 10 MHz. As examples of the pulsed laser, the following can be given: an Ar laser, a Kr laser, an excimer (ArF, KrF, or XeCl) laser, a $CO_2$ laser, a YAG laser, a YVO4 laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like. A continuous-wave laser may alternatively be used as long as it enables partial melting. As examples of the continuous-wave laser, the following can be given: an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like.

The wavelength of the laser light 132 needs to be selected so that the laser light 132 is absorbed by the single crystal semiconductor layer 216. The wavelength thereof may be determined in consideration of the skin depth of the laser light and the like. For example, the wavelength can be in the range of 250 nm to 700 nm, inclusive in the case of silicon. In addition, the energy density of the laser light 132 can be determined in consideration of the wavelength of the laser light 132, the skin depth of the laser light 132, the thickness of the single crystal semiconductor layer 216, or the like. The energy density of the laser light 132 may be set, for example, in the range of 300 $mJ/cm^2$ to 800 $mJ/cm^2$, inclusive. Note that the above-described energy density range is an example in the case where a XeCl excimer laser (wavelength: 308 mm) is used as a pulsed laser.

The irradiation with the laser light 132 can be performed in an atmosphere containing oxygen or an inert atmosphere. An air atmosphere is given as an example of the atmosphere containing oxygen, and a nitrogen atmosphere and a rare-gas atmosphere are given as examples of the inert atmosphere. In order to perform irradiation with the laser light 132 in an inert atmosphere, the irradiation with the laser light 132 may be performed in an airtight chamber while the atmosphere in the chamber may be controlled. In the case where a chamber is not used, an inert atmosphere can be obtained by blowing an inert gas such as a nitrogen gas to the surface which is irradiated with the laser light 132.

Note that the irradiation with the laser light 132 in an inert atmosphere such as a nitrogen atmosphere is more effective in improving the planarity of the single crystal semiconductor layer 216 than the irradiation with the laser light 132 in an air atmosphere. In addition, an inert atmosphere is more effective in suppressing generation of cracks and ridges than an air atmosphere, and the available energy density range for the laser light 132 is widened. Note that the irradiation with the laser light 132 may be performed in a reduced-pressure atmosphere. When the irradiation with the laser light 132 is performed in a reduced-pressure atmosphere, the same or substantially the same effect as the effect of the irradiation in an inert atmosphere can be obtained. The irradiation with the laser light 132 may be performed in a reduced-pressure, inert atmosphere. As the reduced pressure, it is preferable that the pressure in the chamber be less than or equal to $10^{-3}$ Pa.

Although described in Embodiment 1 is the case where the irradiation treatment with the laser light 132 is performed after the thermal treatment for separation of the single crystal semiconductor layer 216, etching treatment may be performed after the thermal treatment for separation of the single crystal semiconductor layer 216, so that the irradiation treatment with the laser light 132 can be performed after a region with many defects on the surface of the single crystal semiconductor layer 216 is removed and/or the surface planarity of the single crystal semiconductor layer 216 is improved. The present invention is not limited to the above-described process, and laser-light irradiation treatment is not necessarily performed. Note that the etching treatment may be either wet etching or dry etching.

Further, although not described in Embodiment 1, a step of thinning the single crystal semiconductor layer 220 may be performed after the irradiation with the laser light 132. In order to thin the single crystal semiconductor layer 220, one or a combination of dry etching and wet etching may be employed.

In order to control the threshold value, channel doping may be performed by adding an impurity element which imparts n-type or p-type conductivity to the single crystal semiconductor layer 220. The channel doping may be performed so as to add either to a portion which forms a channel formation region of the single crystal semiconductor layer 220 by a later step selectively or to the single crystal semiconductor layer 220 entirely.

Figure 3A:
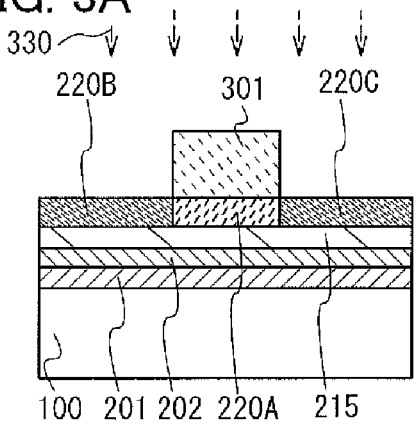
FIGS. 3A to 3F illustrate an example of a method for manufacturing a thin film transistor.

Next, a first resist mask 301 is selectively provided over the single crystal semiconductor layer 220, and an impurity element 330 is added to the single crystal semiconductor layer 220 with the first resist mask 301 as a mask, so that a channel formation region 220A and impurity regions 220B and 220C are formed in the single crystal semiconductor layer 220 (see FIG. 3A). The channel formation region 220A is formed in a region of the channel formation region 220A, which overlaps the first resist mask 301, and the impurity regions 220B and 220C which function as a source and drain regions are formed in contact with the channel formation region 220A.

As the impurity element 330, an impurity element which imparts n-type conductivity or an impurity element which imparts p-type conductivity can be used. As the impurity element which imparts n-type conductivity, phosphorus (P), arsenic (As), or the like can be used. As the impurity element which imparts p-type conductivity, boron (B), aluminum (Al), gallium (Ga), or the like can be used. In this embodiment, as the impurity element 330, phosphorus (P) is added to the single crystal semiconductor layer 220 so as to be contained at a concentration of $1\times10^{15}/cm^3$ to $1\times10^{19}/cm^3$, whereby the impurity regions 220B and 220C having n-type conductivity are formed.

Figure 5A:
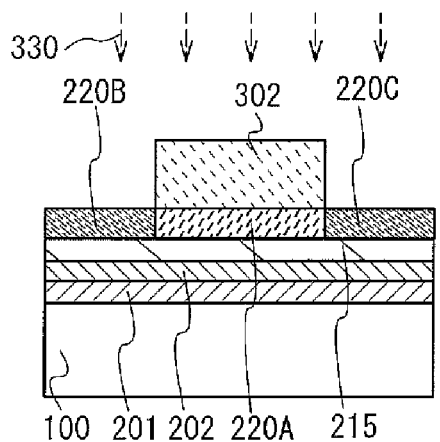
FIGS. 5A to 5D illustrate an example of a method for manufacturing a thin film transistor.
Figure 5C:
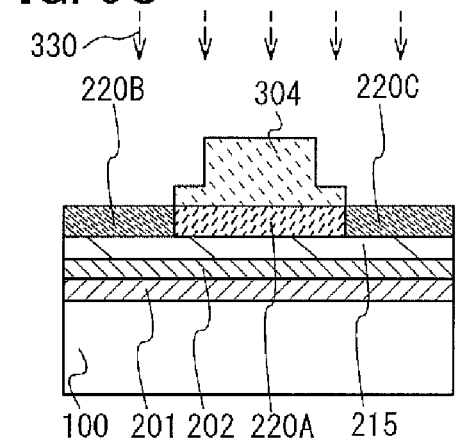
Figure 5B:
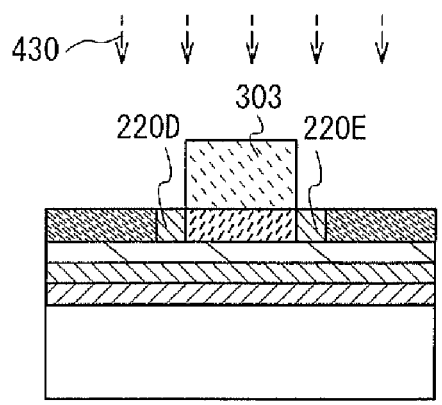
Figure 5D:
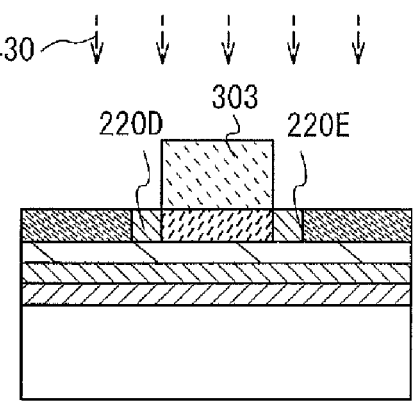

It is preferable that an LDD region 220D and an LDD region 220E be formed between the channel formation region 220A and the impurity region 220B and between the channel formation region 220A and the impurity region 220C respectively as shown in FIGS. 5B and 5D. The LDD regions 220D and 220E are formed so as to contain the impurity element having the same conductivity type as the conductivity type of that of the impurity regions 220B and 220C, at lower concentrations than the concentrations of those of the impurity regions 220B and 220C.

A first method for manufacturing the LDD regions 220D and 220E is as follows: a first resist mask 302 is selectively formed over the single crystal semiconductor layer 220 and an impurity element is added to the single crystal semiconductor layer 220, so that the impurity regions 220B and 220C are formed; and then, the first resist mask 302 is removed, a resist mask 303 for LDD formation is formed over the single crystal semiconductor layer 220, and an impurity element is added to the single crystal semiconductor layer 220, so that the LDD regions 220D and 220E are formed. The step for forming the impurity regions 220B and 220C and the step for forming the LDD regions 220D and 220E may be performed in the reverse order to the above-described order.

A second method for manufacturing the LDD regions 220D and 220E is as follows: the first resist mask 302 is selectively formed over the single crystal semiconductor layer 220 and the impurity element 330 is added to the single crystal semiconductor layer 220, so that the impurity regions 220B and 220C are formed (see FIG. 5A); the first resist mask 302 is made to recede, so that a part of the channel formation region 220A is exposed and the resist mask 303 for LDD formation is formed; and an impurity element 430 is added using this resist mask 303 for LDD formation to the single crystal semiconductor layer 220, so that the LDD regions 220D and 220E are formed (see FIG. 5B). As the method for forming the resist mask 303 for LDD formation by making the first resist mask 302 recede, for example, ashing using oxygen plasma can be used. The method for forming the resist mask 303 for LDD formation by making the first resist mask 302 recede is not limited thereto.

A third method for manufacturing the LDD regions 220D and 220E is as follows: a first resist mask 304 selectively having a projection (having different thicknesses) is formed over the single crystal semiconductor layer 220 and the impurity element 330 is added to the single crystal semiconductor layer 220, so that the impurity regions 220B and 220C are formed (see FIG. 5C); the first resist mask 304 is made to recede, so that a part of the channel formation region 220A is exposed and the resist mask 303 for LDD formation is formed; and the impurity element 430 is added using this resist mask 303 for LDD formation to the single crystal semiconductor layer 220, so that the LDD regions 220D and 220E are formed (see FIG. 5D). Note that the first resist mask 304 is not formed over regions which form the impurity regions 220B and 220C, and the projection is formed above a region which forms the channel formation region 220A so that depressions are formed over regions which form the LDD regions 220D and 220E. The first resist mask 304 can be formed using a common multi-tone mask. As the method for forming the resist mask 303 for LDD formation by making the first resist mask 304 recede, for example, ashing using oxygen plasma can be used. The method for forming the resist mask 303 for LDD formation by making the first resist mask 304 recede is not limited thereto. In addition, any other method may be employed as long as the LDD regions 220D and 220E and the impurity regions 220B and 220C can be formed.

Each of the second and third methods, in which the resist mask 303 for LDD formation having a predetermined shape is formed not by forming a resist mask but by making the first resist mask 302 or 304 recede, is preferable in that the LDD regions 220D and 220E can be formed without increasing the number of resist masks. In addition, misalignment of a mask can be prevented because a resist mask is not formed in addition to the first resist mask 302 or 304.

Figure 3B:
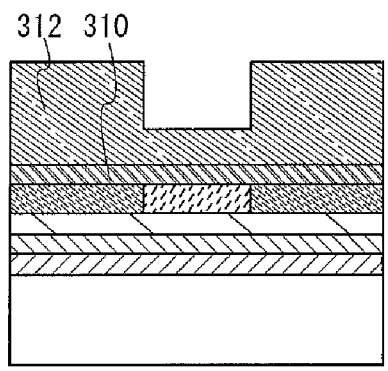
Figure 3C:
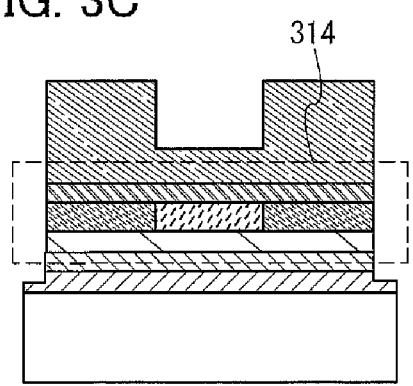
Figure 3D:
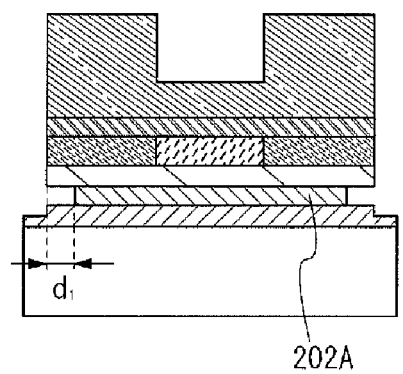

Next, the first resist mask 301 is removed, a second conductive film 310 is formed, and a second resist mask 312 is formed over the second conductive film 310 (see FIG. 3B). The second conductive film 310 is formed using a material which is a conductive material (such as a material mentioned as the material of the first conductive film 202) but is different from the material used for the first conductive film 202. Here, the "different" material means a material having a different main component. Specifically, a material which is etched as little as possible by the second etching which is described later may be selected. In addition, it is necessary that, like the first conductive film 202, the second conductive film 310 have a certain degree of heat resistance and be formed using a material which is resistant to unintentional etching or corrosion in the following process. The material of the second conductive film 310 is not limited to a particular material as long as these conditions are satisfied. For example, a material containing tungsten, titanium, and/or chromium as a main component may be used.

The second conductive film 310 can be formed, for example, by a sputtering method or a CVD method (including a thermal CVD method and a plasma CVD method). The method thereof is not limited to a particular method.

The second resist mask 312 is a resist mask having a depression, i.e., a resist mask which consists of a plurality of regions (two regions in this embodiment) which are different in thickness. In the second resist mask 312, a thick region is referred to as a projection of the second resist mask 312 whereas a thin region is referred to as the depression of the second resist mask 312, here.

In the second resist mask 312, the projection is formed in each of regions which form a source and drain electrode layers 320A and 320B, and the depression is formed in a region where the source and drain electrode layers 320A and 320B are not formed and a part of the semiconductor layer is exposed.

The second resist mask 312 can be formed using a common multi-tone mask. Here, a multi-tone mask is described below with reference to FIGS. 6A and 6B.

A multi-tone mask is a mask capable of light exposure with multi-level light intensities, and typically, light exposure is performed with three levels of light intensity to provide an exposed region, a half-exposed region, and an unexposed region. The multi-tone mask allows a resist mask with a plurality of thicknesses (typically, two different thicknesses) to be formed by a one-time process of light exposure and development. Therefore, using a multi-tone mask can lead to a reduction of the number of photomasks.

Figures 1, 6A:
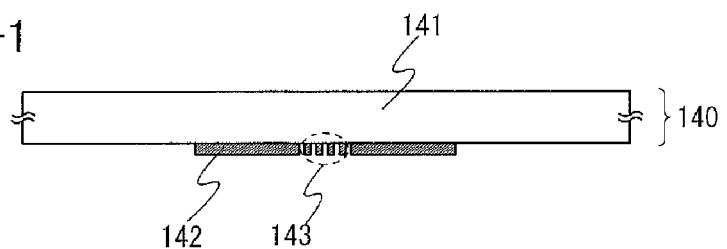
FIGS. 6A and 6B each illustrate one mode of a multi-tone mask.
Figures 2, 6A:
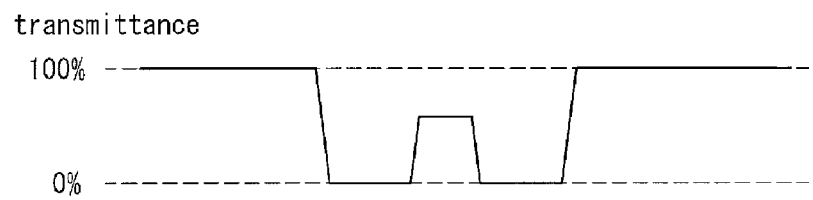
Figures 1, 6B:
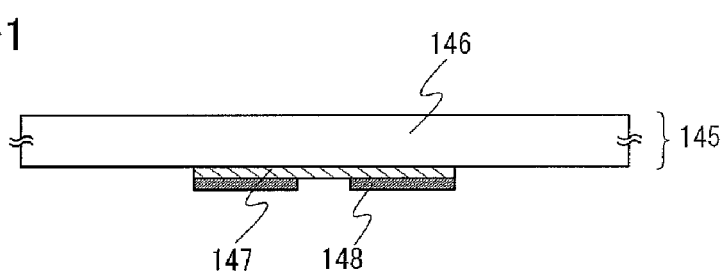
Figures 2, 6B:
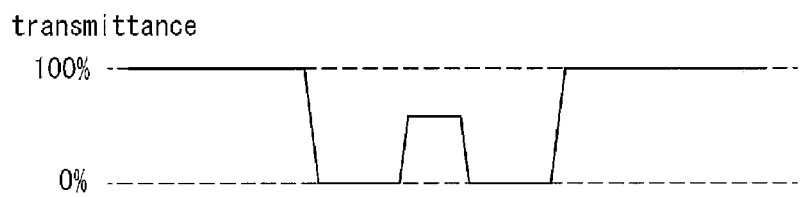

FIG. 6A-1 and FIG. 6B-1 are cross-sectional views of typical multi-tone masks. A gray-tone mask 140 is illustrated in FIG. 6A-1 and a half-tone mask 145 is illustrated in FIG. 6B-1.

The gray-tone mask 140 illustrated in FIG. 6A-1 includes a light-blocking portion 142 formed using a light-blocking film on a substrate 141 having a light-transmitting property, and a diffraction grating portion 143 provided with a pattern of the light-blocking film.

The transmittance of light is controlled at the diffraction grating portion 143 in such a manner that slits, dots, mesh, or the like are provided at an interval equal to or less than the resolution limit of light used for light exposure. Note that the slits, dots, mesh, or the like provided at the diffraction grating portion 143 may be provided periodically or nonperiodically.

As the substrate 141 having a light-transmitting property, quartz or the like can be used. The light-blocking film for forming the light-blocking portion 142 and the diffraction grating portion 143 may be formed using a metal film and is preferably provided using chromium, chromium oxide, or the like.

In the case where the gray-tone mask 140 is irradiated with light for light exposure, as shown in FIG. 6A-2, the transmittance in the region overlapping the light-blocking portion 142 is 0%, and the transmittance in the region where neither the light-blocking portion 142 nor the diffraction grating portion 143 is provided is 100%. Further, the transmittance at the diffraction grating portion 143 is in the range of about 10% to 70%, which can be adjusted by the interval of slits, dots, mesh, or the like of the diffraction grating, or the like.

The half-tone mask 145 illustrated in FIG. 6B-1 includes a semi-light-transmitting portion 147 formed using a semi-light-transmitting film on a substrate 146 having a light-transmitting property, and a light-blocking portion 148 formed using a light-blocking film.

The semi-light-transmitting portion 147 can be formed using a film of MoSiN, MoSi, MoSiO, MoSiON, CrSi, or the like. The light-blocking portion 148 may be formed using a metal film which is the same as or similar to the light-blocking film of the gray-tone mask and is preferably provided using chromium, chromium oxide, or the like.

In the case where the half-tone mask 145 is irradiated with light for light exposure, as illustrated in FIG. 6B-2, the transmittance in the region overlapping the light-blocking portion 148 is 0%, and the transmittance in the region where neither the light-blocking portion 148 nor the semi-light-transmitting portion 147 is provided is 100%. Further, the transmittance in the semi-light-transmitting portion 147 is in the range of about 10% to 70%, which can be adjusted by the kind, the film thickness, or the like of a mask material thereof.

Light exposure using the multi-tone mask and development enables the formation of the second resist mask 312 having regions of different thicknesses.

Note that the second resist mask 312 may be formed without using a multi-tone mask. Further, the second resist mask 312 may be a resist mask having neither a depression nor a projection unlike the mask described above.

Next, a first etching is performed using the second resist mask 312. Specifically, the first insulating film 215, the first conductive film 202, the second conductive film 310, and the single crystal semiconductor layer 220 (in which the channel formation region 220A and the impurity regions 220B and 220C are formed) are etched to form a thin-film stack 314 (see FIG. 3C). At this time, it is preferable that at least a surface of the first conductive film 102 be exposed. In this step, an upper portion of the second insulating film 201 is also etched away. Owing to the existence of this second insulating film 201, unintentional etching of the substrate 100 due to the first etching can be prevented. Accordingly, impurity metal elements contained in the substrate 100 can be prevented from being attached to and/or entering the semiconductor layer. In Embodiment 1, this etching step is called the "first etching." As the first etching, either dry etching or wet etching may be employed. The first etching can be performed by one step when dry etching is employed as the first etching, whereas the first etching may be performed by a plurality of steps when wet etching is employed as the first etching; this is because the etching rate varies depending on the material of the etched film and it is difficult to perform the etching by one step.

The first etching may be performed by, for example, dry etching in three stages. First, etching may be performed using a mixed gas of a $Cl_2$ gas, a $CF_4$ gas, and an $O_2$ gas; then, etching may be performed using a $Cl_2$ gas; and then, etching may be performed using a $CHF_3$ gas.

Next, a second etching is performed using the second resist mask 312. In other words, the first conductive film 202 is etched to form a gate electrode layer 202A (see FIG. 3D). In Embodiment 1, this etching step is called the "second etching."

The second etching is performed under such etching conditions that a side surface of the gate electrode layer 202A formed using the first conductive film 202 is provided more inside than a side surface of the thin-film stack 314. Further, it is performed such that the etching rate with respect to the second conductive film 310 is small and the etching rate with respect to the first conductive film 202 is large; in other words, the etching is performed under such conditions that the selectivity ratio of the second conductive film 310 with respect to the first conductive film 202 is high. By performing the second etching under such conditions, the gate electrode layer 202A can be formed.

There is no particular limitations on the shape of the side surface of the gate electrode layer 202A. For example, the shape may be a tapered shape. The shape of the side surface of the gate electrode layer 202A is determined depending on the conditions such as a chemical used in the second etching.

It is necessary that the second etching is performed under the condition involving side-etching as described above, so that the gate electrode layer 202A can be formed by the second etching accompanied with side-etching of the first conductive film 202.

Here, the "side-etching" means etching in which a film is etched in not only a thickness direction of the film (a direction perpendicular to the substrate surface or a direction perpendicular to the surface of a base film of the film) but also in a direction perpendicular to the thickness direction (a direction parallel to the substrate surface or a direction parallel to the surface of the base film of the film). An end portion of the film subjected to side-etching can have various shapes depending on the etching rate of an etching gas or a chemical used for the etching with respect to the film. The end portion of the film is, in many cases, formed to have a curved surface.

As described above, it is preferable that the second etching be performed by wet etching.

In the case where the second etching is performed by wet etching, the first conductive film 202 may be formed using aluminum or molybdenum, the second conductive film 310 may be formed using titanium or tungsten, and a chemical containing nitric acid, acetic acid, and phosphoric acid may be used for the etching. Alternatively, the first conductive film 202 may be formed using molybdenum, the second conductive film 310 may be formed using titanium, aluminum, or tungsten, and a chemical containing hydrogen peroxide water may be used for the etching.

In the case where the second etching is performed by wet etching, it is preferable that a stacked film in which molybdenum is deposited over aluminum to which neodymium is added be formed as the first conductive film 202, tungsten be deposited as the second conductive film 310, and a chemical containing nitric acid at 2%, acetic acid at 10%, and phosphoric acid at 72% be used for the etching. By using the chemical having such a composition ratio, the first conductive film 202 can be etched without etching the second conductive film 310. Neodymium is added to the first conductive film 202 for the purpose of suppressing a large increase of the resistance of aluminum, improving the heat resistance, and preventing generation of hillocks.

Figure 3E:
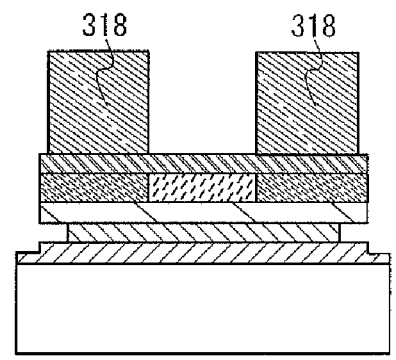

Next, the second resist mask 312 is made to recede, so that a part of the second conductive film 310 is exposed and a third resist mask 318 is formed (see FIG. 3E). As a method for forming the third resist mask 318 by making the second resist mask 312 recede, ashing using oxygen plasma can be given as an example thereof. However, the method for forming the third resist mask 318 by making the second resist mask 312 recede is not limited to this method. Note that the case where the third resist mask 318 is formed after the second etching is described here; however, the present invention is not limited to this and the second etching may be performed after formation of the third resist mask 318.

Figure 3F:
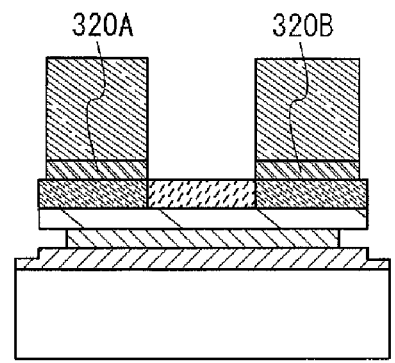

Next, the second conductive film 310 in the thin-film stack 314 is etched using the third resist mask 318, so that a source and drain electrode layers 320A and 320B are formed (see FIG. 3F). As the etching conditions thereof, the conditions under which the films other than the second conductive film 310 are prevented from being unintentionally etched or corroded as much as possible are selected. In particular, it is important that the etching is performed under the conditions that the gate electrode layer 202A is prevented from being unintentionally etched or corroded as mush as possible. The drawing is shown schematically and the second conductive film 310 is etched whereas little unintentional etching and/or corrosion of the films other than the second conductive film 310 occur. Therefore, unintentional etching and/or corrosion of the films other than the second conductive film 310 is not illustrated in the drawing.

For the etching of the second conductive film 310 in the thin-film stack 314, either wet etching or dry etching may be employed.

Figure 4A:
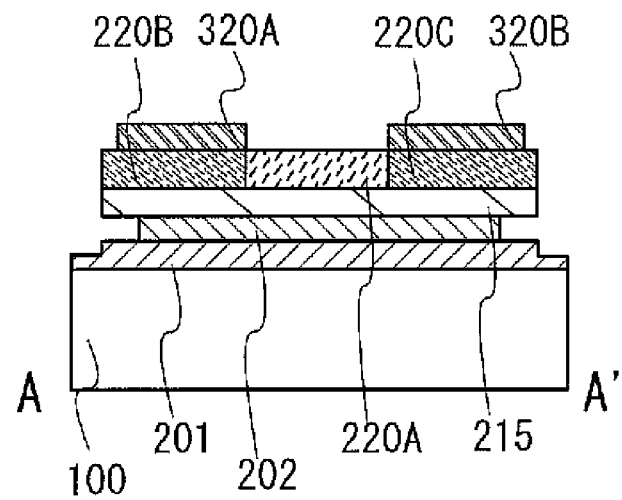
FIGS. 4A and 4B illustrate an example of a method for manufacturing a thin film transistor.
Figure 4B:
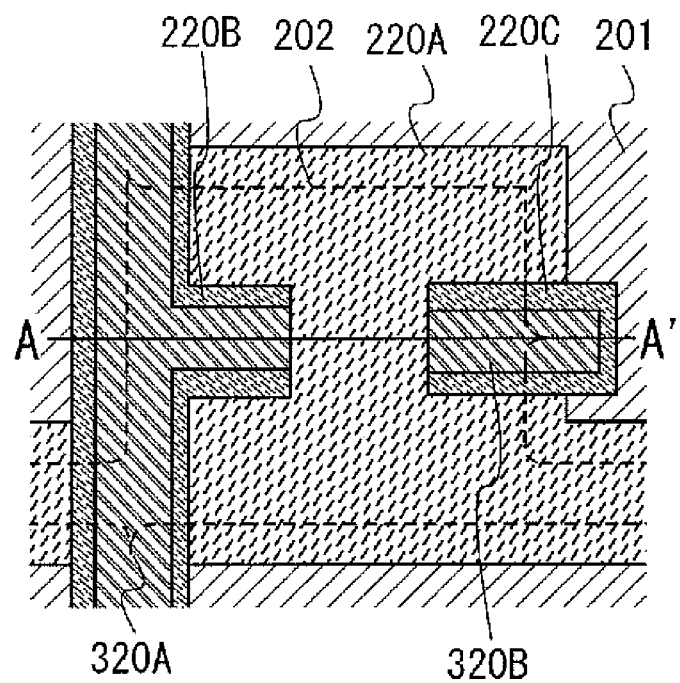

Then, the third resist mask 318 is removed to complete a thin film transistor (see FIGS. 4A and 4B). As described above, an etching in manufacturing a thin film transistor can be performed using one photomask (multi-tone mask). FIG. 4A corresponds to a cross-sectional view along A-A' of FIG. 4B.

In Embodiment 1, the process described using FIGS. 3E and 3F is called the "third etching." The third etching may be performed either by a plurality of steps as described above or at once.

Through the above, a substrate provided with a thin film transistor according to this embodiment is manufactured. As described in Embodiment 1, the thin film transistor can be manufactured using one photomask in such a manner that the gate electrode is formed utilizing side-etching and, further, the source and drain electrodes are formed using a multi-tone mask.

The thin film transistor manufactured using the manufacturing method of this embodiment has a structure in which a gate insulating film is provided over a gate electrode layer, a single crystal semiconductor layer including a channel formation region and a source and drain regions is provided over the gate insulating film, a source and drain electrodes are provided over the single crystal semiconductor layer, and a cavity is provided in contact with a side surface of the gate electrode layer (see FIG. 4A). The cavity which is formed in contact with the side surface of the gate electrode layer enables the formation of a thin film transistor with less leakage current at an end portion of the gate electrode layer thereof.

As described in Embodiment 1, the number of steps for manufacturing a thin film transistor can be significantly reduced. More specifically, as described above, patterning in manufacturing a thin film transistor can be performed using one photomask (multi-tone mask). That is, the number of photomasks used in the etching is reduced, which can lead to a large reduction of the number of steps for manufacturing a thin film transistor.

Further, the number of steps for manufacturing a thin film transistor can be significantly reduced without involving a complicated step such as backside light exposure, resist reflow, or lift-off. Moreover, the number of steps for manufacturing a thin film transistor can be significantly reduced while maintaining electrical characteristics of the thin film transistor.

Furthermore, the manufacturing cost can be significantly reduced.

Further, since a single crystal semiconductor layer is used as a semiconductor film, a semiconductor device with high integration, high operation speed, and low power consumption can be manufactured.

Embodiment 2

In Embodiment 2, one example of a method for manufacturing a thin film transistor, which is different from the manufacturing method described in Embodiment 1 will be described using FIGS. 7A to 7F and FIG. 8.

First, as in Embodiment 1, a second insulating film 201, a first conductive film 202, a first insulating film 215, and a single crystal semiconductor layer 220 are formed over a base substrate 100.

When the stacked-layer structure of the base substrate, the first insulating film, the second insulating film, the first conductive film, and the single crystal semiconductor layer is formed, selection from the manufacturing method and the materials described in Embodiment 1 may be performed appropriately. Therefore, detailed description thereof is omitted in Embodiment 2.

Next, an impurity semiconductor film 221 is formed over the single crystal semiconductor layer 220.

The impurity semiconductor film 221 is a semiconductor film containing an impurity element which imparts one conductivity type. The impurity semiconductor film 221 is formed using a semiconductor material gas to which the impurity element which imparts one conductivity type is added or the like.

For example, the impurity semiconductor film 221 may be a silicon film formed using a silane gas containing phosphine (chemical formula: $PH_3$) or diborane (chemical formula: $B_2H_6$).

Note that it is preferable to select a material which is prevented from being unintentionally etched or eroded as much as possible in a later step, as a material of the impurity semiconductor film 221.

The material of the impurity semiconductor film 221 is not limited to a particular material.

Further, the crystallinity of the impurity semiconductor film 221 is not particularly limited.

In the case of manufacturing an n-channel thin film transistor, phosphorus, arsenic, or the like may be used as the impurity element which imparts one conductivity type.

That is, a silane gas used for formation of the impurity semiconductor film 221 may contain phosphine, arsine (chemical formula: $AsH_3$), or the like at a predetermined concentration.

In the case of manufacturing a p-channel thin film transistor, boron or the like may be used as the impurity element which imparts one conductivity type.

That is, a silane gas used for formation of the impurity semiconductor film 221 may contain diborane or the like at a predetermined concentration.

The impurity semiconductor film 221 can be formed by, for example, a CVD method (including a thermal CVD method, a plasma CVD method, and the like). The method for forming the impurity semiconductor film 221 is not limited to a particular method.

Figure 7A:
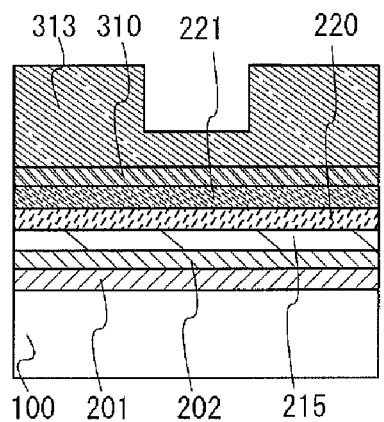
FIGS. 7A to 7F illustrate an example of a method for manufacturing a thin film transistor.

Next, a second conductive film 310 is formed over the impurity semiconductor film 221 as in Embodiment 1, and a first resist mask 313 is formed over the second conductive film 310 (see FIG. 7A).

The manufacturing method and the material described in Embodiment 1 may be selected as appropriate to be used to form the second conductive film 310.

The first resist mask 313 is a resist mask having a depression (a projection).

In the first resist mask 313, the projection is formed in each of regions which form a source and drain electrode layers 310A and 310B, and the depression is formed in a region where the source and drain electrode layers 310A and 310B are not formed and a part of the single crystal semiconductor layer is exposed.

The first resist mask 313 can be formed using a common multi-tone mask.

Note that the first resist mask 313 may be formed without using a multi-tone mask.

The first resist mask 313 may be a resist mask having neither a depression nor a projection.

Further, the first resist mask 313 is not limited to those cited in Embodiment 2.

Next, a first etching is performed using the first resist mask 313.

Figure 7D:
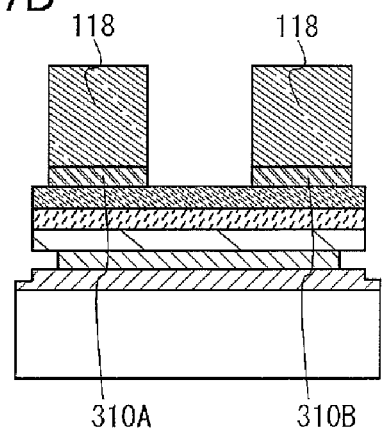
Figure 7B:
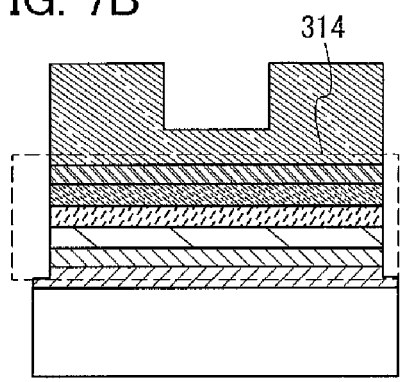

That is, the first insulating film 215, the first conductive film 202, the second conductive film 310, the impurity semiconductor film 221, and the single crystal semiconductor layer 220 are etched to form a thin-film stack 314 (see FIG. 7B).

At this time, it is preferable that at least a surface of the first conductive film 202 be exposed.

In this step, an upper portion of the second insulating film 201 is also etched away.

Owing to the existence of this second insulating film 201, unintentional etching of the substrate 100 due to the first etching can be prevented.

Accordingly, impurity metal elements contained in the substrate 100 can be prevented from being attached to and/or entering the semiconductor layer, for example.

In Embodiment 2, this etching step is called the "first etching."

As the first etching, either dry etching or wet etching may be employed.

The first etching can be performed by one step when dry etching is employed as the first etching.

On the other hand, when wet etching is employed as the first etching, it is preferable that the first etching be performed by a plurality of steps.

This is because the etching rate varies depending on the material of the etched film and it is difficult to perform the etching by one step.

The first etching may be performed by, for example, dry etching in three stages.

For example, first, etching may be performed using a mixed gas of a $Cl_2$ gas, a $CF_4$ gas, and an $O_2$ gas.

Next, etching may be performed using a $Cl_2$ gas.

Then, etching may be performed using a $CHF_3$ gas.

Next, a second etching is performed using the first resist mask 313.

Figure 7E:
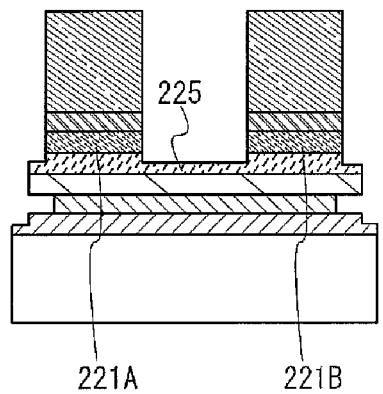
Figure 7C:
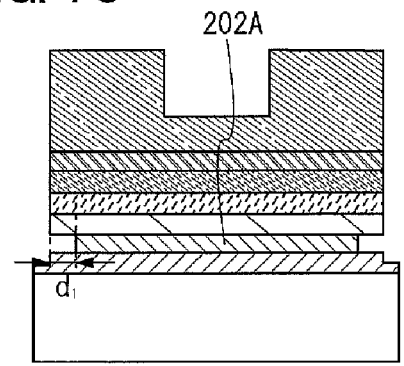

That is, the first conductive film 202 is etched to form a gate electrode layer 202A (see FIG. 7C).

In Embodiment 2, this etching step is called the "second etching."

The second etching is performed under such etching conditions that a side surface of the gate electrode layer 202A formed using the first conductive film 202 is provided more inside than a side surface of the thin-film stack 314.

Further, the second etching is performed such that the etching rate with respect to the second conductive film 310 is small and the etching rate with respect to the first conductive film 202 is large.

It is preferable that the second etching be performed by wet etching.

Described below is the case where the second etching is performed by wet etching.

For example, in the case where the first conductive film 202 is formed using aluminum or molybdenum and the second conductive film 310 is formed using titanium or tungsten, it is preferable that a chemical containing nitric acid, acetic acid, and phosphoric acid be used as a chemical for the etching.

For example, in the case where the first conductive film 202 is formed using molybdenum and the second conductive film 310 is formed using titanium, aluminum, or tungsten, it is preferable that a chemical containing hydrogen peroxide water be used as a chemical for the etching.

For example, in the case where a stacked film in which molybdenum is deposited over aluminum to which neodymium is added is formed as the first conductive film 202 and tungsten be deposited as the second conductive film 310, a chemical containing nitric acid at 2%, acetic acid at 10%, and phosphoric acid at 72% is used as a chemical for the etching.

By using the chemical having such a composition ratio, the first conductive film 202 is etched without etching the second conductive film 310.

Note that neodymium is added to the first conductive film 202 for the purpose of suppressing a large increase of the resistance of aluminum, improving the heat resistance, and preventing generation of hillocks.

Next, the first resist mask 313 is made to recede, so that a part of the second conductive film 310 is exposed and a second resist mask 118 is formed (see FIG. 7D).

As a method for forming the second resist mask 118 by making the first resist mask 313 recede, ashing using oxygen plasma can be given as an example thereof.

However, the method for forming the second resist mask 118 by making the first resist mask 313 recede is not limited to this method.

Although the case where the second resist mask 118 is formed after the second etching is described here, the second etching may be performed after formation of the second resist mask 118.

Next, the second conductive film 310 in the thin-film stack 314 is etched using the second resist mask 118, so that the source and drain electrode layers 310A and 310B are formed (see FIG. 7D).

As the etching conditions thereof, the conditions under which the films other than the second conductive film 310 are prevented from being unintentionally etched or corroded as much as possible are selected.

In particular, it is important that the etching is performed under the conditions that the gate electrode layer 202A is prevented from being unintentionally etched or corroded as much as possible.

The drawing is shown schematically and the second conductive film 310 is etched whereas little unintentional etching and/or corrosion of the films other than the second conductive film 310 occur.

Therefore, unintentional etching and/or corrosion of the films other than the second conductive film 310 is not illustrated in the drawing in Embodiment 2.

For the etching of the second conductive film 310 in the thin-film stack 314, either wet etching or dry etching may be employed.

Next, the impurity semiconductor film 221 and an upper portion of the single crystal semiconductor layer 220 (a back channel portion) in the thin-film stack 314 are etched, so that a source and drain regions 221A and 221B and a single crystal semiconductor layer 225 are formed (see FIG. 7E).

As the etching conditions thereof, the conditions under which the films other than the impurity semiconductor film 221 and the single crystal semiconductor layer 220 are prevented from being unintentionally etched or corroded as much as possible are selected.

In particular, it is important that the etching is performed under the conditions that the gate electrode layer 202A is prevented from being unintentionally etched or corroded as much as possible.

For the etching of the impurity semiconductor film 221 and the upper portion of the single crystal semiconductor layer 220 (the back channel portion) in the thin-film stack 314, either wet etching or dry etching may be employed.

In the case where silicon is used as the single crystal semiconductor layer 220 and an aqueous solution of hydrazine (chemical formula: $N_2H_4$), an aqueous solution of potassium hydroxide (chemical formula: KOH), an aqueous solution of tetramethylammonium hydroxide (also called TMAH), or the like is used as an etchant of the etching, the etching rate varies depending on the plane orientation of the silicon.

Hence, it is preferable that single crystal silicon with (111) orientation be used as the single crystal semiconductor layer 220 in the case where hydrazine, potassium hydroxide, tetramethylammonium hydroxide, or the like is used as the etchant.

Accordingly, the etching rate of the impurity semiconductor film 221 can be made to be higher than that of the single crystal semiconductor layer 220, thereby etching the upper portion of the single crystal semiconductor layer 220 away less than the impurity semiconductor film 221.

Figure 7F:
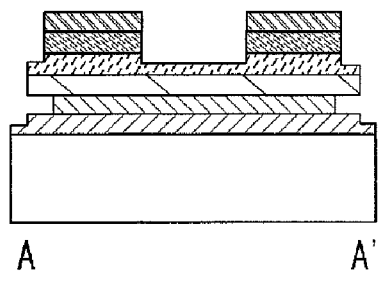
Figure 8:
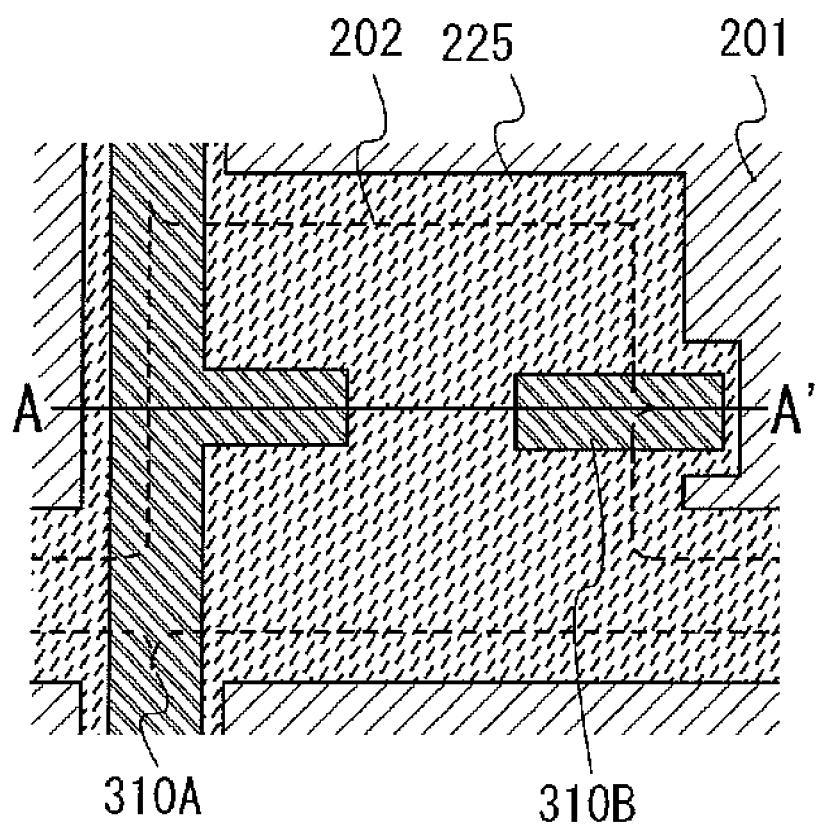
FIG. 8 illustrates an example of a method for manufacturing a thin film transistor.

Then, the second resist mask 118 is removed to complete a thin film transistor (see FIGS. 7F and 8).

As described above, the thin film transistor can be manufactured using one photomask (multi-tone mask).

FIG. 7F corresponds to a cross-sectional view along A-A' of FIG. 8.

In Embodiment 2, the process described using FIGS. 7D and 7E is called a "third etching."

The third etching may be performed either by a plurality of steps as described above or at once.

Through the above, a substrate provided with a thin film transistor according to this embodiment is manufactured.

As described in Embodiment 2, the thin film transistor can be manufactured using one photomask in such a manner that the gate electrode is formed utilizing side-etching and, further, the source and drain electrodes are formed using a multi-tone mask.

The thin film transistor manufactured using the manufacturing method of this embodiment has a structure in which a gate insulating film is provided over a gate electrode layer, a single crystal semiconductor layer including a channel formation region is provided over the gate insulating film, a source and drain regions are provided over the single crystal semiconductor layer, a source and drain electrodes are provided over the source and drain regions, and a cavity is provided in contact with a side surface of the gate electrode layer (see FIG. 7F).

The cavity which is formed in contact with the side surface of the gate electrode layer enables the formation of a thin film transistor with less leakage current at an end portion of the gate electrode layer thereof.

As described in Embodiment 2, the number of steps for manufacturing a thin film transistor can be significantly reduced.

More specifically, as described above, a thin film transistor can be manufactured using one photomask (multi-tone mask).

That is, the number of photomasks used in the etching is reduced, which can lead to a large reduction of the number of steps for manufacturing a thin film transistor.

Further, the number of steps for manufacturing a thin film transistor can be significantly reduced without involving a complicated step such as backside light exposure, resist reflow, or lift-off.

Moreover, the number of steps for manufacturing a thin film transistor can be significantly reduced while maintaining electrical characteristics of the thin film transistor.

Furthermore, the manufacturing cost can be significantly reduced.

Further, since a single crystal semiconductor layer is used as a semiconductor film, a semiconductor device with high integration, high operation speed, and low power consumption can be manufactured.

Embodiment 3

In Embodiment 3, an example of a method for manufacturing a thin film transistor and a method for manufacturing an EL display device in which the thin film transistors are arranged in matrix will be described with reference to FIGS. 9 to 14, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, and FIGS. 23A to 23C.

Although a structure in which an impurity element is added to a single crystal semiconductor layer, which is similar to Embodiment 1 is described in Embodiment 3, a structure in which an impurity semiconductor film is formed over a single crystal semiconductor layer may be employed as described in Embodiment 2.

Further, in the case where the impurity semiconductor film is formed over the single crystal semiconductor layer described in Embodiment 2, it is not necessary to form a resist mask for adding an impurity element into a single crystal semiconductor layer, which can lead to a reduction of the number of resist masks by one as compared to that in the process described in Embodiment 3.

Although an EL display device is taken as an example in Embodiment 3, a pixel structure described in Embodiment 3 may be applied to a liquid crystal display device. An EL display device using a pixel structure which is different from that described in Embodiment 3 or a liquid crystal display device using a pixel structure which is different from that described in Embodiment 3 may be manufactured.

As a pixel circuit of an EL display device, using a thin film transistor as a switching element, a variety of structures has been considered.

Figure 9:
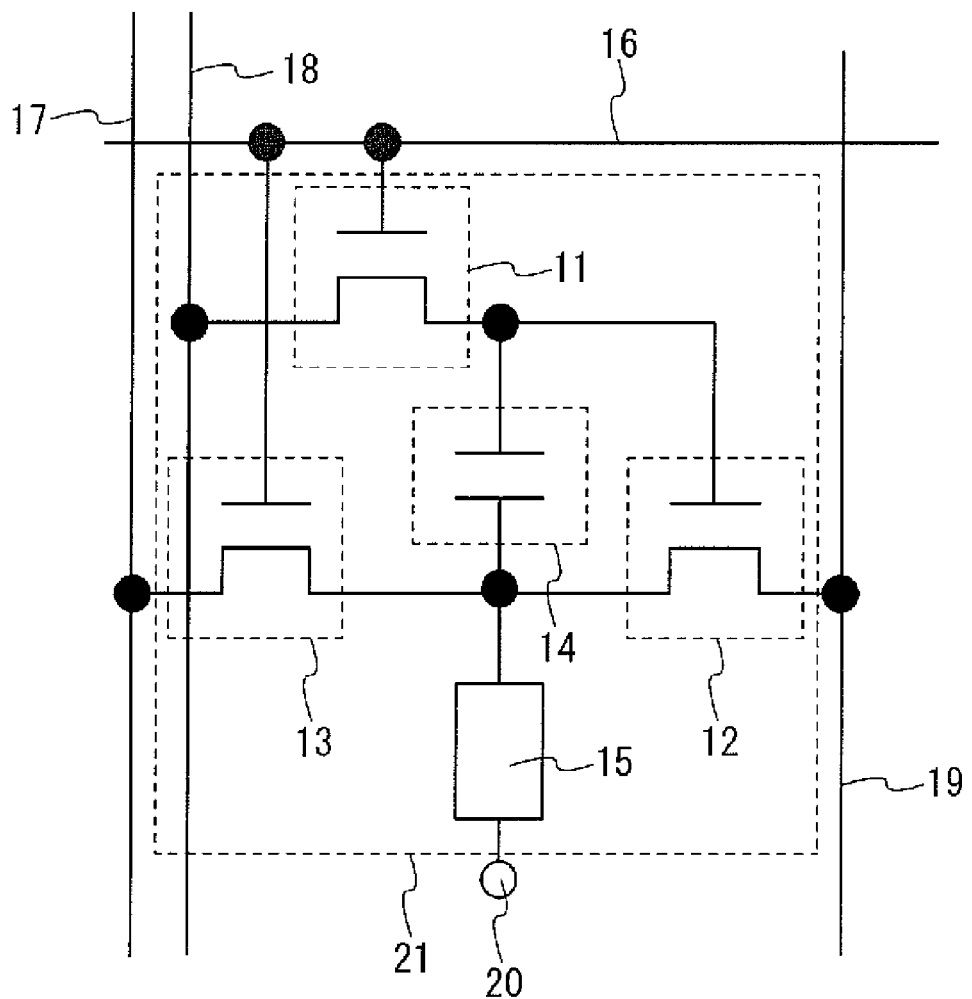
FIG. 9 illustrates an example of a method for manufacturing a thin film transistor and a display device.

In Embodiment 3, an example of a simple pixel circuit is illustrated in FIG. 9 and a method for manufacturing an EL display device to which this pixel circuit is applied is described below.

However, the pixel circuit of the EL display device is not limited to the structure illustrated in FIG. 9.

In the pixel structure of the EL display device shown in FIG. 9, a pixel 21 includes a first transistor 11, a second transistor 12, a third transistor 13, a capacitor 14, and a light-emitting element 15.

Although the first to third transistors are n-channel transistors in Embodiment 3, the first to third transistors may be p-channel transistors.

A gate electrode of the first transistor 11 is connected to a gate wiring 16; one of a source electrode and a drain electrode (a first electrode) of the first transistor 11 is connected to a source wiring 18; and the other of the source electrode and the drain electrode (a second electrode) of the first transistor 11 is connected to a gate electrode of the second transistor 12 and to one electrode (a first electrode) of the capacitor 14.

The other electrode (a second electrode) of the capacitor 14 is connected to one of a source electrode and a drain electrode (a first electrode) of the second transistor 12, one of a source electrode and a drain electrode (a first electrode) of the third transistor 13, and one electrode (a first electrode) of the light-emitting element 15.

The other of the source electrode and the drain electrode (a second electrode) of the second transistor 12 is connected to a second power supply line 19. The other of the source electrode and the drain electrode (a second electrode) of the third transistor 13 is connected to a first power supply line 17; and a gate electrode of the third transistor 13 is connected to the gate wiring 16.

The other electrode (a second electrode) of the light-emitting element 15 is connected to a common electrode 20.

Respective potentials of the first power supply line 17 and the second power supply line 19 are different from each other.

An operation of the pixel 21 is described below.

When the third transistor 13 is turned on by a signal from the gate wiring 16, respective potentials of the first electrode of the second transistor 12, the first electrode of the light-emitting element 15, and the second electrode of the capacitor 14 come to be equal to a potential ($V_{17}$) of the first power supply line 17.

In this embodiment, the potential ($V_{17}$) of the first power supply line 17 is fixed, so that the potentials of the first electrode of the second transistor 12 and the like is fixed ($V_{17}$).

When the first transistor 11 is selected to be turned on by a signal from the gate wiring 16, a potential ($V_{18}$) of a signal from the source wiring 18 is inputted to the gate electrode of the second transistor 12 through the first transistor 11.

At this time, when a potential ($V_{19}$) of the second power supply line 19 is higher than the potential ($V_{17}$) of the first power supply line 17, $V_{gs}$ of the second transistor 12 is ($V_{18} - V_{17}$).

Further, when $V_{gs}$ is higher than the threshold voltage of the second transistor 12, the second transistor 12 is turned on.

Therefore, in the case where the second transistor 12 is operated in the linear region, the potential ($V_{18}$) of the source wiring 18 is changed (for example, to be binarized), so that ON/OFF of the second transistor 12 can be controlled.

That is, whether a voltage is applied to an EL layer of the light-emitting element 15 or not can be controlled.

In the case where the second transistor 12 is operated in the saturation region, the potential ($V_{18}$) of the source wiring 18 is changed to control the gate-source voltage of the second transistor 12, so that the level of current which flows through the light-emitting element 15 can be controlled.

In the above-described manner, in the case where the second transistor 12 is operated in the linear region, whether a voltage is applied to the light-emitting element 15 or not can be controlled, thereby controlling light emission/non-light emission of the light-emitting element 15.

The above-described driving method can be used for, for example, digital time grayscale driving.

According to the digital time grayscale driving, one frame is divided into a plurality of subframes and light emission/non-light emission of the light-emitting element 15 is controlled for each subframe.

In addition, in the case of operating the second transistor 12 in the saturation region, the level of current which flows through the light-emitting element 15 can be controlled, so that luminance of the light-emitting element 15 can be adjusted.

Next, an EL display device to which the pixel circuit illustrated in FIG. 9 is applied and a manufacturing method thereof are described below.

Figure 12:
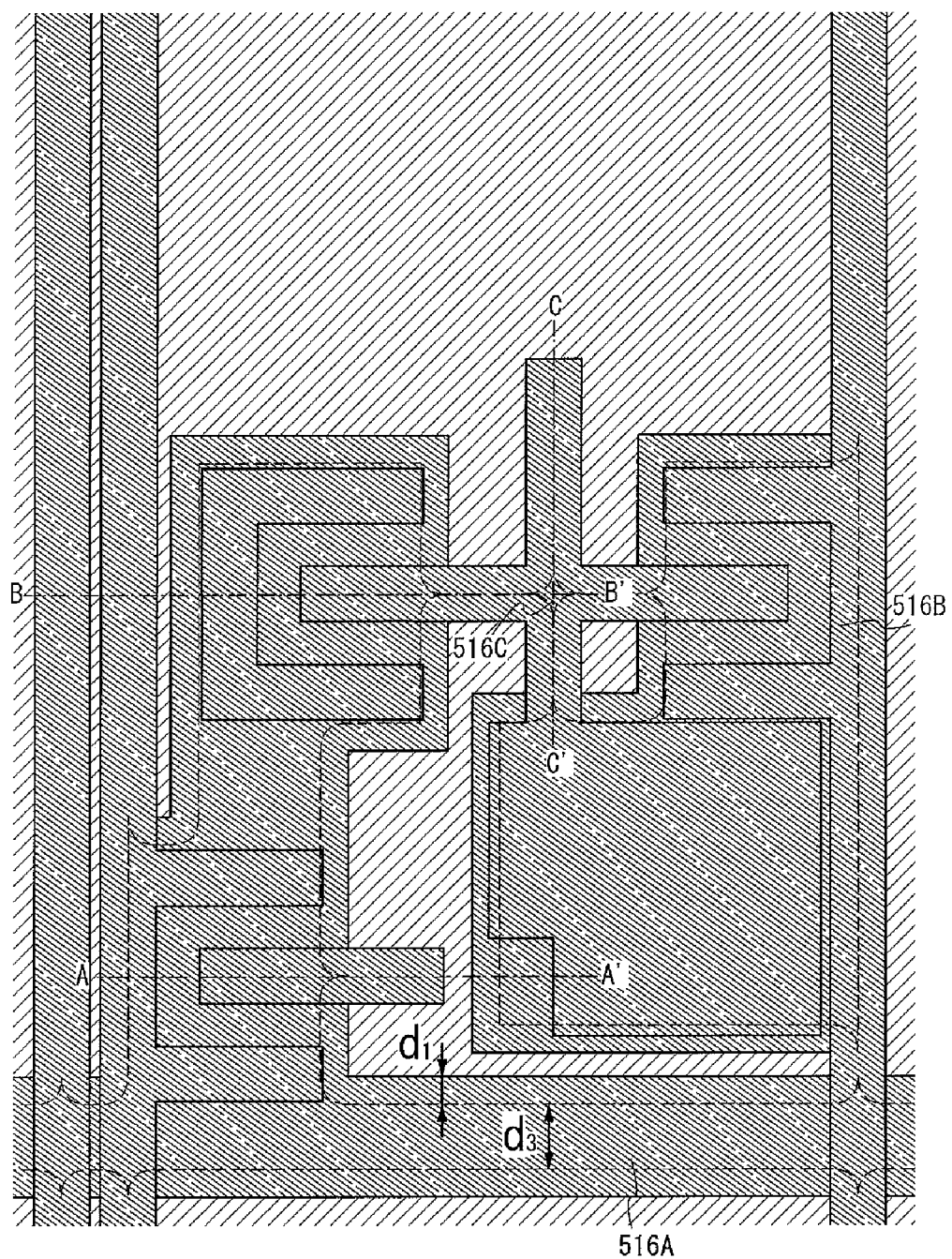
FIG. 12 illustrates an example of a method for manufacturing a thin film transistor and a display device.
Figure 13:
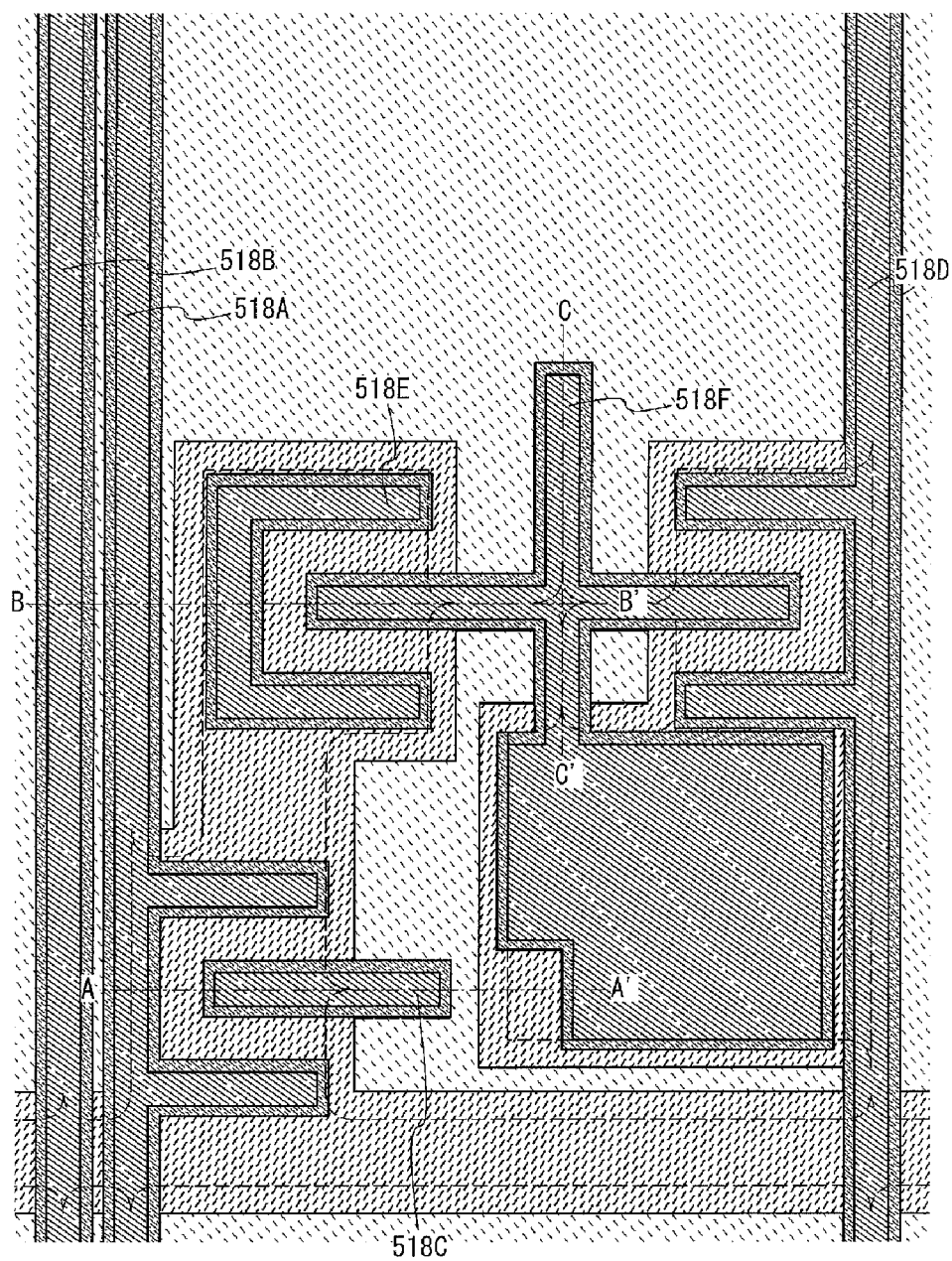
FIG. 13 illustrates an example of a method for manufacturing a thin film transistor and a display device.
Figure 14:
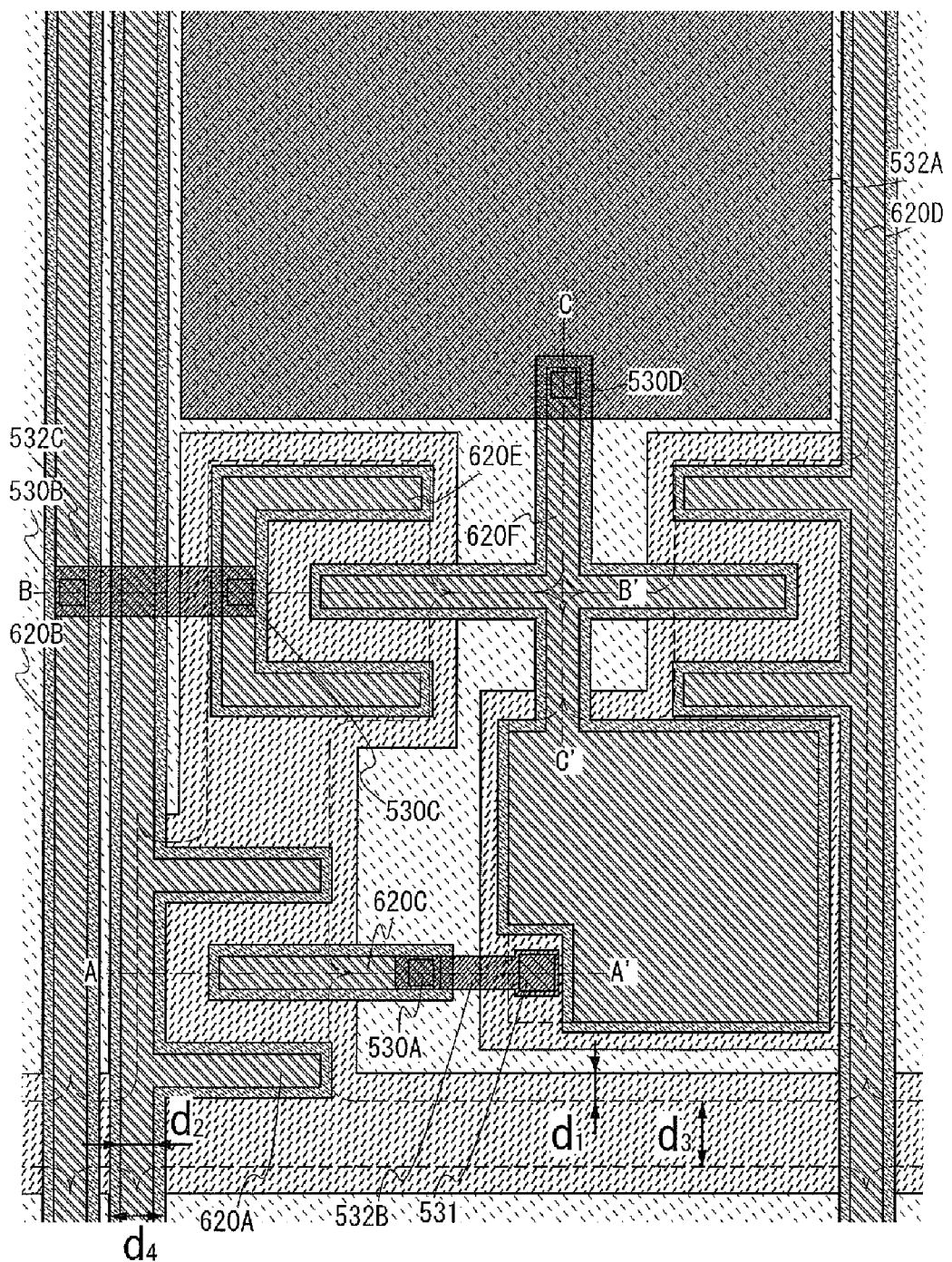
FIG. 14 illustrates an example of a method for manufacturing a thin film transistor and a display device.

FIGS. 10 to 14 are top views of thin film transistors according to this embodiment. FIG. 14 is a completion view at the time of finishing the formation of a pixel electrode.

FIGS. 15A to 15C, FIGS. 16A to 16C, and FIGS. 17A to 17C are cross-sectional views along line A-A' in FIGS. 10 to 14.

Figure 10:
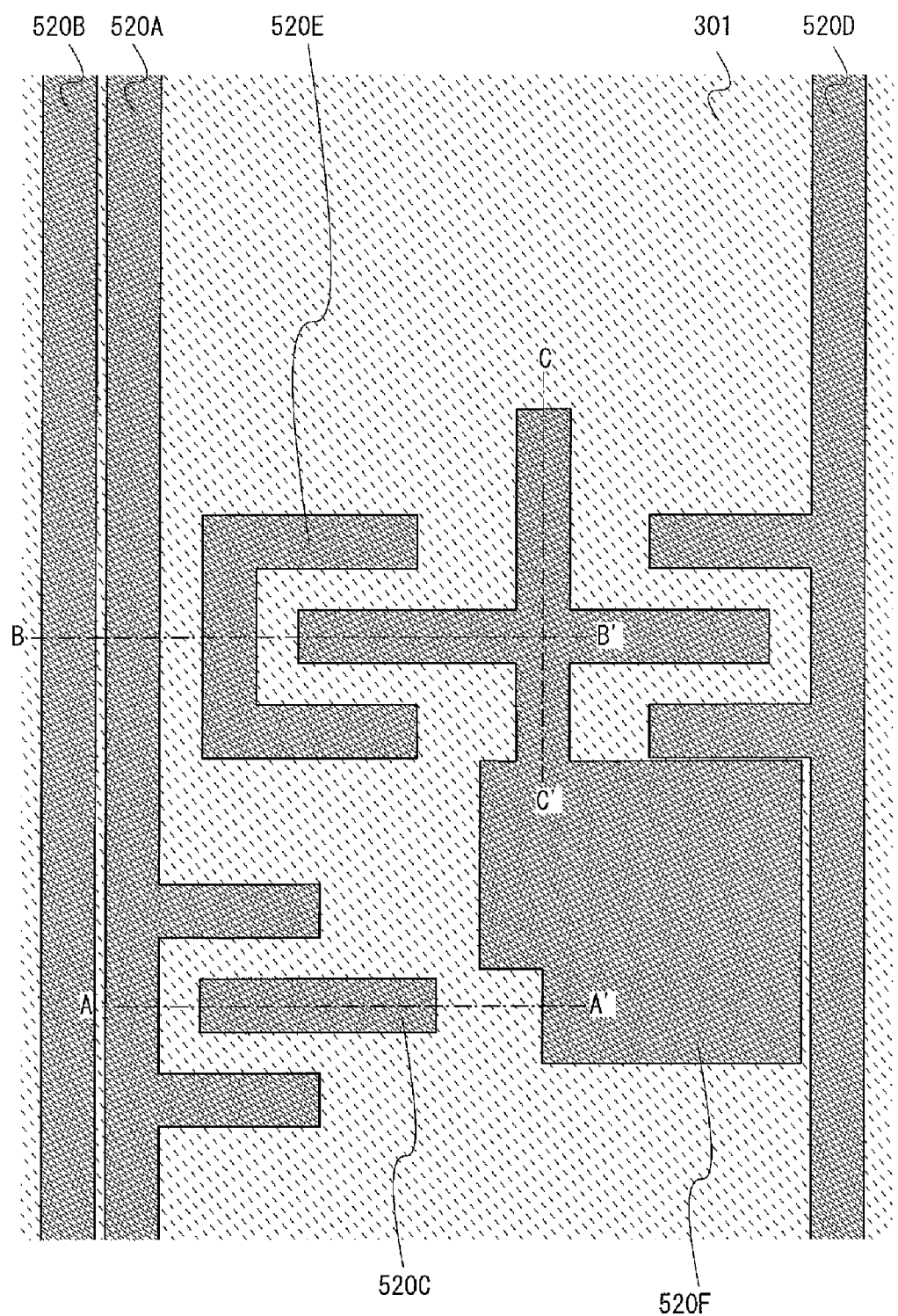
FIG. 10 illustrates an example of a method for manufacturing a thin film transistor and a display device.
Figure 11:
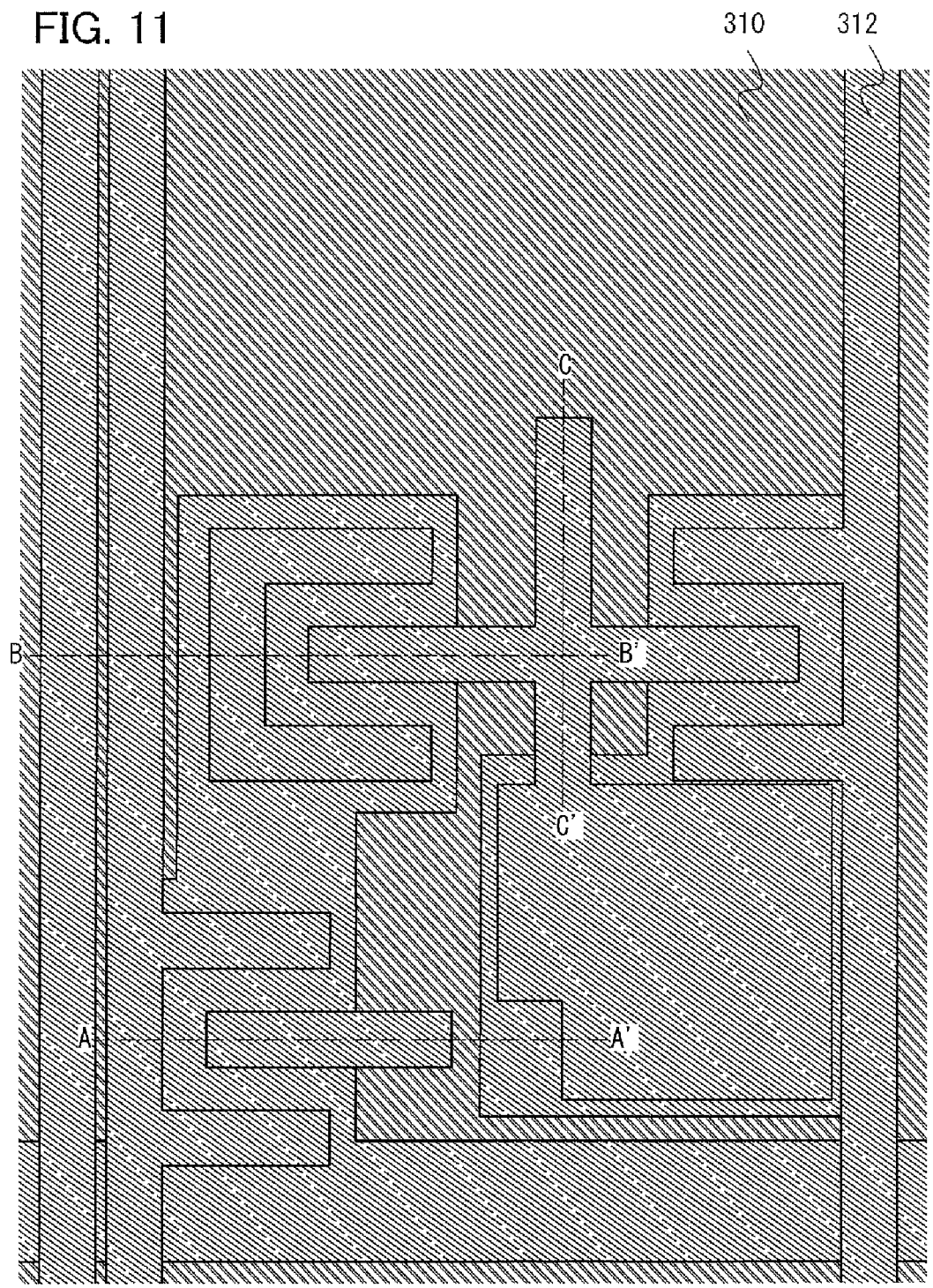
FIG. 11 illustrates an example of a method for manufacturing a thin film transistor and a display device.

FIGS. 18A to 18C, FIGS. 19A to 19C, and FIGS. 20A to 20C are cross-sectional views along line B-B' in FIGS. 10 and 11.

FIGS. 21A to 21C, FIGS. 22A to 22C, and FIGS. 23A to 23C are cross-sectional views along line C-C' in FIGS. 10 to 14.

First, as in Embodiment 1, a second insulating film 201, a first conductive film 202, a first insulating film 215, and a single crystal semiconductor layer 520 are formed over a base substrate 100.

When the stacked-layer structure of the base substrate, the first insulating film, the second insulating film, the first conductive film, and the single crystal semiconductor layer is formed, selection from the manufacturing method and the materials described in Embodiment 1 may be made appropriately. Therefore, detailed description thereof is omitted in Embodiment 3.

Next, a first resist mask 301 is selectively provided over the single crystal semiconductor layer 520, and an impurity element which imparts one conductivity type is added to the single crystal semiconductor layer 520 with the first resist mask 301 as a mask.

By adding the impurity element with the first resist mask 301 as a mask, impurity regions 520A to 520F are formed in regions of the single crystal semiconductor layer 520, which do not overlap the first resist mask 301 and a region 520G in which an impurity element is not added is formed in a region of the single crystal semiconductor layer 520, which overlaps the first resist mask 301 (see FIGS. 10, 15A, 18A, and 21A).

In this embodiment, as the impurity element which imparts one conductivity type, phosphorus (P) is added to the single crystal semiconductor layer 520 so as to be contained at a concentration of $1 \times 10^{15}/cm^3$ to $1 \times 10^{19}/cm^3$.

Note that it is preferable that the impurity element which imparts one conductivity type be added to at least regions under wirings and electrodes which are formed using a second conductive film later, of the single crystal semiconductor layer.

Next, the first resist mask 301 is removed, and a second conductive film 310 is formed over the single crystal semiconductor layer 520.

The method and material described in Embodiment 1 can be used to form the second conductive film 310. In this embodiment, molybdenum is used, for example.

Next, a second resist mask 312 is formed over the second conductive film 310 (see FIGS. 11, 15B, 18B, and 21B).

In this embodiment, it is preferable that the second resist mask 312 be a resist mask having a depression (a projection).

In other words, it is preferable that the second resist mask 312 be a resist mask which consists of a plurality of regions (two regions in this embodiment) which are different in thickness.

In the second resist mask 312, a thick region is referred to as the projection of the second resist mask 312 whereas a thin region is referred to as the depression of the second resist mask 312 in this embodiment.

However, the present invention is not limited thereto: a resist mask having neither a depression nor a projection may be used.

In the second resist mask 312 described in Embodiment 3, the projection is formed in each of regions which form a source and drain electrode layers, and the depression is formed in a region where the source and drain electrode layers are not formed and a part of the semiconductor layer is exposed.

The second resist mask 312 can be formed using the multi-tone mask described in Embodiment 1.

Next, a first etching is performed using the second resist mask 312.

Figure 18A:
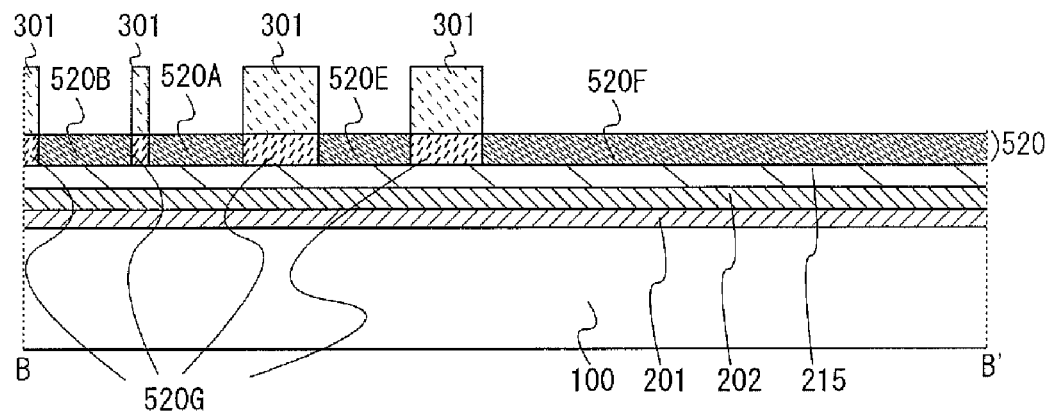
FIGS. 18A to 18C illustrate an example of a method for manufacturing a thin film transistor and a display device.
Figure 18B:
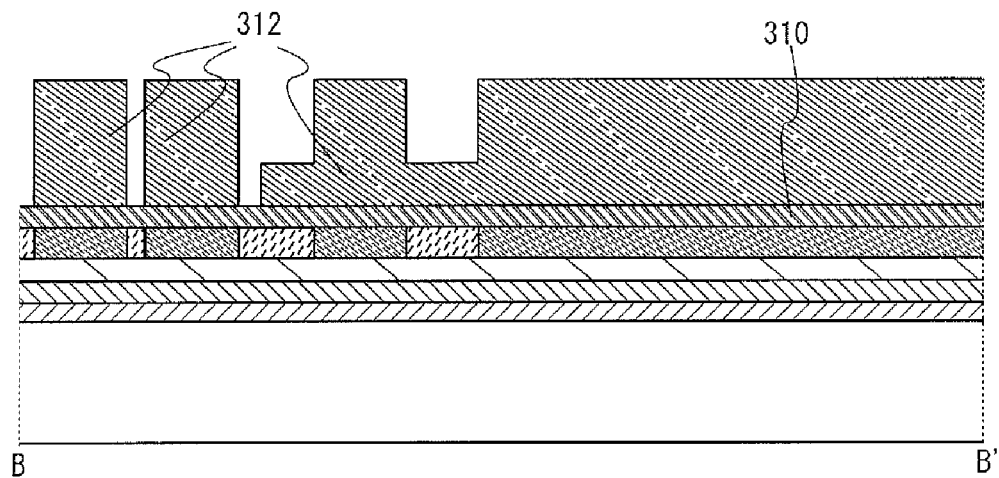
Figure 18C:
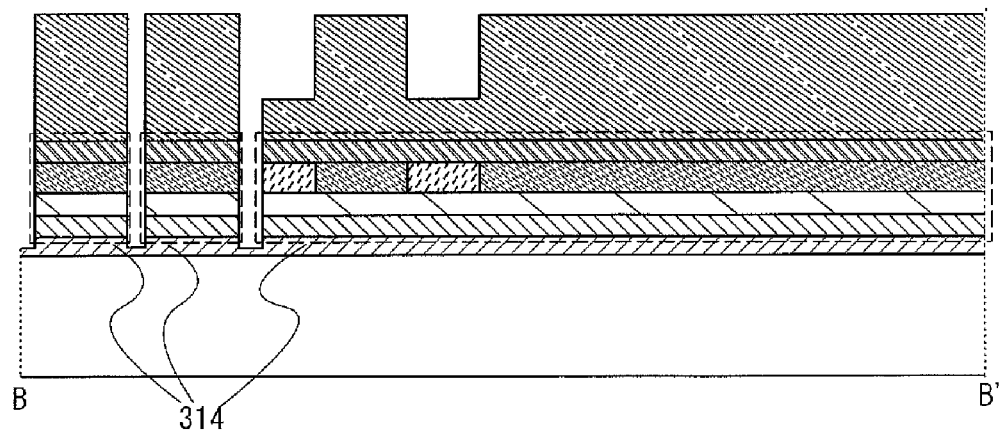
Figure 21A:
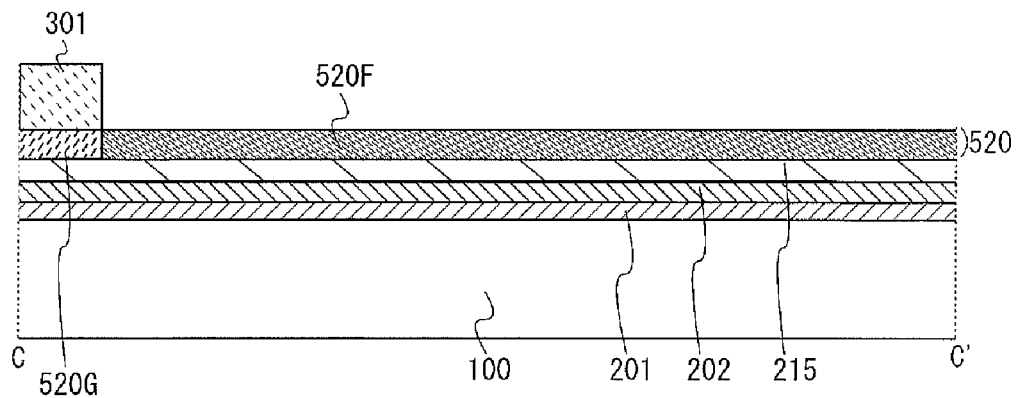
FIGS. 21A to 21C illustrate an example of a method for manufacturing a thin film transistor and a display device.
Figure 21B:
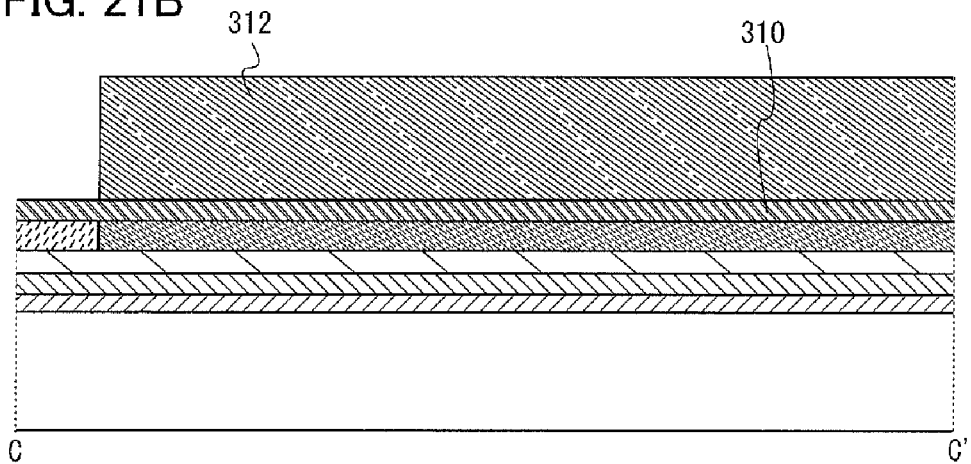
Figure 21C:
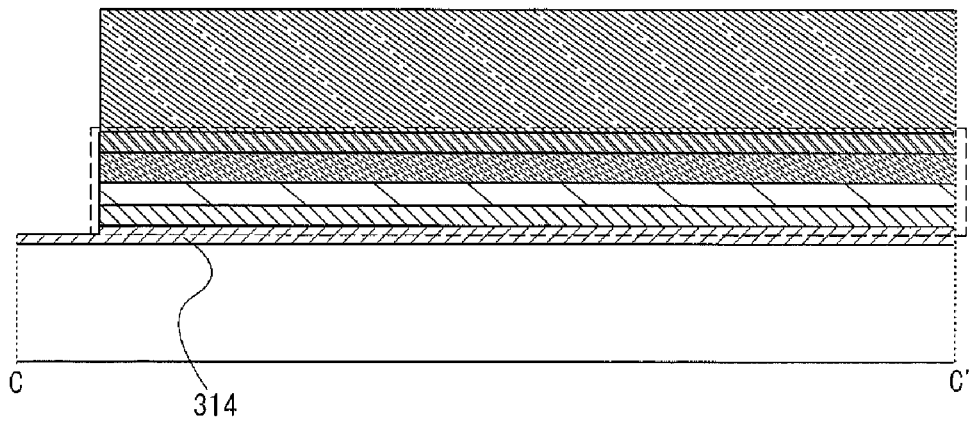

In other words, the first conductive film 202, the second insulating film 215, the single crystal semiconductor layer 502, and the second conducive film 310 are etched to be patterned to form a thin-film stack 314 (see FIGS. 15C, 18C, and 21C).

At this time, it is preferable that at least a surface of the first conductive film 202 be exposed.

In Embodiment 3, this etching step is called the "first etching."

As the first etching, either dry etching or wet etching may be employed.

The first etching can be performed by one step when dry etching is employed.

On the other hand, it is preferable that the first etching be performed by a plurality of steps when wet etching is employed as the first etching.

This is because the etching rate varies depending on the material of the etched film and it is difficult to perform the etching by one step.

Owing to the existence of the etched first insulating film 201 which functions as a base insulating film, unintentional etching of the substrate 100 due to the first etching can be prevented.

Accordingly, impurity metal elements contained in the substrate 100 can be prevented from being attached to and/or entering the semiconductor layer, for example.

The first etching may be performed by, for example, dry etching in three stages.

For example, first, etching is performed using a mixed gas of a $Cl_2$ gas, a $CF_4$ gas, and an $O_2$ gas.

Next, etching is performed using a $Cl_2$ gas.

Then, etching is performed using a $CHF_3$ gas.

Next, a second etching is performed using the second resist mask 312.

That is, the first conductive film 202 is etched to be patterned to form a gate electrode layer 516 (516A to 516C) (see FIGS. 12, 16A, 19A, and 22A).

In Embodiment 3, this etching step is called the "second etching."

Note that the gate electrode layer 516 forms the gate electrode of each thin film transistor, the gate wiring, the one electrode of the capacitor, and a supporting portion.

The gate electrode layer 516A means the electrode layer which forms the gate wiring, the gate electrode of the first transistor 11, and the gate electrode of the third transistor 13.

The gate electrode layer 516B means the electrode layer which forms the gate electrode of the second transistor 12 and the one electrode of the capacitor 14.

The gate electrode layer 516C means the electrode layer which forms the supporting portion.

In this specification, these electrode layers are referred to as the gate electrode layer 516 as a whole.

The second etching is performed under such etching conditions that a side surface of the gate electrode layer 516 formed using the first conductive film 202 is provided more inside than a side surface of the thin-film stack 314.

In other words, the etching is performed such that the side surface of the gate electrode layer 516 is provided in contact with a bottom surface of the thin-film stack 314 (for example, the etching is performed such that the width of each of the gate electrode layers 516A and 516B is smaller than the width of the thin-film stack 314 in the cross section along line A-A').

Further, it is performed such that the etching rate with respect to the second conductive film 310 is small and the etching rate with respect to the first conductive film 202 is large.

In other words, the etching is performed under such conditions that the selectivity ratio of the first conductive film 202 with respect to the second conductive film 310 is high.

By performing the second etching under such conditions, the gate electrode layer 516 can be formed.

Here, description is provided for the technical significance of the first etching and the second etching.

The case where a circuit including a plurality of first wirings and a plurality of second wirings is formed is taken as an example.

The first wirings and the second wirings intersect with each other.

Considering this embodiment, the first wiring corresponds to a scan line formed using the gate electrode layer and the second wiring corresponds to a signal line formed using the source or drain electrode layer.

First, by performing the first etching, the conductive layer which functions as the gate electrode layer and the conductive film which functions as the source and drain electrode layers are etched to have shapes which are the same or substantially the same as each other.

As a result of this, the conductive layer which functions as the gate electrode layer has a grid-shaped portion.

The grid shape of the conductive layer which functions as the gate electrode layer electrically connects the plurality of first wirings (the plurality of gate wirings) to each other.

Therefore, by performing the second etching (side-etching), part of the conductive layer which functions as the gate electrode layer, which is provided under the position where the second wiring is formed is etched away.

The selective etching-away of part of the conductive layer which functions as the gate electrode layer which is provided under the position where the second wiring is formed can electrically insulate the plurality of first wirings (the plurality of gate wirings) from each other.

In conventional cases, one mask has been used for electrically isolating a plurality of first wirings (a plurality of gate wirings) from each other.

Therefore, the second etching (side-etching) can bring a reduction of the number of masks by one.

Note that the second etching (side-etching) is performed such that the plurality of first wirings (the plurality of gate wirings) is not removed and part of the conductive layer which functions as the gate electrode layer, which is provided under the position where the second wiring is formed is etched away.

A method for etching away the part of the conductive layer which functions as the gate electrode layer, which is provided under the position where the second wiring is formed is detailed below.

First, the width of the narrowest portion in a resist pattern for the conductive layer which functions as the source and drain electrode layers (the width of a resist pattern for a source wiring which lines in a longitudinal direction in FIG. 11) is denoted by X.

Next, the width of the narrowest portion in a resist pattern for the conductive layer which functions as the gate electrode layer (the width of a resist pattern for a gate wiring which lines in a lateral direction in FIG. 11) is denoted by Y.

When Y is larger than X, the gate electrode layer is etched away faster than the source and drain electrode layers by the side-etching, which results in disconnection of the gate wiring.

Thus it is preferable that Y be smaller than X.

Since the side-etching cuts away the wiring from both the ends, it is preferable that X≧2Y.

For the case where the source wiring and the gate wiring are formed to have widths which are the same or substantially the same as each other, it is preferable that X=2Y.

On the other hand, in the case where the resistance of a material of the gate wiring is smaller than that of a material of the source wiring, it is preferable that X>2Y.

The narrowest portion in the resist pattern for the conductive layer which functions as the source and drain electrode layers is referred to as a wiring dividing region.

In FIGS. 10 to 14, almost all of the region under a source wiring (a region other than an intersection of the source wiring and a gate wiring) is the wiring dividing region.

In contrast, in FIGS. 28 to 32, a plurality of wiring dividing regions under a source wiring is provided locally to form a supporting portion.

Note that as a result of the first etching, the conductive layer which functions as the source and drain electrode layers has a grid-shaped portion as well.

The grid shape of the conductive layer which functions as the source and drain electrode layers electrically connects the plurality of second wirings (the plurality of source wirings) to each other.

Therefore, with the use of a half-tone mask, part of the conductive layer which functions as the source and drain electrode layers is etched away.

There is no particular limitation on the shape of the side surface of the gate electrode layer 516.

For example, the shape may be a tapered shape.

The shape of the side surface of the gate electrode layer 516 is determined depending on the conditions such as a chemical used in the second etching.

In Embodiment 3, such condition that "the etching rate with respect to the second conductive film 310 is small and the etching rate with respect to the first conductive film 202 is large" or "such condition that the selectivity ratio of the first conductive film 202 with respect to the second conductive film 310 is high" satisfies the following first and second requirements.

The first requirement is that the gate electrode layer 516 is left in an appropriate portion.

The appropriate portion of the gate electrode layer 516 is a region indicated by a dotted line in FIGS. 12 to 14.

Specifically, it is necessary that the gate electrode layers 516A and 516B be left so as to form the gate wiring, the gate electrodes in the transistors, and the one electrode in the capacitor after the second etching.

In order that the gate electrode layer forms the gate wiring and the capacitor wiring, it is necessary that the second etching be performed so as not to disconnect these wirings.

As shown in FIGS. 12 and 19, it is preferable that the side surfaces of the gate electrode layers 516A and 516B are positioned more inside than the side surface of the thin-film stack 314 by a distance $d_1$ from the side face of the thin-film stack 314.

The distance $d_1$ can be set as appropriate in accordance with the layout.

The second requirement is that a minimum width $d_3$ of the gate wiring and the capacitor wiring which are formed using the gate electrode layer 516 and a minimum width $d_2$ of the source wiring and the power supply line which are formed using a source and drain electrode layers 620 are appropriate (see FIG. 14).

This is because etching of the source and drain electrode layers 620 by the second etching makes the minimum width $d_2$ of the source wiring and the power supply line small.

As the minimum width $d_2$ decreases, the current density of the source wiring and the power supply line increases.

As the current density of the source wiring and the power supply line increases, the electrical characteristics degrade.

Therefore, the second etching is performed under such conditions that the etching rate of the first conductive film 202 is not too high and the etching rate of the second conductive film 310 is as low as possible.

In addition, the etching rate of the first conductive film 202 in a third etching described later is set to as low as possible.

Further, it is difficult to increase the minimum width $d_2$ of the source wiring and the power supply line.

That is, the minimum width $d_2$ of the source wiring and the power supply line is determined by a minimum width $d_4$ of the semiconductor layer which overlaps the source wiring and the power supply line.

Therefore, in order to increase the minimum width $d_2$ of the source wiring and the power supply line, it is necessary to increase the minimum width $d_4$ of the semiconductor layer.

However, when the minimum width $d_4$ of the semiconductor layer is increased to a too large width, the semiconductor layer under the source wiring is connected to the semiconductor layer under the power supply line, which is not preferable because it is difficult to insulate the source wiring and the power supply line which are adjacent to each other.

The minimum width $d_4$ of the semiconductor layer is set to be smaller than about twice the distance $d_1$.

In other words, the distance $d_1$ is set to be larger than about half the minimum width $d_4$ of the semiconductor layer.

The semiconductor layer with the minimum width $d_4$ as the width, which overlaps the source wiring or the power supply line may be provided as appropriate in portions necessary for separation of the gate electrode layer for each element.

With the second etching, a pattern in which the gate electrode layer 516 is not left in portions which overlap the portion with the width $d_4$ of the semiconductor layer can be formed.

It is preferable that the width of each electrode formed using the source electrode layer or the drain electrode layer (an electrode which is connected to a pixel electrode layer) be the minimum width $d_2$ of the source wiring and the power supply line.

It is necessary that the second etching is performed under the condition involving side-etching as described above.

This is because the gate wiring can be patterned to be formed and elements in the pixel circuit can be connected as appropriate by the second etching accompanied with side-etching of the first conductive film 202.

Here, the "side-etching" means etching in which a film is etched in not only a thickness direction of the film (a direction perpendicular to the substrate surface or a direction perpendicular to the surface of a base film of the film) but also in a direction perpendicular to the thickness direction (a direction parallel to the substrate surface or a direction parallel to the surface of the base film of the film).

An end portion of the film subjected to side-etching can have various shapes depending on the etching rate of an etching gas or a chemical used for the etching with respect to the film. The end portion of the film is, in many cases, formed with a curved surface.

The gate electrode layer 516C which is shown in FIG. 12 functions as the supporting portion which supports the thin-film stack 314.

By the existence of the supporting portion, peeling of a film such as a gate insulating film, formed over the gate electrode layer can be prevented.

Furthermore, by the existence of the supporting portion, the cavity which is formed in contact with the gate electrode layer 516 by the second etching can be prevented from widening too much.

Furthermore, it is preferable to provide the supporting portion also in that the thin-film stack 314 can be prevented from being broken or damaged due to its own weight and yield is improved.

The present invention is not limited to such a mode having a supporting portion, and the supporting portion is not necessarily provided.

As described above, it is preferable that the second etching be performed by wet etching.

Described below is the case where the second etching is performed by wet etching.

For example, in the case where the first conductive film 202 is formed using aluminum or molybdenum and the second conductive film 310 is formed using titanium or tungsten, it is preferable that a chemical containing nitric acid, acetic acid, and phosphoric acid be used as a chemical for the etching.

For example, in the case where the first conductive film 202 is formed using molybdenum and the second conductive film 310 is formed using titanium, aluminum, or tungsten, it is preferable that a chemical containing hydrogen peroxide water be used as a chemical for the etching.

For example, in the case where a stacked film in which molybdenum is deposited over aluminum to which neodymium is added is formed as the first conductive film 202 and tungsten be deposited as the second conductive film 310, a chemical containing nitric acid at 2%, acetic acid at 10%, and phosphoric acid at 72% is used as a chemical for the etching.

By using the chemical having such a composition ratio, the first conductive film 202 can be etched without etching the second conductive film 310.

Note that neodymium is added to the first conductive film 202 for the purpose of suppressing a large increase of the resistance of aluminum, improving the heat resistance, and preventing generation of hillocks.

The gate electrode layer 516 is formed such that it seems to have a horn when seen from top (see FIG. 12).

This is because the second etching for forming the gate electrode layer 516 proceeds almost isotropically so that the distance $d_1$ between the side surface of the gate electrode layer 516 and the side surface of the thin-film stack 314 is uniform or uniform or substantially uniform.

This horn portion may cause parasitic capacitance.

Further, in the case where the horn is formed with a long length, insulation between wiring which are adjacent to each other may be incomplete, which may cause short-circuiting between thin film transistors of pixels which are adjacent to each other.

In view of these, in order to prevent formation of the horn portion, an opening may be formed in a region in which a horn portion of the gate electrode layer 516 is formed.

Specifically, an opening may be provided in advance in the second resist mask 312 which is provided over the region in which a horn portion of the gate electrode layer 516 is formed.

In this manner, generation of a horn can be prevented or the size of a horn can be decreased.

Next, the second resist mask 312 is made to recede, so that a part of the second conductive film 310 is exposed and a third resist mask 518 (518A to 518F) is formed.

As a method for forming the third resist mask 518 by making the second resist mask 312 recede, ashing using oxygen plasma can be given as an example thereof.

However, the method for forming the third resist mask 518 by making the second resist mask 312 recede is not limited to this method.

A region in which the third resist mask 518 is formed coincides or substantially coincides with the region of the projection of the second resist mask 312.

Although the case where the third resist mask 518 is formed after the second etching is described here, the second etching may be performed after formation of the third resist mask 518.

In the case where a multi-tone photomask is not used in forming the second resist mask 312, another photomask may be used to form the third resist mask 518.

Next, the second conductive film 310 in the thin-film stack 314 is etched using the third resist mask 518, so that the source and drain electrode layers 620 (620A to 620F) are formed (see FIGS. 13, 16B, 19B, and 22B).

As the etching conditions thereof, the conditions under which the films other than the second conductive film 310 are prevented from being unintentionally etched or corroded as much as possible are selected.

In particular, it is important that the etching is performed under the conditions that the gate electrode layer 516 is prevented from being unintentionally etched or corroded as much as possible.

Figure 16A:
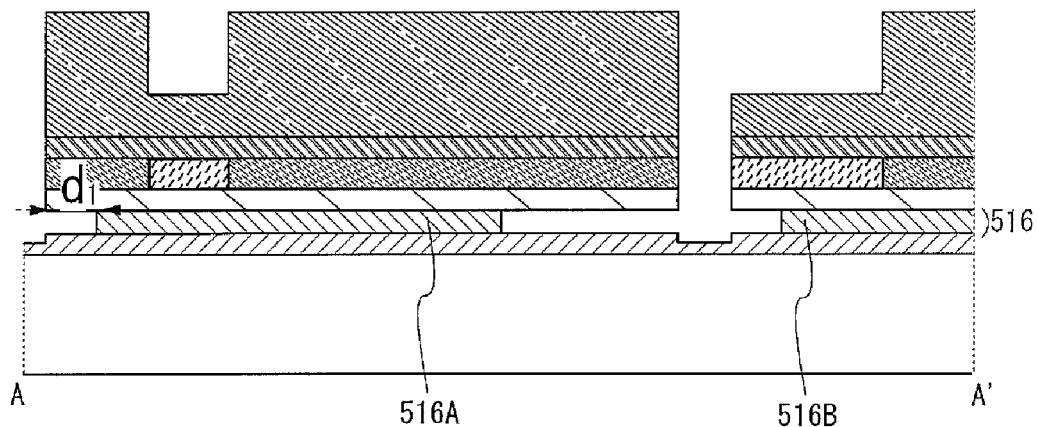
FIGS. 16A to 16C illustrate an example of a method for manufacturing a thin film transistor and a display device.
Figure 16B:
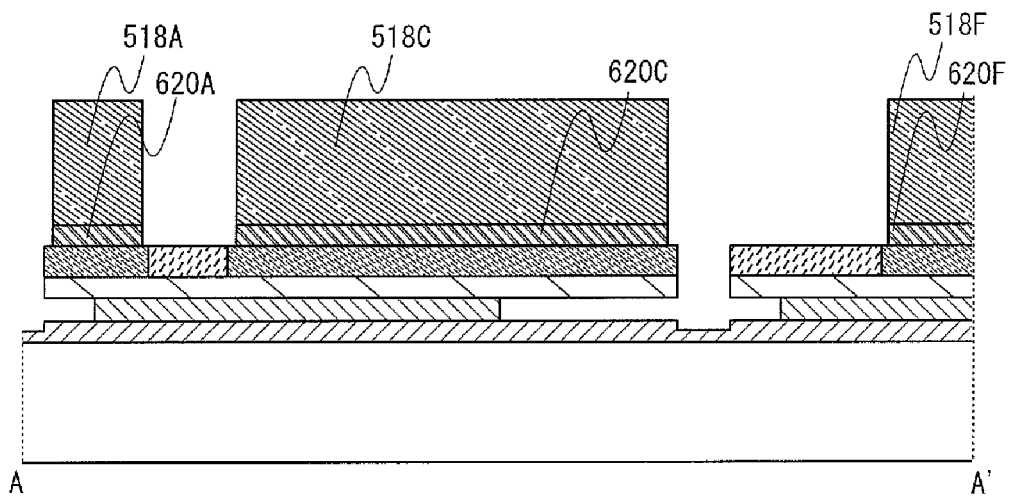
Figure 16C:
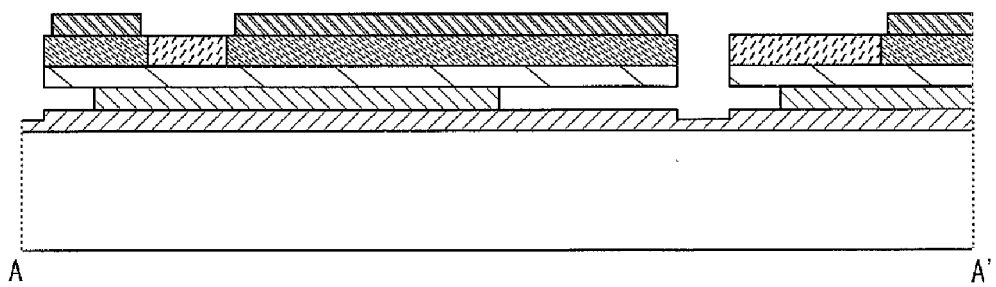
Figure 19A:
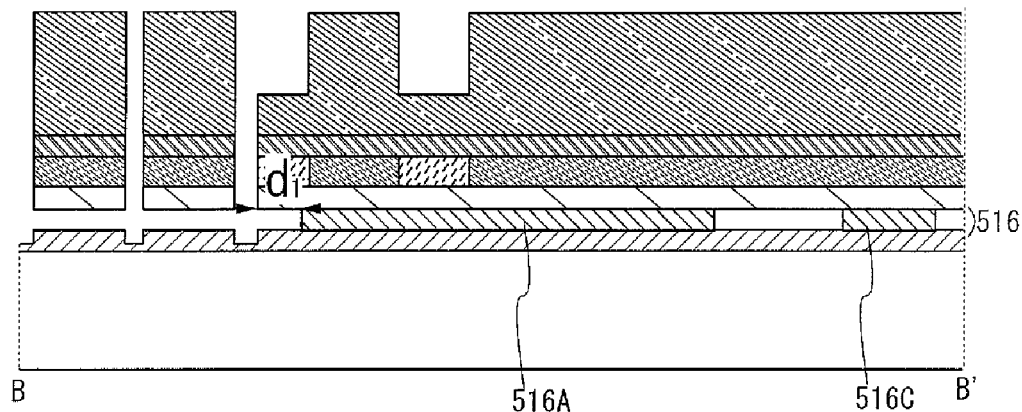
FIGS. 19A to 19C illustrate an example of a method for manufacturing a thin film transistor and a display device.
Figure 19B:
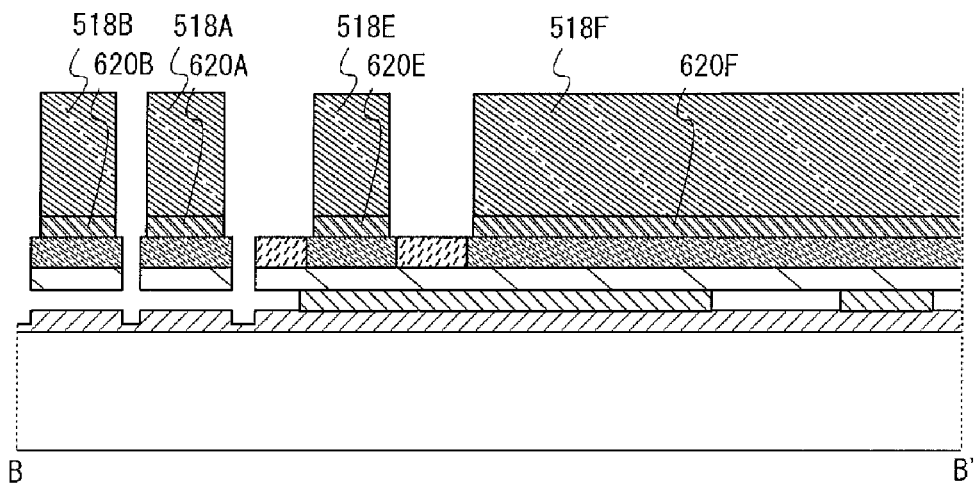
Figure 19C:
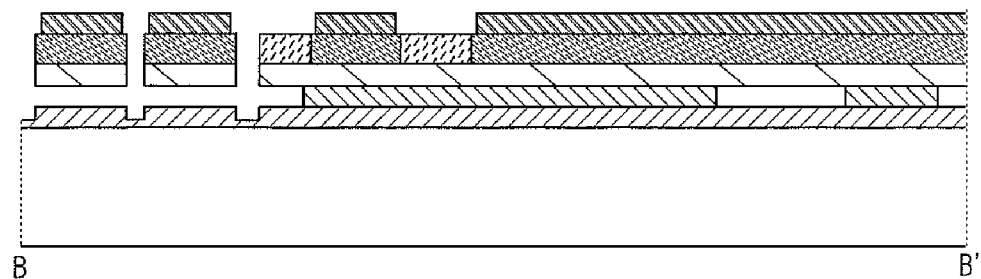
Figure 22A:
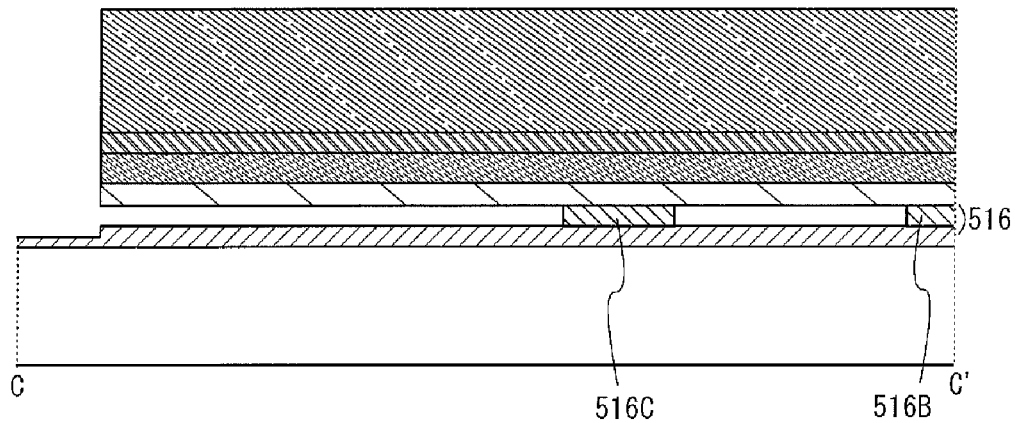
FIGS. 22A to 22C illustrate an example of a method for manufacturing a thin film transistor and a display device.
Figure 22B:
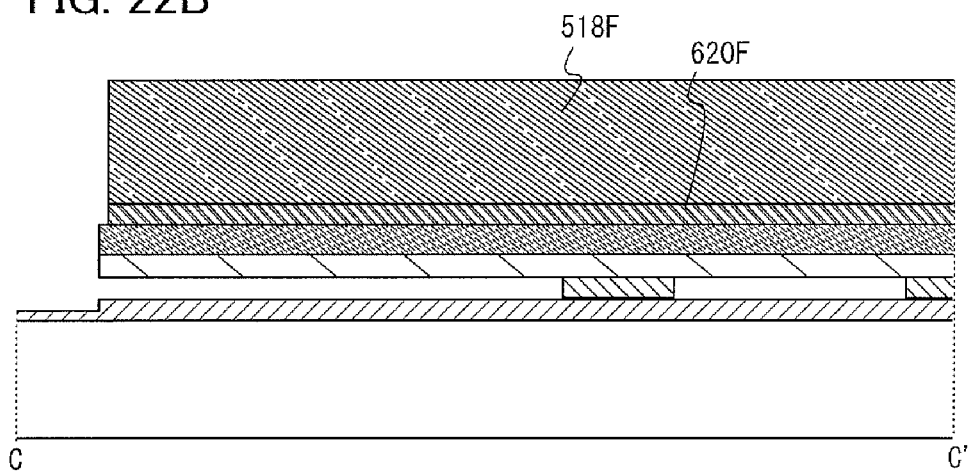
Figure 22C:
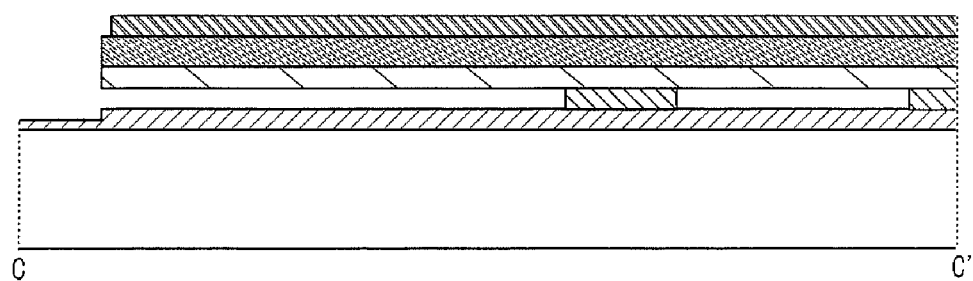

In Embodiment 3, the process described using FIGS. 16B, 19B, and 22B is called the "third etching."

The source and drain electrode layers 620 is any one of the source electrode of the thin film transistor, the drain electrode of the thin film transistor, the source wiring, the power supply line, the other electrode of the capacitor, or the electrode which connects the thin film transistor to the one electrode of the light-emitting element, or the like.

The source and drain electrode layers 620A mean the source wiring 18, the one electrode of the source electrode or the drain electrode of the first transistor 11, or the like.

The source and drain electrode layers 620B mean an electrode included in the first power supply line 17 or the like.

The source and drain electrode layers 620C mean the other electrode of the source electrode or the drain electrode of the first transistor 11, the electrode which connects the first thin film transistor 11 to the pixel electrode, or the like.

The source and drain electrode layers 620D mean the second power supply line 19, the one electrode of the source electrode or the drain electrode of the second transistor 12, or the like.

The source and drain electrode layers 620E mean the one electrode of the source electrode or the drain electrode of the third transistor 13.

The source and drain electrode layers 620F mean the other electrode of the capacitor 14, the other electrode of the source electrode or the drain electrode of the second transistor 12, the other electrode of the source electrode or the drain electrode of the third transistor 13, the electrode which is connected to the one electrode of the light-emitting element, or the like.

The third resist mask 518A overlaps the source and drain electrode layers 620A.

The third resist mask 518B overlaps the source and drain electrode layers 620B.

The third resist mask 518C overlaps the source and drain electrode layers 620C.

The third resist mask 518D overlaps the source and drain electrode layers 620D.

The third resist mask 518E overlaps the source and drain electrode layers 620E.

The third resist mask 518F overlaps the source and drain electrode layers 620F.

For the etching of the second conductive film 310 in the thin-film stack 314, either wet etching or dry etching may be employed.

Then, the third resist mask 518 is removed to complete thin film transistors (see FIGS. 14, 16C, 19C, and 22C).

As described above, etching for patterning a thin film transistor can be performed using one photomask (multi-tone mask).

A third insulating film is formed to cover the thin film transistor which is formed in the above-described manner.

Figure 17A:
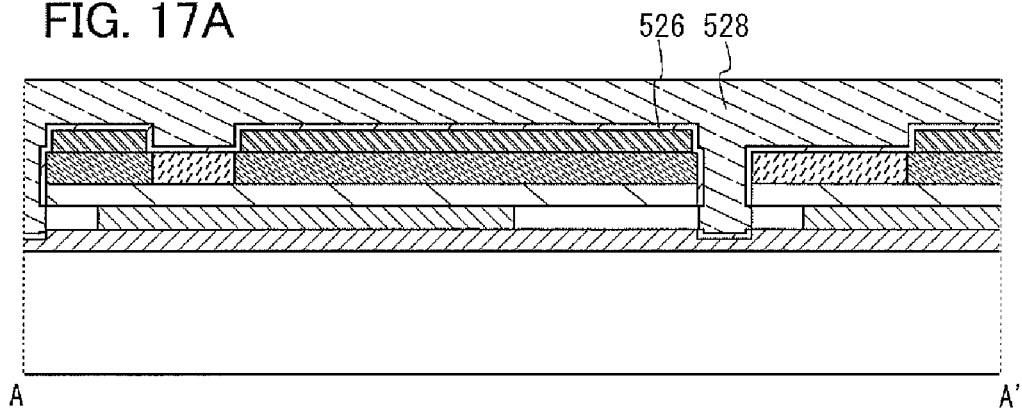
FIGS. 17A to 17C illustrate an example of a method for manufacturing a thin film transistor and a display device.
Figure 17B:
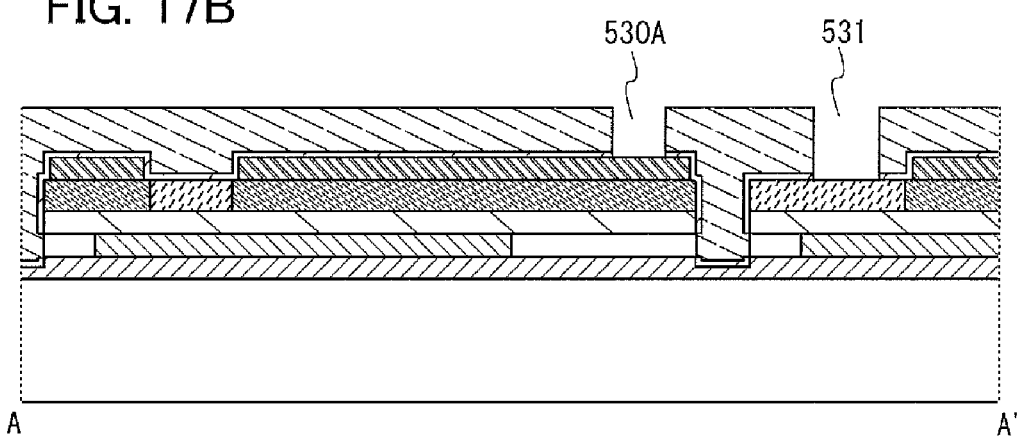
Figure 17C:
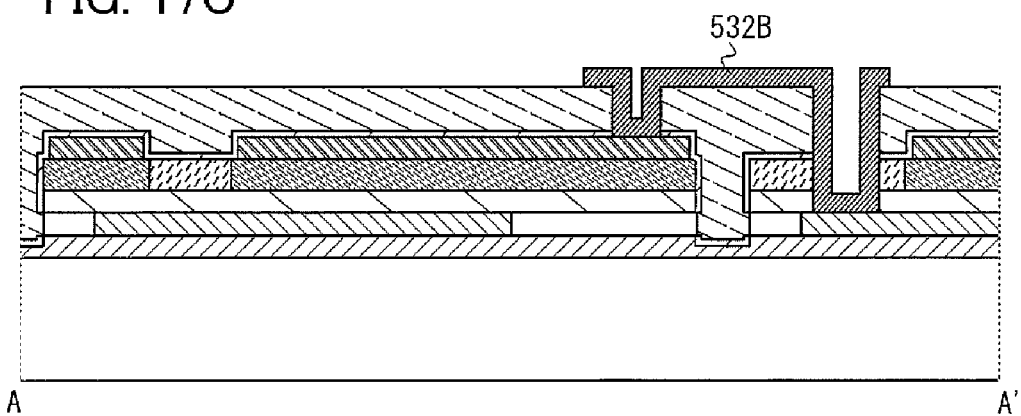
Figure 20A:
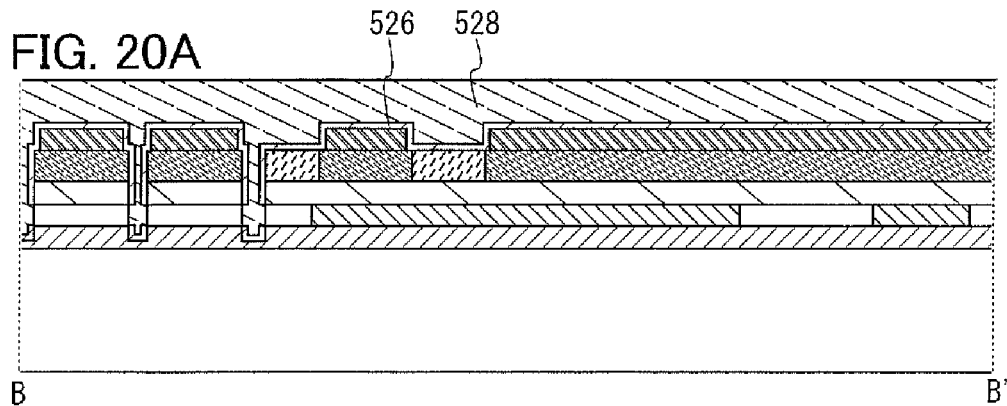
FIGS. 20A to 20C illustrate an example of a method for manufacturing a thin film transistor and a display device.
Figure 20B:
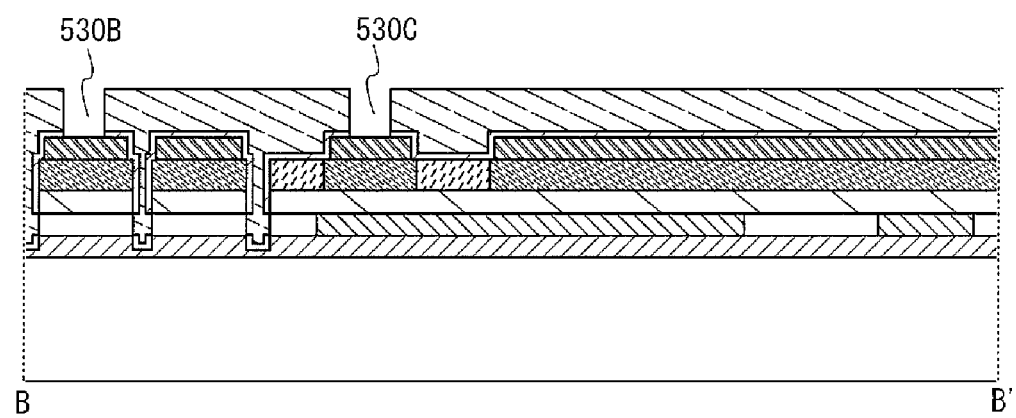
Figure 20C:
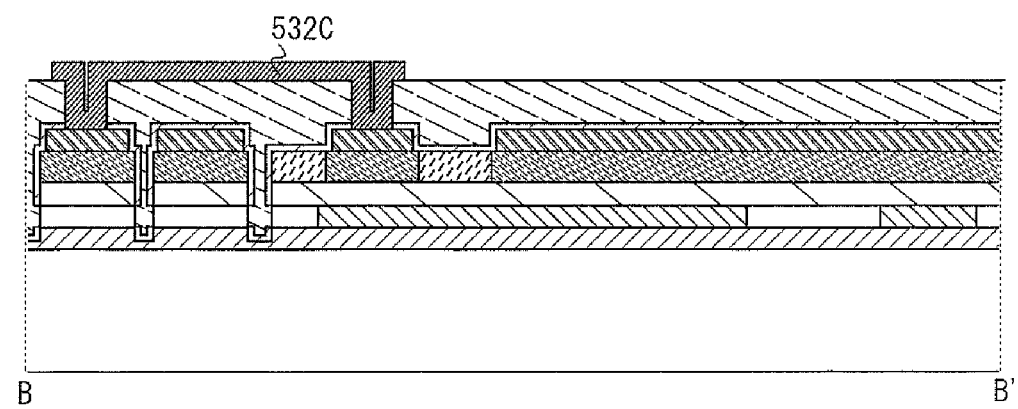
Figure 23A:
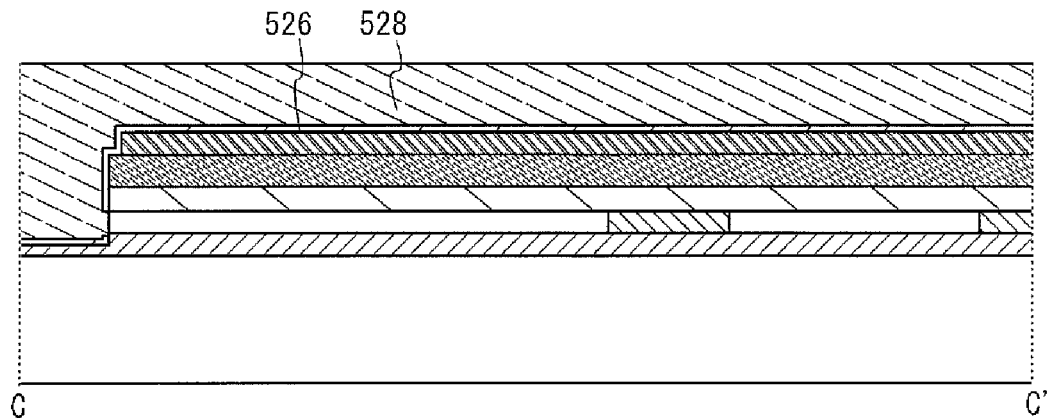
FIGS. 23A to 23C illustrate an example of a method for manufacturing a thin film transistor and a display device.
Figure 23B:
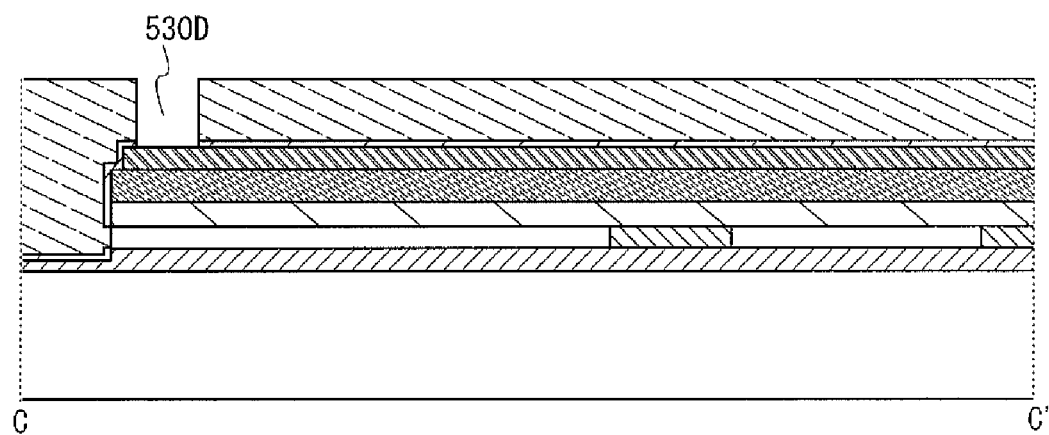
Figure 23C:
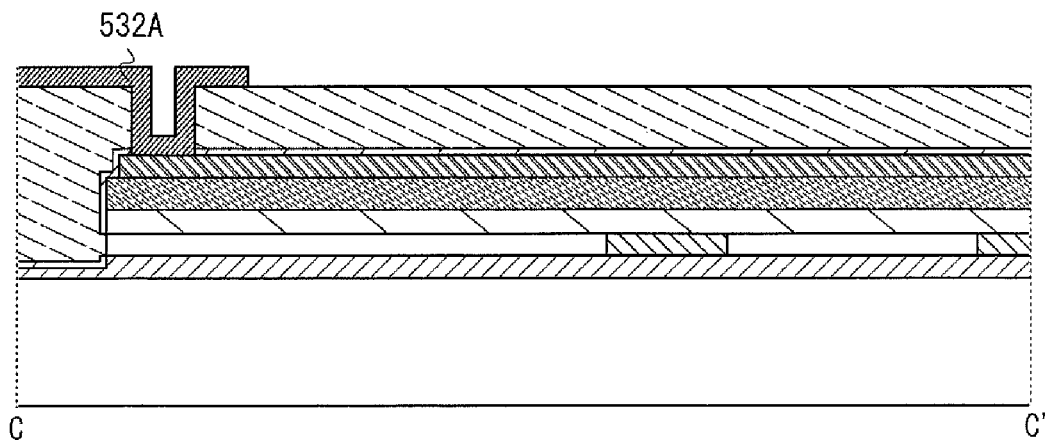

Although the third insulating film may be formed using only a first protection film 526, the third insulating film is formed using the first protection film 526 and a second protection film 528 in this embodiment (see FIGS. 17A, 20A, and 23A).

The first protection film 526 may be formed using silicon nitride containing hydrogen or silicon oxynitride containing hydrogen to prevent the semiconductor layer from being contaminated by entering and diffusion of impurities such as a metal into the semiconductor layer.

As a method for manufacturing the first protection film 526, a CVD method, a sputtering method, and the like can be given; however, the method is not limited thereto.

In the case where the first protection film 526 is formed to have a thickness which is far smaller than the thickness of the gate electrode layer 516 by a CVD method or the like, the first protection film 526 is less formed or is not formed near the cavity on the side surface of the gate electrode layer 516 as shown in FIGS. 17A, 20A, and 23A.

In contrast, in the case where the thickness of the first protection film 526 is sufficiently large, the first protection film 526 can be formed even near the cavity on the side surface of the gate electrode layer 516.

The second protection film 528 is formed by a method by which the surface thereof becomes roughly planar.

The surface of the second protection film 528 is made to be roughly planar, thereby, for example, preventing a first pixel electrode layer 532 (pixel electrode layers 532A to 532C) formed over the second protection film 528 from being disconnected.

Therefore, "roughly planar" in this embodiment is as planar as the above-described object can be achieved, and high planarity is not needed.

The second protection film 528 can be formed by a spin-coating method or the like using photosensitive polyimide, acrylic, epoxy resin, or the like.

The material and the forming method of the second protection film 528 are not limited thereto.

It is preferable that the second protection film 528 include a stack of the above-described protection film formed by a method by which the surface thereof becomes roughly planar and a protection film which covers that protection film and prevents entering and release of moisture.

In particular, when the second protection film is formed using an organic compound, it is preferable to stack a protection film which prevents entering and release of moisture.

This protection film which prevents entering and release of moisture provided can prevent deterioration of a light-emitting element which is formed later, as compared to the case where this protection film is not provided.

Specifically, the protection film which prevents entering and release of moisture is preferably formed using silicon nitride, silicon oxynitride, aluminum oxynitride, aluminum nitride, or the like.

As a method for forming the protection film, a sputtering method is preferably used.

Next, a first opening 530 (openings 530A to 530D) and a second opening 531 are formed in the third insulating film (see FIGS. 14, 17B, 20B, and 23B).

The first opening 530 is formed so as to reach at least a surface of the source and drain electrode layers.

The second opening 530 is formed so as to reach at least a surface of the gate electrode layer.

The method for forming the first opening 530 and the second opening 531 is not limited to any particular method and may be selected as appropriate depending on the diameter of the first opening 530 or the like.

For example, the first opening 530 and the second opening 531 can be formed by dry etching using a photolithography method.

Although the structure in which the portion of the cavity is provided under the first opening 530 is described in Embodiment 3, it is preferable that the supporting portion formed using the gate electrode layer (not shown) be provided under the first opening 530 in view of mechanical balance, yield, reliability, and the like.

Further, in the step for forming the second opening 531, part of the semiconductor layer between the source and drain electrode layers 620A and the source and drain electrode layers 620D may be removed to cut the semiconductor layer.

Part of the semiconductor layer between the source and drain electrode layers 620A and the source and drain electrode layers 620E may be removed to cut the semiconductor layer (see FIG. 14).

The first opening 530 is formed so as to reach the source and drain electrode layers 620; as shown in FIG. 14, a plurality of first openings 530 are provided at appropriate portions.

The first opening 530A is provided over the source and drain electrode layers 620C; the first opening 530B is provided over the source and drain electrode layers 620B; and the first opening portion 530C is provided over the source and drain electrode layers 620E.

The second opening 531 is provided so as to reach the gate electrode layer 516.

That is, the second opening 531 is provided by removing not only the third insulating film but also appropriate portions of the second insulating film 215 and the single crystal semiconductor layer 520.

Note that one photomask is used when the openings are formed by a photolithography method.

Next, the first pixel electrode layer 532 (532A to 532C) is formed over the third insulating film (see FIGS. 14, 17C, 20C, and 23C).

The first pixel electrode layer 532 is formed so as to be connected to the source and drain electrode layers 620 and the gate electrode layer 516 through the first opening 530 and the second opening 531, respectively.

Specifically, the first pixel electrode layer 532A is formed so as to be connected to the source and drain electrode layers 620F through the first opening 530D.

The first pixel electrode layer 532B is formed so as to be connected to the source and drain electrode layers 620C through the first opening 530A and to the gate electrode layer 516B through the second opening 531.

The first pixel electrode layer 532C is formed so as to be connected to the source and drain electrode layers 620E through the first opening 530C and to the source and drain electrode layers 620B through the first opening 530B.

Note that the first pixel electrode layer 532 may be a single layer or a stacked-layer film including a plurality of films.

One photomask is used when the first pixel electrode layer 532 is formed by a photolithography method.

Since an n-channel thin film transistor is included in the pixel, the first pixel electrode layer 532 is preferably formed using a material that functions as a cathode.

As the material that functions as a cathode, a material having a low work function such as Ca, Al, MgAg, or AlLi can be given.

Next, a bank is formed over the third insulating film and a side surface (an end portion) of the first pixel electrode layer 532A (not shown).

The bank has an opening such that the first pixel electrode layer 532A is exposed through the opening.

It is preferable that the bank is not formed in a region which is connected to a flexible printed circuit (FPC) described later.

Therefore, it is preferable that the bank be formed selectively using a sputtering mask.

The bank is formed using an organic resin film, an inorganic insulating film, or organic polysiloxane.

when the bank is formed using an organic resin film, it is preferable that the bank include a stack in which a protection film which prevents entering and release of moisture from the organic resin film is stacked, in order to prevent deterioration of a light-emitting element which is formed later.

Specifically, the first layer may be formed using polyimide, polyamide, polyimide amide, acrylic, or benzocyclobutene, and silicon nitride, silicon oxynitride, aluminum oxynitride, or aluminum nitride may be deposited thereon.

In particular, it is preferable that the protection film be formed using a photosensitive material as follows: an opening is formed over the first pixel electrode layer 532A such that a sidewall of the opening slopes with continuous curvature; and the protection film which prevents entering and release of moisture is formed so as to have a sloping surface to cover the top and side surfaces of the opening.

Next, an EL layer is formed so as to be in contact with the first pixel electrode layer 532A in the opening of the bank (not shown).

The EL layer may be a single layer or a stacked-layer film in which a plurality of layers is stacked. The EL layer includes at least a light-emitting layer.

Note that the EL layer be selectively formed by a printing method, an inkjet method, or the like.

These methods enable separate formation of EL layers using a projection/depression due to a thin film transistor (a projection/depression due to a source wiring), so that accuracy of forming the EL layer is improved.

That is, the accuracy of forming the EL layer can be improved and the efficiency of manufacturing a light-emitting device can be improved without employing a special structure.

Then, a second pixel electrode layer is formed using a material that functions as an anode, to cover the EL layer (not shown).

The second pixel electrode layer corresponds to the common electrode 20 shown in FIG. 9.

The second pixel electrode layer can be formed using a conductive material having a light-transmitting property.

Here, as examples of the conductive material having a light-transmitting property, indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, or the like can be given.

The film of the conductive material having a light-transmitting property may be formed by a sputtering method, a CVD method, or the like; the forming method thereof is not limited thereto.

In addition, the second pixel electrode layer may be a single layer or a stacked-layer film including a plurality of films.

In this embodiment, ITO is used as the second pixel electrode layer.

The first pixel electrode layer 532A, the EL layer, and the second pixel electrode layer overlap each other in the opening of the bank, thereby forming a light-emitting element.

The light-emitting element corresponds to the light-emitting element 15 shown in FIG. 9.

Then, it is preferable to form a third protection film over the second pixel electrode layer and the bank so that oxygen, hydrogen, moisture, carbon dioxide, and the like do not enter the light-emitting element (not shown).

As a material of the third protection film, a material having a function of preventing entering and release of moisture is selected like the second protection film 528.

The third protection film is preferably formed using silicon nitride, silicon oxynitride, aluminum oxynitride, aluminum nitride, or the like.

Further, it is provided that a silicon nitride film, a DLC film, or the like be provided to cover the third protection film.

Then, it is preferable to further perform packaging (sealing) with a protection film (e.g., a bonding film or an ultraviolet curing resin film) or a covering material in order to prevent exposure to the outside air.

It is preferable to use a material which has high airtightness and causes degasification as little as possible to provide the protection film or the covering material.

Through the above-described process, components up to the light-emitting element of a top-emission EL display device can be formed.

However, the EL display device that is one embodiment of the present invention is not limited to the above description: the present invention can be applied to a bottom-emission EL display device or a dual-emission EL display device.

In the bottom-emission structure or the dual-emission structure, a conductive material having a light-transmitting property may be used as the first pixel electrode layer 532.

Note that the materials and the formation methods of the protection films and the like described above are not limited to those described above as long as light emission of the EL layer is not interfered and deterioration and the like can be prevented.

In the top-emission structure, the first pixel electrode layer 532A may be formed so as to cover the region where the pixel circuit is formed.

In that case, first, the conductive layers corresponding to the first pixel electrode layer 532B and the first pixel electrode layer 532C may be formed; an insulating film having the first opening 530D may be formed over the conductive layers; and the first pixel electrode layer 532A may be formed so as to be connected to the source and drain electrode layers 620F through the first opening 530D.

The first pixel electrode layer 532A which is formed so as to cover the region where the pixel circuit is formed can enlarge the light-emitting region, so that images can be displayed with higher definition.

Note that although an organic EL element is described as a light-emitting element in Embodiment 3, an inorganic EL element can alternatively be used as a light-emitting element.

Here, a terminal connection portion of the active matrix substrate manufactured through the above-described process is described with reference to FIG. 24, FIG. 25, and FIGS. 26A to 26C.

Figure 24:
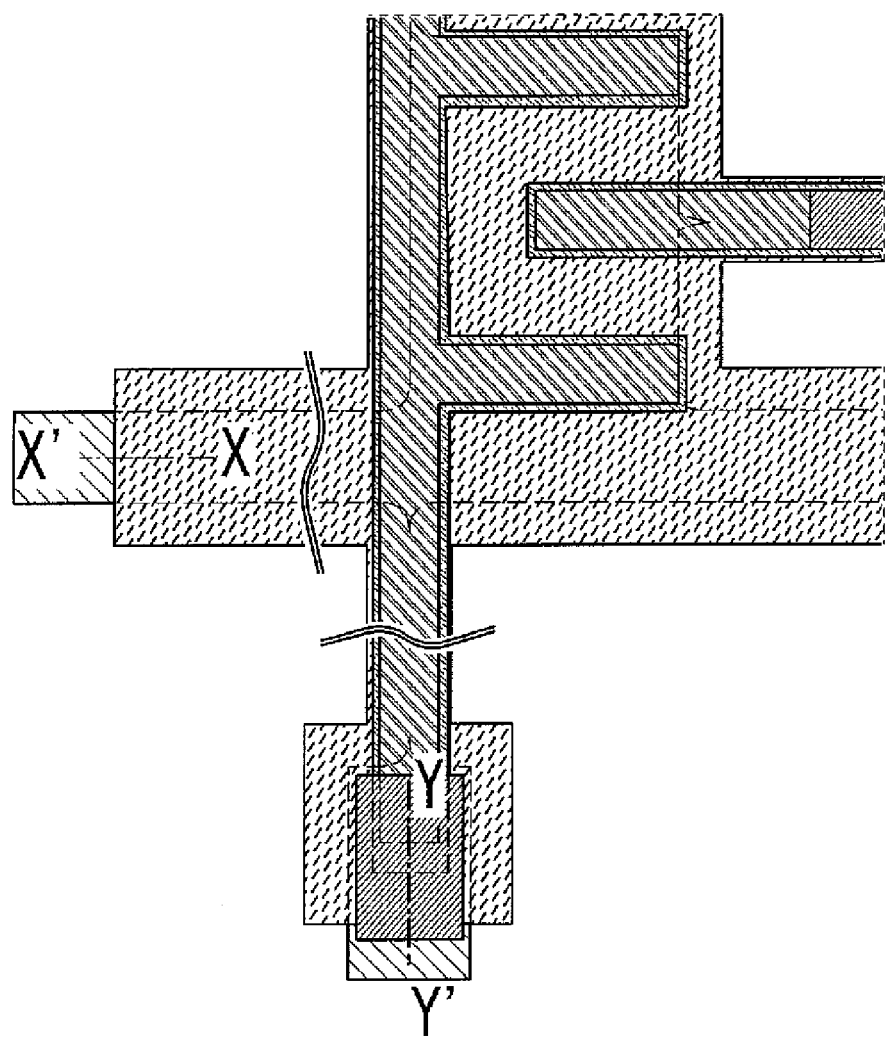
FIG. 24 illustrates a connection portion of an active matrix substrate.

FIG. 24 is a top view and FIG. 25 and FIGS. 26A to 26C are cross-sectional views of a terminal connection portion on the gate wiring side and a terminal connection portion on the source wiring side of the active matrix substrate manufactured though the above-described process.

FIG. 24 is a top view of the gate wiring and the source wiring extended from the pixel portion, in the terminal connection portion on the gate wiring side and the terminal connection portion on the source wiring side.

The same as the description on the source wiring 18 can be applied to the first power supply line 17 and the second power supply line 19.

Figure 25:
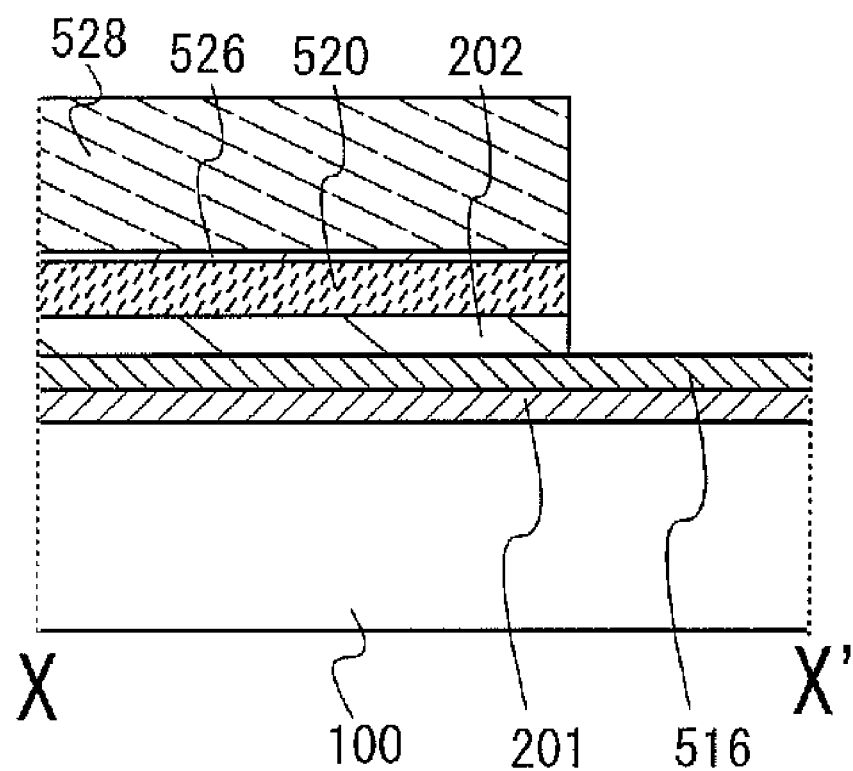
FIG. 25 illustrates a connection portion of an active matrix substrate.

FIG. 25 is a cross-sectional view along line X-X' in FIG. 24.

That is, FIG. 25 is a cross-sectional view of the terminal connection portion on the gate wiring side.

In FIG. 25, the gate electrode layer 516 is exposed. A terminal portion is connected in the exposed region of the gate electrode layer 516.

Figure 26A:
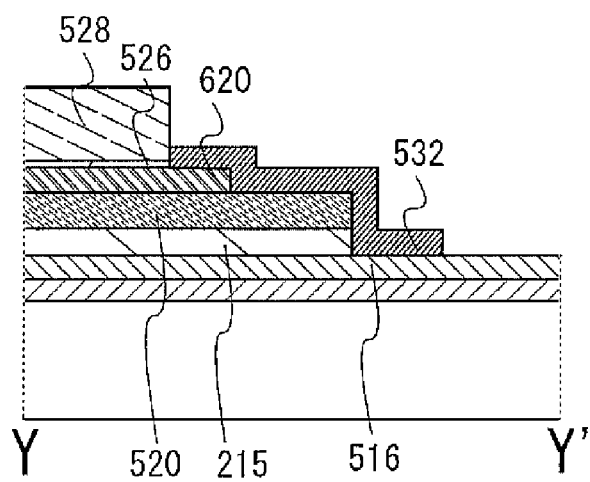
FIGS. 26A to 26C each illustrate a connection portion of an active matrix substrate.
Figure 26B:
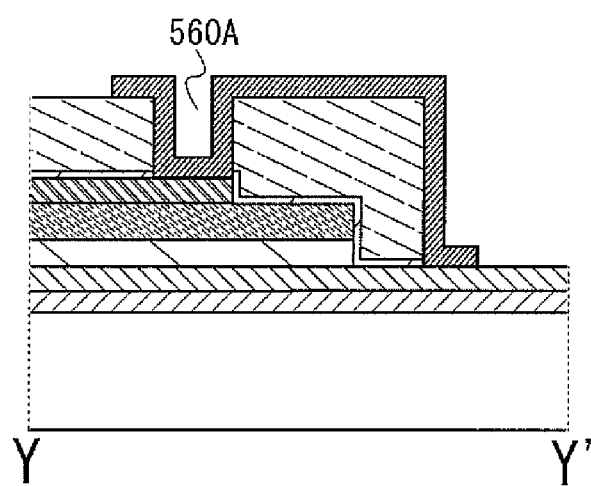
Figure 26C:
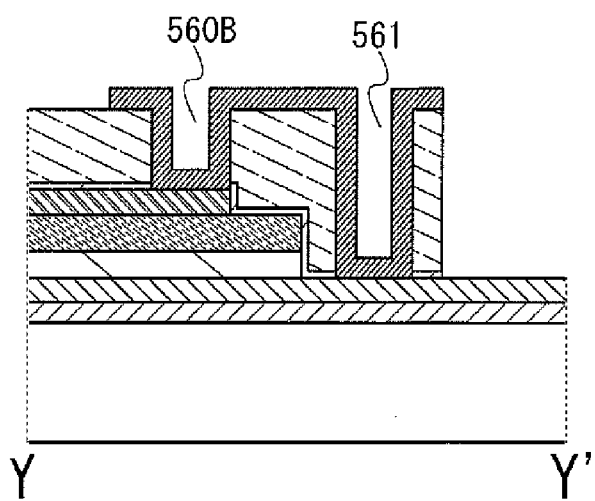

FIGS. 26A to 26C are examples of the cross-sectional view along line Y-Y' in FIG. 24.

That is, FIGS. 26A to 26C are examples of the cross-sectional view in the terminal connection portion on the source wiring side.

In the line Y-Y' in FIGS. 26A to 26C, the gate electrode layer 516 is connected to the source and drain electrode layers 620 via the first pixel electrode layer 532 (the same layer as at least the first pixel electrode layer 532B or the first pixel electrode layer 532C).

FIGS. 26A to 26C illustrate various connection modes between the gate electrode layer 516 and the source and drain electrode layers 620.

For the terminal connection portion of the EL display device of the present invention, any of the modes shown in FIGS. 26A to 26C, or another connection mode may be employed.

By connecting the source and drain electrode layers 620 to the gate electrode layer 516, the height of the terminal connection portion can be made to be uniform or substantially uniform.

The number of openings is not limited to any of the number of openings shown in FIGS. 26A to 26C.

As well as one opening is provided for one terminal, a plurality of openings may be provided for one terminal.

By providing a plurality of openings for one terminal, electrical connection can be achieved by one opening even in the case where another opening among the plurality of openings is not formed appropriately due to, for example, poor etching step for forming the opening.

Furthermore, even in the case where all of the plurality of openings is formed appropriately, the contact area can be large, so that the contact resistance can be reduced, which is preferable.

In FIG. 26A, end portions of the first protection film 526 and the second protection film 528 are removed by etching or the like to expose the gate electrode layer 516 and the source and drain electrode layers 620, and the first pixel electrode layer 532 (the same layer as at least the first pixel electrode layer 532B or the first pixel electrode layer 532C) is formed in the exposed region, thereby achieving electrical connection.

The top view illustrated in FIG. 24 corresponds to the top view of FIG. 26A.

The region where the gate electrode layer 516 and the source and drain electrode layers 620 are exposed can be formed at the same time as the formation of the first opening 530 and the second opening 531.

In FIG. 26B, a third opening 560A is formed in the first protection film 526 and the second protection film 528 and end portions of the first protection film 526 and the second protection film 528 are removed by etching or the like to expose the gate electrode layer 516 and the source and drain electrode layers 620, and the first pixel electrode layer 532 (the same layer as at least the first pixel electrode layer 532B or the first pixel electrode layer 532C) is formed in the exposed region, thereby achieving electrical connection.

The third opening 560A and the region where the gate electrode layer 516 is exposed can be formed at the same time as the formation of the first opening 530 and the second opening 531.

In FIG. 26C, a third opening 560B and a fourth opening 561 are formed in the first protection film 526 and the second protection film 528 to expose the gate electrode layer 516 and the source and drain electrode layers 620, and the first pixel electrode layer 532 (the same layer as at least the first pixel electrode layer 532B or the first pixel electrode layer 532C) is formed in the exposed region, thereby achieving electrical connection.

Like FIGS. 26A and 26B, end portions of the first protection film 526 and the second protection film 528 are removed by etching or the like; however, these regions are used as the terminal connection portion.

The third opening 560B and the fourth opening 561 and the region where the gate electrode layer 516 is exposed can be formed at the same time as the formation of the first opening 530 and the second opening 531.

Note that the third opening 560B is formed so as to reach the source and drain electrode layers 620 like the first opening 530, and the fourth opening 561 is formed so as to reach the gate electrode layer 516 like the second opening 531.

An input terminal in the terminal portion (the region where the gate electrode layer 516 is exposed in FIGS. 26A to 26C) is connected to a flexible printed circuit (FPC).

The FPC has a wiring formed using a conductive film over an organic resin film of polyimide or the like, and is connected to the input terminal through an anisotropic conductive paste (hereinafter referred to as an ACP).

The ACP generally contains a paste that functions as an adhesive and particles that are plated with gold or the like, have diameters of several tens of micrometers to several hundreds of micrometers, and have conductive surfaces.

The particles contained in the paste are in contact with a conductive layer over the input terminal and a conductive layer over a terminal connected to the wiring included in the FPC, thereby realizing electric connection.

Through the above-described manner, an EL display device can be manufactured.

As described above, the number of photomasks used in forming a thin film transistor is reduced, which can lead to a large reduction of the number of steps for manufacturing a thin film transistor and/or an EL display device.

Further, the number of steps for manufacturing a thin film transistor can be significantly reduced without involving a complicated step such as backside light exposure, resist reflow, or lift-off.

Therefore, the number of steps for manufacturing an EL display device can be significantly reduced without involving a complicated step.

Moreover, the number of steps for manufacturing a thin film transistor can be significantly reduced while maintaining electrical characteristics of the thin film transistor.

According to the method for manufacturing a thin film transistor described above, patterning in manufacturing a thin film transistor can be completed with the use of one photomask, so that misalignment of a photomask for etching can be prevented.

Furthermore, the manufacturing cost of an EL display device can be significantly reduced.

Further, since a single crystal semiconductor layer is used as a semiconductor film of a thin film transistor, an EL display device with high integration, high operation speed, and low power consumption can be manufactured.

Embodiment 4

In Embodiment 4, an example of a method for manufacturing a thin film transistor and a method for manufacturing an EL display device in which the thin film transistors are arranged in matrix, which is different from Embodiment 3, will be described with reference to FIGS. 27 to 32, FIGS. 33A to 33C, FIGS. 34A to 34C, FIGS. 35A to 35C, FIGS. 36A to 36C, FIGS. 37A to 37C, FIGS. 38A to 38C, FIGS. 39A to 39C, FIGS. 40A to 40C, FIGS. 41A to 41C, FIGS. 42A to 42C, FIGS. 43A to 43C, and FIGS. 44A to 44C.

Specifically, an example of a method for manufacturing an EL display device in which thin film transistors having different conductivity types is described below.

Although an EL display device is taken as an example in Embodiment 4, a pixel structure described in Embodiment 4 may be applied to a liquid crystal display device. An EL display device using a pixel structure which is different from that described in Embodiment 4 or a liquid crystal display device using a pixel structure which is different from that described in Embodiment 4 may be manufactured.

Detailed description is made in Embodiments 1 to 3, and detailed description is partly omitted in the case where the same manufacturing step or a similar manufacturing step as/to the above one.

Figure 27:
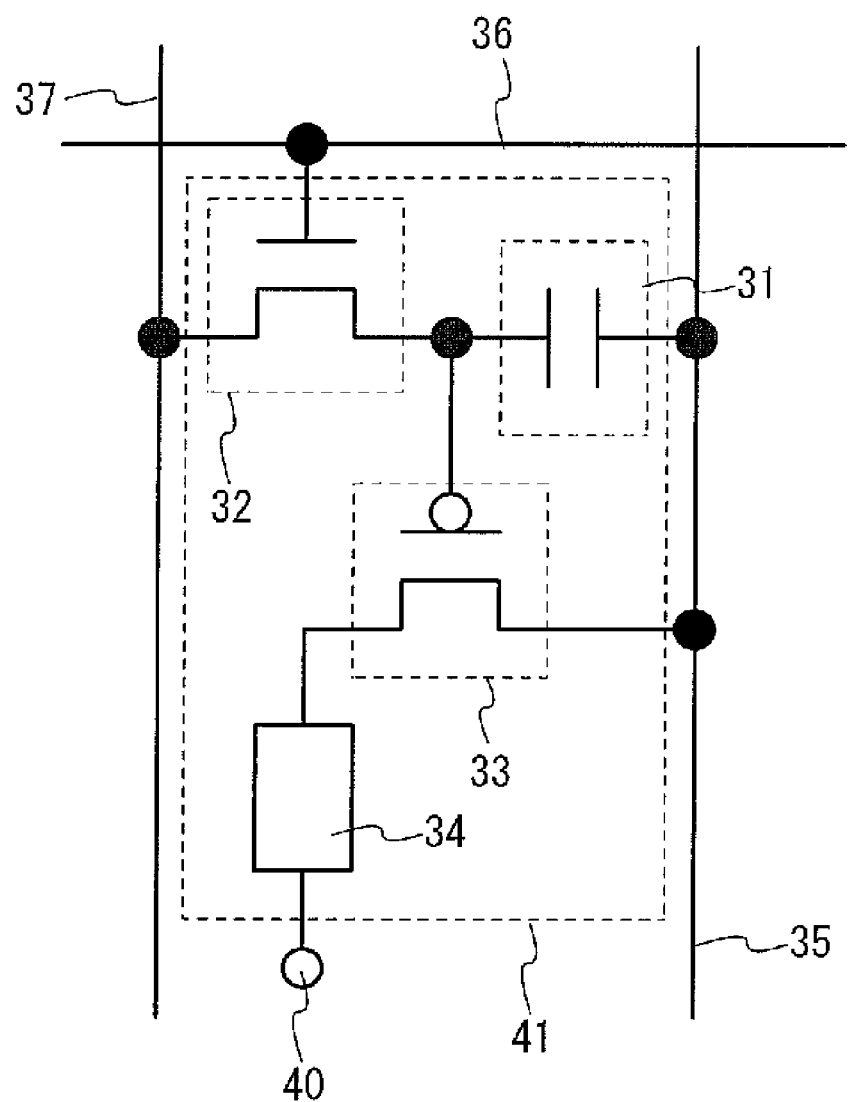
FIG. 27 illustrates an example of a method for manufacturing a thin film transistor and a display device.

In Embodiment 4, an example of a simple pixel circuit is illustrated in FIG. 27, and a method for manufacturing an EL display device to which this pixel circuit is applied is described below.

However, the pixel circuit of the EL display device is not limited to the structure illustrated in FIG. 27.

In the pixel structure of the EL display device shown in FIG. 27, a pixel 41 includes a first transistor 32, a second transistor 33, a capacitor 31, and a light-emitting element 34.

The first transistor is an n-channel transistor and the second transistor is a p-channel transistor in Embodiment 4. However, the first transistor may be a p-channel transistor and the second transistor may be an n-channel transistor.

A gate electrode of the first transistor 32 is connected to a gate wiring 36; one of a source electrode and a drain electrode (a first electrode) of the first transistor 32 is connected to a source wiring 37; and the other of the source electrode and the drain electrode (a second electrode) of the first transistor 32 is connected to a gate electrode of the second transistor 33 and to one electrode (a first electrode) of the capacitor 31.

The other electrode (a second electrode) of the capacitor 31 is connected to a power supply line 35. One of a source electrode and a drain electrode (a first electrode) of the second transistor 33 is connected to one electrode (a first electrode) of the light-emitting element 34, and the other of the source electrode and the drain electrode (a second electrode) of the second transistor 33 is connected to a power supply line 35.

The other electrode (a second electrode) of the light-emitting element 34 is connected to a common electrode 40.

An operation of the pixel 41 is described below.

When the first transistor 32 is turned on by a signal from the gate wiring 36, respective potentials of the first electrode of the second transistor 33 and the second electrode of the capacitor 31 come to be equal to a potential ($V_{37}$) of the source wiring 37.

When the potential of the gate electrode of the second transistor 33 is lower than the potential of the power supply line 35 by the threshold value of the second transistor 33, the second transistor 33 is turned on.

At this time, current flows in accordance with the difference of the gate electrode of the second transistor 33 with respect to the power supply line 35, i.e., the voltage between the gate electrode and the source electrode of the second transistor 33, by which the light-emitting element 34 emits light.

Therefore, in the case where the second transistor 33 is operated in the linear region, the potential ($V_{37}$) of the source wiring 37 is changed (for example, to be binarized), so that ON/OFF of the second transistor 33 can be controlled.

That is, whether a voltage is applied to an EL layer of the light-emitting element 34 or not can be controlled.

In the case where the second transistor 33 is operated in the saturation region, the potential ($V_{37}$) of the source wiring 37 is changed to control the gate-source voltage of the second transistor 33, so that the level of current which flows through the light-emitting element 34 can be controlled.

In the above-described manner, in the case where the second transistor 33 is operated in the linear region, whether a voltage is applied to the light-emitting element 34 or not can be controlled, thereby controlling light emission/non-light emission of the light-emitting element 34.

The above-described driving method can be used for, for example, digital time grayscale driving. According to the digital time grayscale driving, one frame is divided into a plurality of subframes and light emission/non-light emission of the light-emitting element 34 is controlled for each subframe.

In addition, in the case of operating the second transistor 33 in the saturation region, the level of current which flows through the light-emitting element 34 can be controlled, so that luminance of the light-emitting element 34 can be adjusted.

Next, an EL display device to which the pixel circuit illustrated in FIG. 27 is applied and a manufacturing method thereof is described below.

Figure 32:
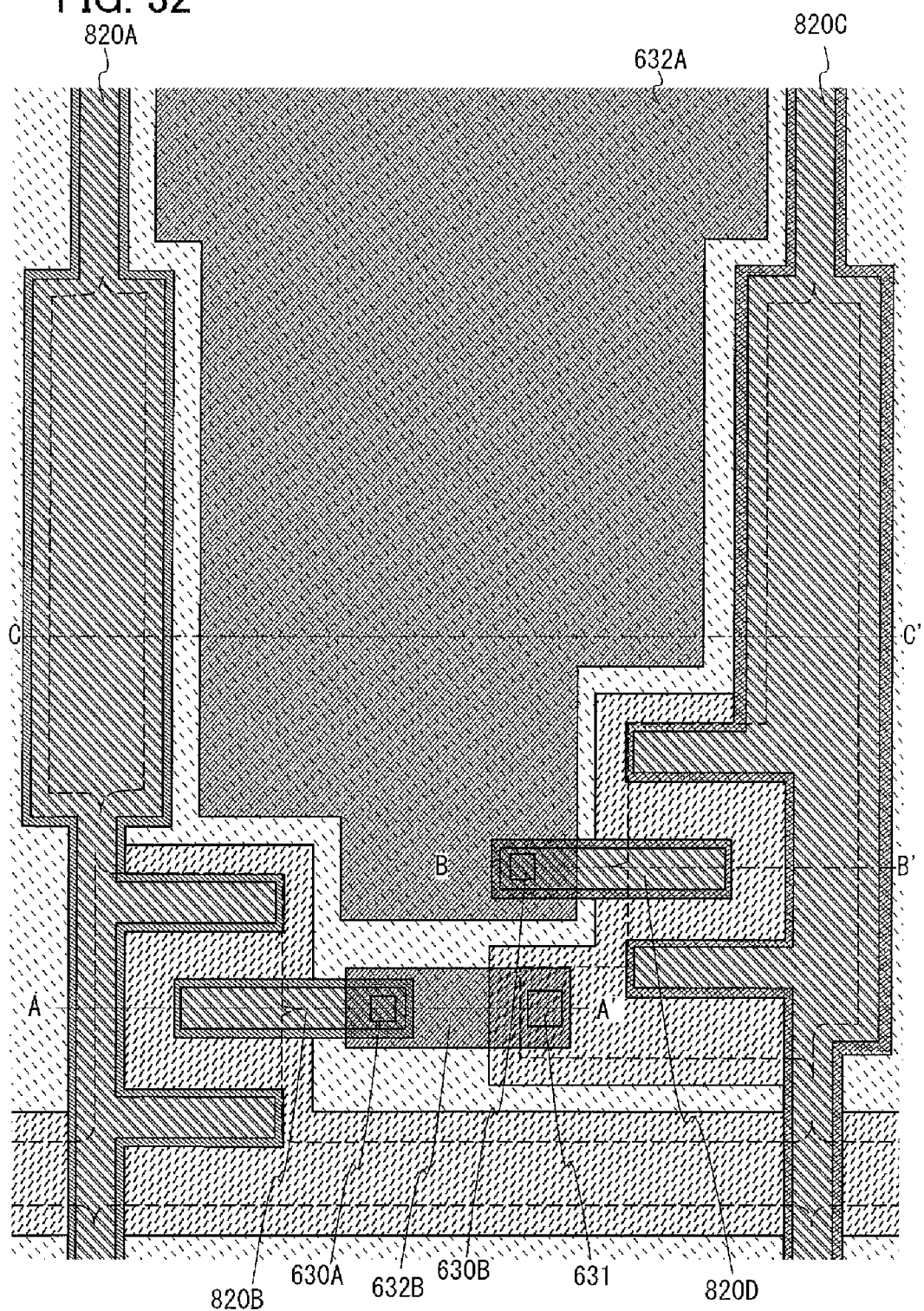
FIG. 32 illustrates an example of a method for manufacturing a thin film transistor and a display device.
Figure 33A:
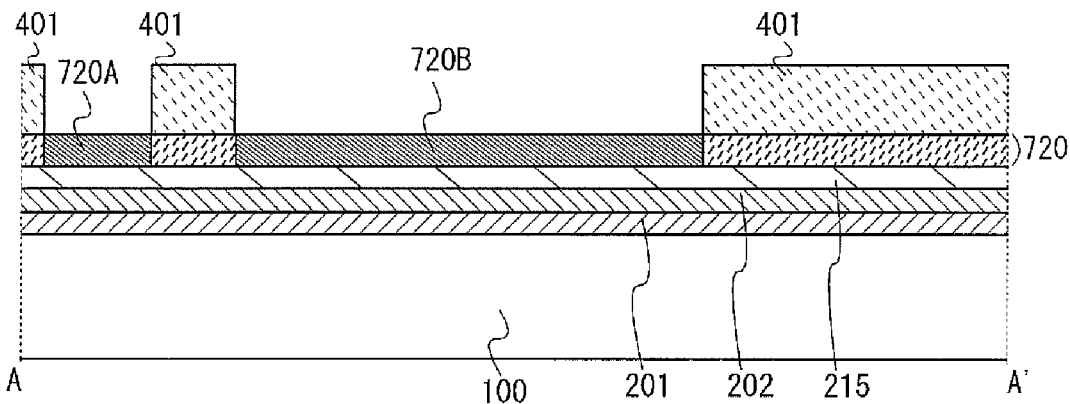
FIGS. 33A to 33C illustrate an example of a method for manufacturing a thin film transistor and a display device.
Figure 33B:
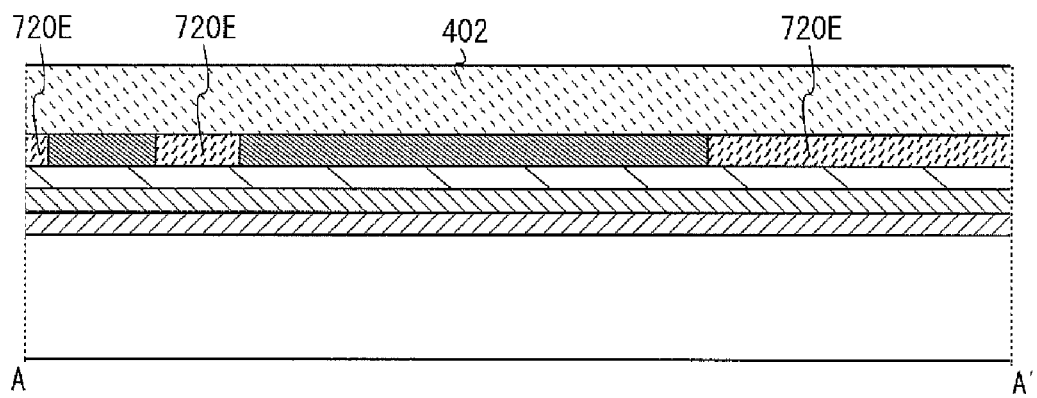
Figure 33C:
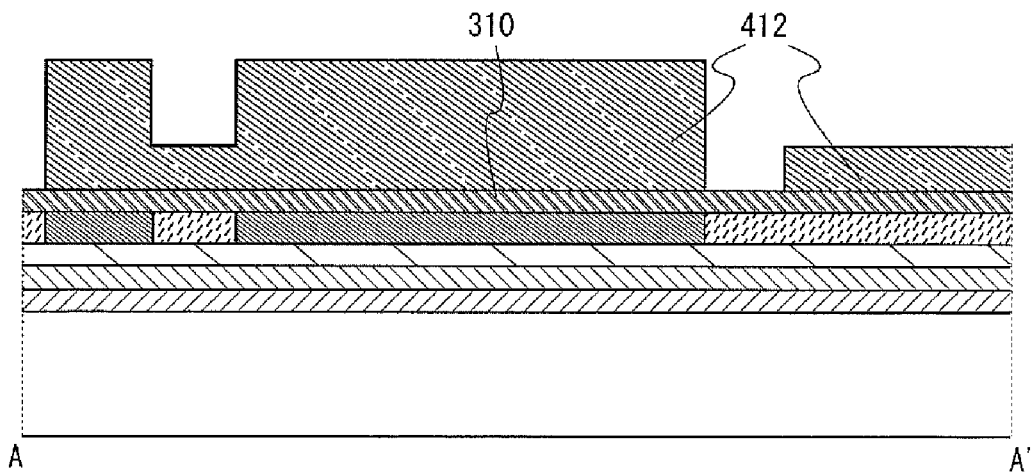

FIGS. 28 to 32 are top views of thin film transistors according to this embodiment. FIG. 32 is a completion view at the time of finishing the formation of a pixel electrode.

FIGS. 33A to 33C, FIGS. 34A to 34C, FIGS. 35A to 35C, and FIGS. 36A to 36C are cross-sectional views along line A-A' in FIGS. 28 to 32.

Figure 28:
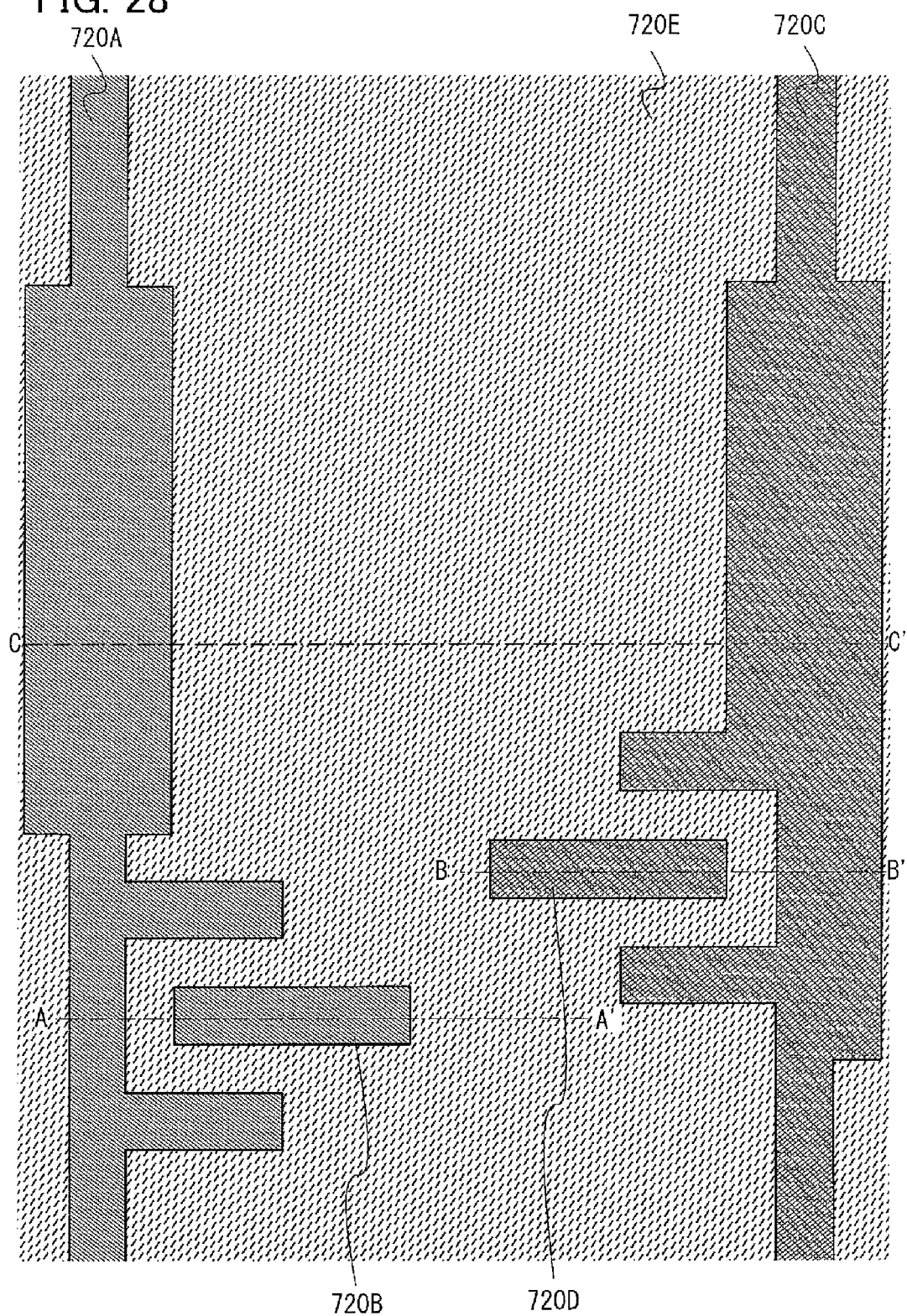
FIG. 28 illustrates an example of a method for manufacturing a thin film transistor and a display device.
Figure 29:
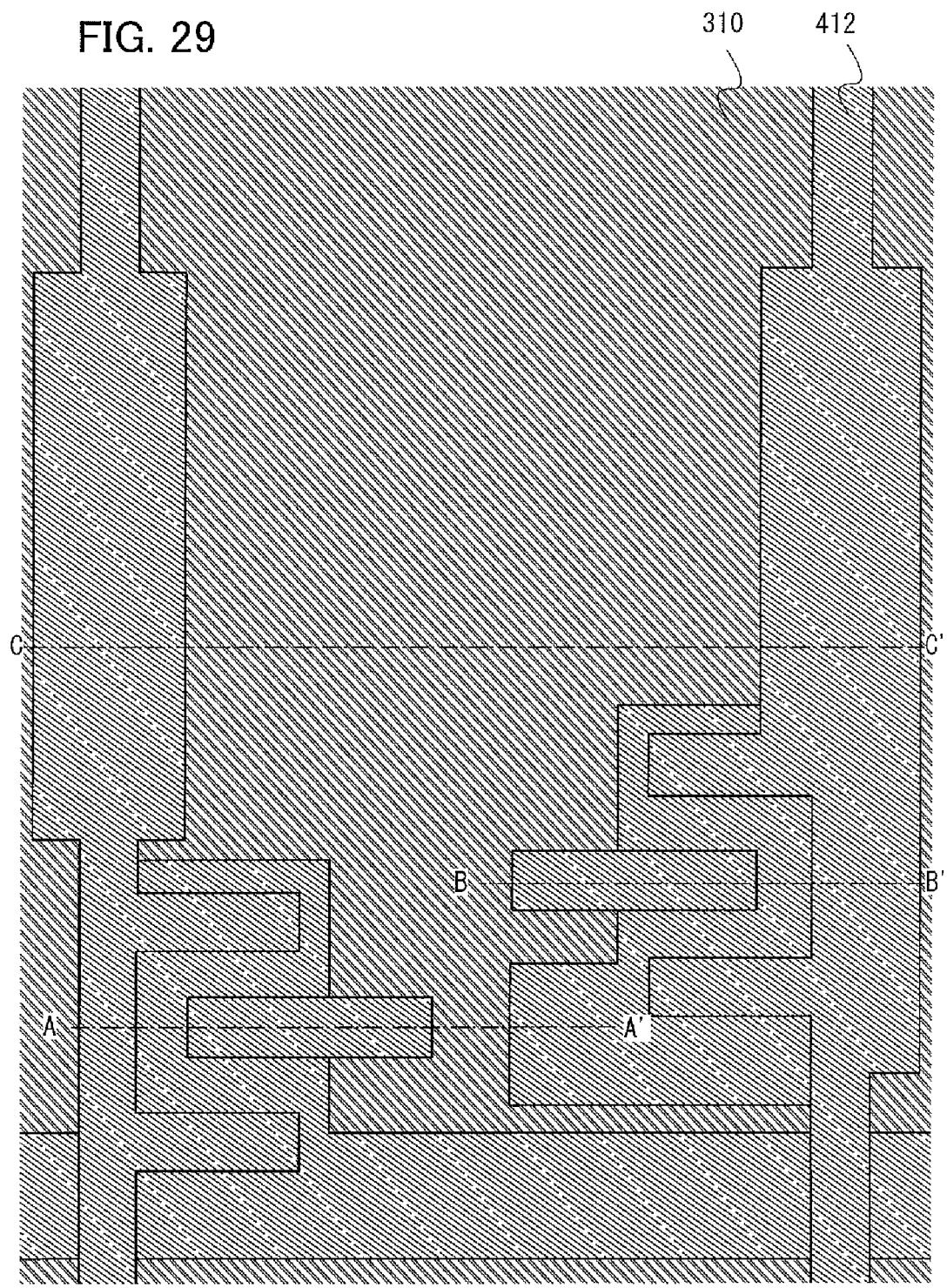
FIG. 29 illustrates an example of a method for manufacturing a thin film transistor and a display device.

FIGS. 37A to 37C, FIGS. 38A to 38C, FIGS. 39A to 39C, and FIGS. 40A to 40C are cross-sectional views along line B-B' in FIGS. 28 and 29.

FIGS. 41A to 41C, FIGS. 42A to 42C, FIGS. 43A to 43C, and FIGS. 44A to 44C are cross-sectional views along line C-C' in FIGS. 28 to 32.

First, as in Embodiment 1, a second insulating film 201, a first conductive film 202, a first insulating film 215, and a single crystal semiconductor layer 720 are formed over a base substrate 100.

When the stacked-layer structure of the base substrate, the first insulating film, the second insulating film, the first conductive film, and the single crystal semiconductor layer is formed, selection from the manufacturing method and the materials described in Embodiments 1 to 3 may be made appropriately. Therefore, detailed description thereof is omitted in Embodiment 4.

Next, a first resist mask 401 is selectively provided over the single crystal semiconductor layer 720, and an impurity element which imparts one conductivity type is added to the single crystal semiconductor layer 720 with the first resist mask 401 as a mask.

By adding the impurity element with the first resist mask 401 as a mask, impurity regions 720A and 720B are formed in regions of the single crystal semiconductor layer 720, which do not overlap the first resist mask 401 (see FIGS. 28, 33A, 37A, and 41A).

In this embodiment, as the impurity element which imparts one conductivity type, phosphorus (P) is added to the single crystal semiconductor layer 720 so as to be contained at a concentration of $1\times10^{15}/cm^3$ to $1\times10^{19}/cm^3$.

Next, the first resist mask 401 is removed, and a second resist mask 402 is formed selectively over the single crystal semiconductor layer 720 in which the impurity regions 720A and 720B are formed.

With the second resist mask 402 as a mask, an impurity element which imparts a conductivity type which is different from that of the impurity element added for forming the impurity regions 720A and 720B is added to the single crystal semiconductor layer 720.

By adding the impurity element with the second resist mask 402 as a mask, impurity regions 720C and 720D are formed in regions of the single crystal semiconductor layer 720, which do not overlap the second resist mask 402.

Further, a region 720E in which an impurity element is not added is formed in a region of the single crystal semiconductor layer 720, which is covered with the first resist mask 401 and then the second resist mask 402 (see FIGS. 28, 33B, 37B, and 41A).

In this embodiment, as the impurity element which imparts one conductivity type, boron (B) is added to the single crystal semiconductor layer 720 so as to be contained at a concentration of $1\times10^{19}/cm^3$ to $1\times10^{20}/cm^3$.

Note that it is preferable that the impurity element which imparts one conductivity type be added to at least regions under wirings and electrodes which are formed using a second conductive film later, of the single crystal semiconductor layer.

Next, the second resist mask 402 is removed, and a second conductive film 310 is formed over the single crystal semiconductor layer 720.

The method and material described in any of Embodiments 1 to 3 can be used to form the second conductive film 310. In this embodiment, molybdenum is used, for example.

Next, a third resist mask 412 is formed over the second conductive film 310 (see FIGS. 29, 33C, 37C, and 41C).

In this embodiment, it is preferable that the third resist mask 412 be a resist mask having a depression (a projection) like the second resist mask described in Embodiments 1 to 3.

However, the present invention is not limited thereto: a resist mask having neither a depression nor a projection may be used.

In the third resist mask 412 described in Embodiment 4, the projection is formed in each of regions which form a source and drain electrode layers, and the depression is formed in a region where the source and drain electrode layers are not formed and a part of the semiconductor layer is exposed.

The third resist mask 412 can be formed using the multi-tone mask described in Embodiment 1.

Next, a first etching is performed using the third resist mask 412. That is, the first conductive film 202, the second insulating film 215, the single crystal semiconductor layer 502, and the second conducive film 310 are etched to be patterned to form a thin-film stack 314 (see FIGS. 34A, 38A, and 42A).

At this time, it is preferable that at least a surface of the first conductive film 202 be exposed.

In Embodiment 4, this etching step is called the "first etching."

As the first etching, either dry etching or wet etching may be employed, and the same method as Embodiment 3 can be used.

Next, a second etching is performed using the third resist mask 412.

That is, the first conductive film 202 is etched to be patterned to form a gate electrode layer 716 (716A to 716C) (see FIGS. 30, 34B, 38B, and 42B).

Note that the gate electrode layer 716 forms the gate electrode of each thin film transistor, the gate wiring, the one electrode of the capacitor, and a supporting portion.

The gate electrode layer 716A means the electrode layer which forms the gate wiring and the gate electrode of the first transistor 32.

The gate electrode layer 716B means the electrode layer which forms the gate electrode of the second transistor 33 and the one electrode of the capacitor 31.

The gate electrode layer 716C means the electrode layer which forms the supporting portion. In this specification, these electrode layers are referred to as the gate electrode layer 716 as a whole.

The second etching is, like Embodiment 3, performed under such etching conditions that a side surface of the gate electrode layer 716 (716A to 716C) formed using the first conductive film 202 is provided more inside than a side surface of the thin-film stack 314.

It is necessary that the second etching is performed under the condition involving side-etching as described in Embodiment 3.

This is because the gate wiring can be patterned to be formed and elements in the pixel circuit can be connected as appropriate by the second etching accompanied with side-etching of the first conductive film 202.

Figure 30:
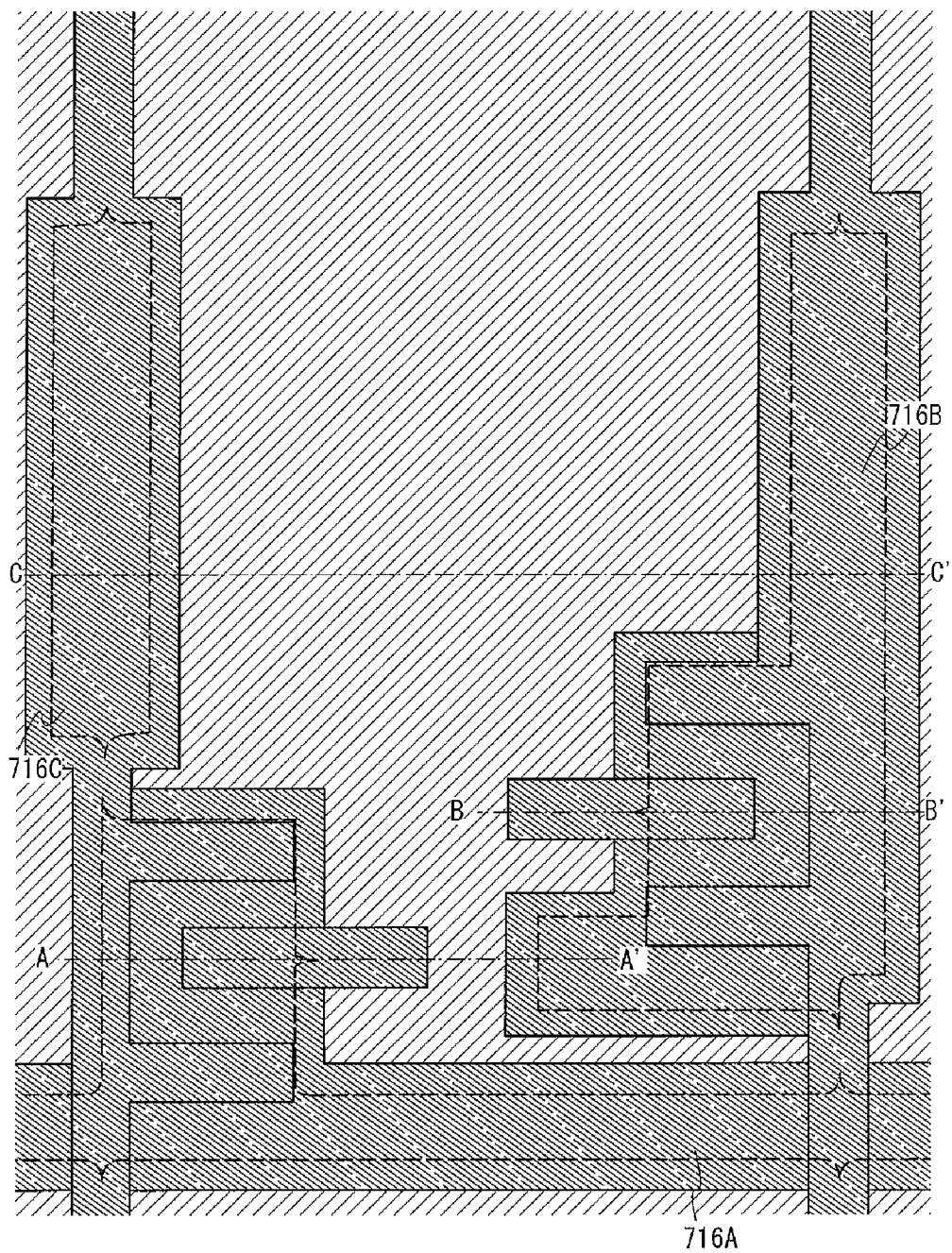
FIG. 30 illustrates an example of a method for manufacturing a thin film transistor and a display device.
Figure 31:
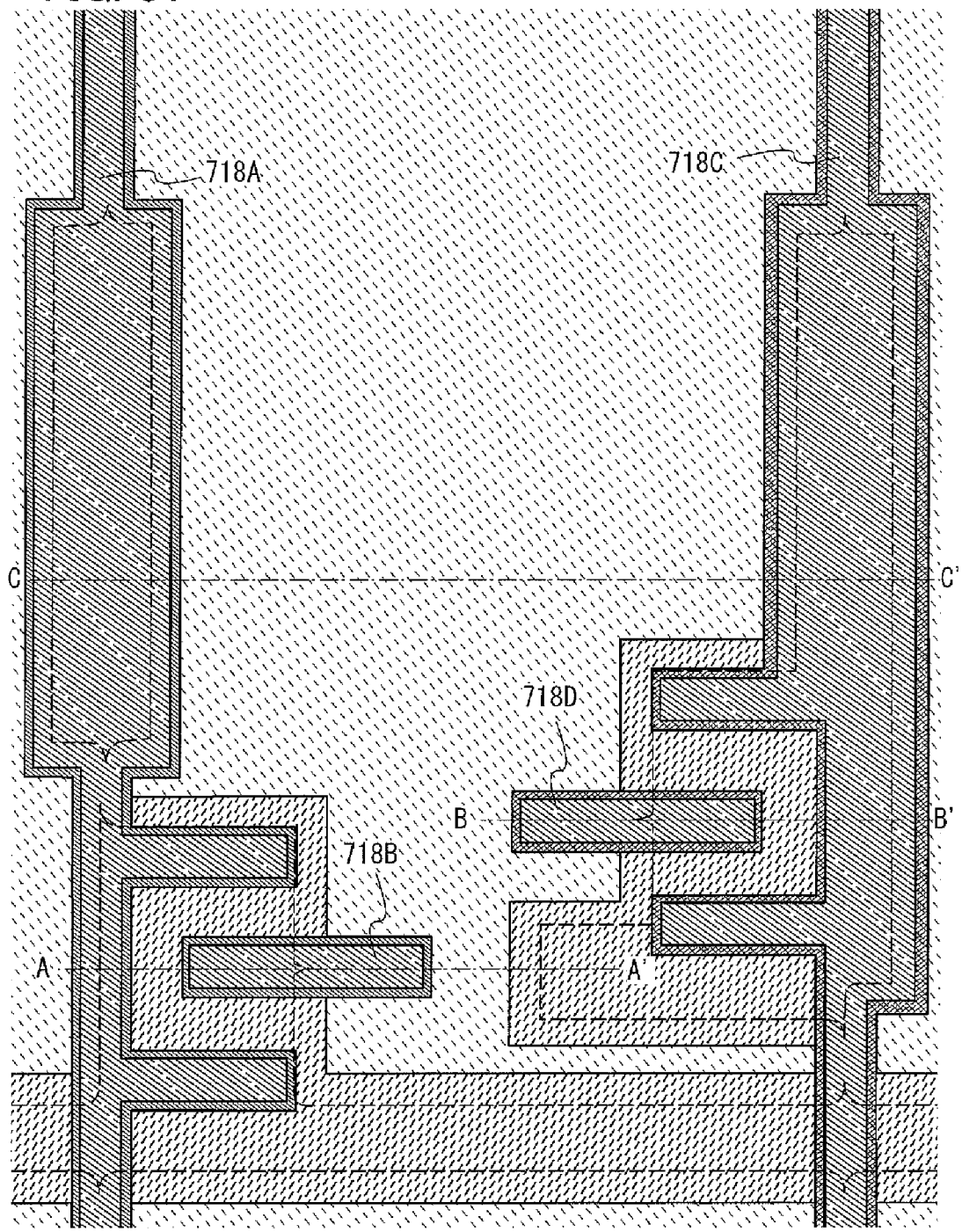
FIG. 31 illustrates an example of a method for manufacturing a thin film transistor and a display device.

The gate electrode layer 716C which is shown in FIG. 30 functions as the supporting portion which supports the thin-film stack 314.

By the existence of the supporting portion, peeling of a film such as a gate insulating film, formed over the gate electrode layer 716 can be prevented.

Furthermore, by the existence of the supporting portion, the cavity which is formed in contact with the gate electrode layer 716 by the second etching can be prevented from widening too much.

Furthermore, it is preferable to provide the supporting portion also in that the thin-film stack 314 can be prevented from being broken or damaged due to its own weight and yield is improved.

The present invention is not limited to such a mode having a supporting portion, and the supporting portion is not necessarily provided.

Next, the third resist mask 412 is made to recede, so that a part of the second conductive film 310 is exposed and a fourth resist mask 718 (718A to 718F) is formed.

A region in which the fourth resist mask 718 is formed coincides or substantially coincides with the region of the projection of the third resist mask 412.

Although the case where the third resist mask 718 is formed after the second etching is described here, the second etching may be performed after formation of the fourth resist mask 718.

In the case where a multi-tone photomask is not used in forming the third resist mask 412, another photomask may be used to form the fourth resist mask 718.

Next, the second conductive film 310 in the thin-film stack 314 is etched using the fourth resist mask 718 (718A to 718D), so that a source and drain electrode layers 820 (820A to 820D) are formed (see FIGS. 31, 32, 34C, 38C, and 42C).

As the etching conditions thereof, the conditions under which the films other than the second conductive film 310 are prevented from being unintentionally etched or corroded as much as possible are selected.

In particular, it is important that the etching is performed under the conditions that the gate electrode layer 716 is prevented from being unintentionally etched or corroded as much as possible.

Figure 34A:
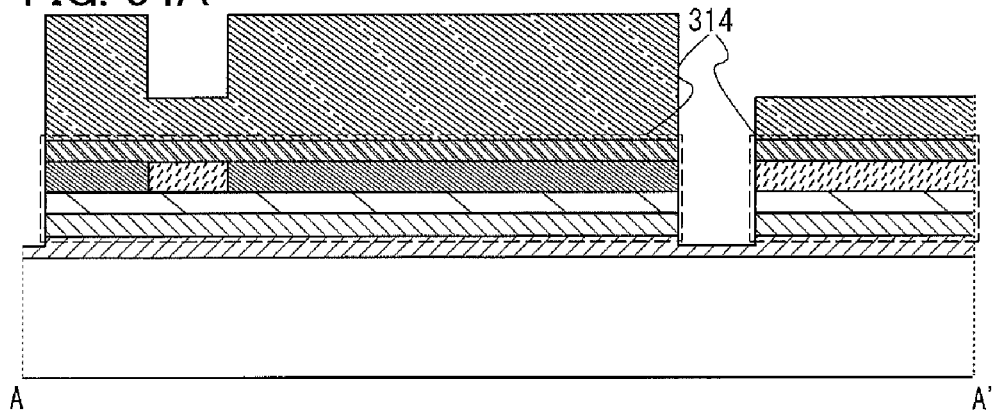
FIGS. 34A to 34C illustrate an example of a method for manufacturing a thin film transistor and a display device.
Figure 34B:
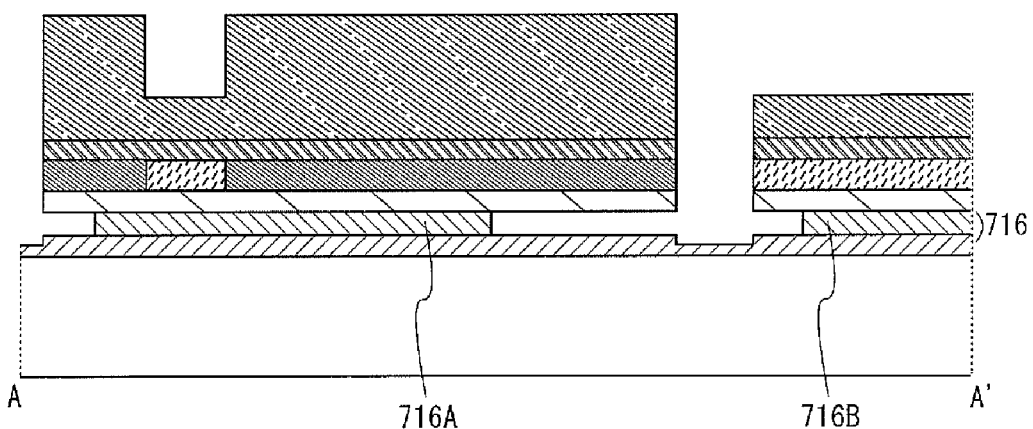
Figure 34C:
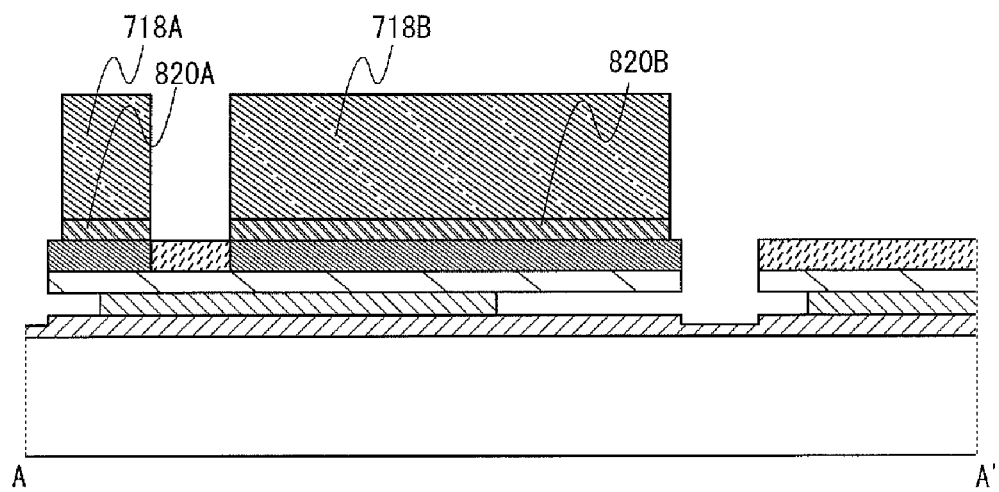
Figure 38A:
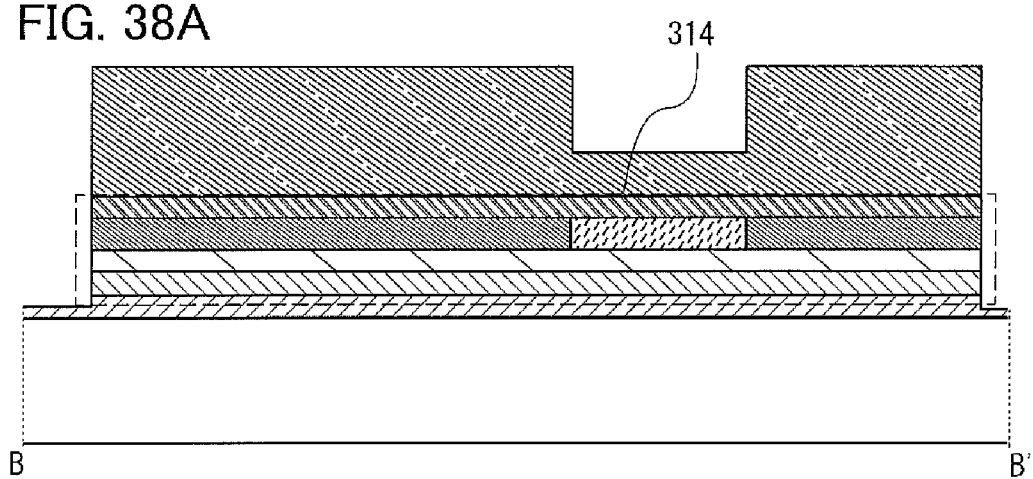
FIGS. 38A to 38C illustrate an example of a method for manufacturing a thin film transistor and a display device.
Figure 38B:
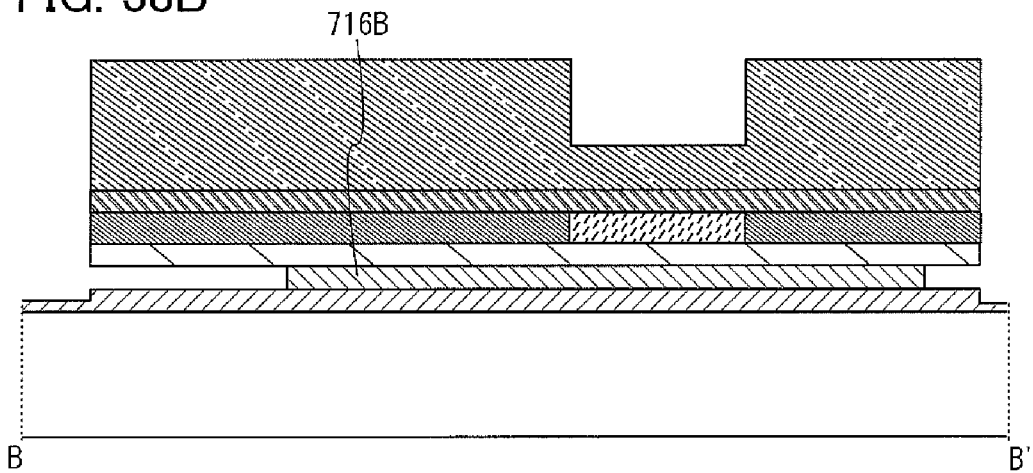
Figure 38C:
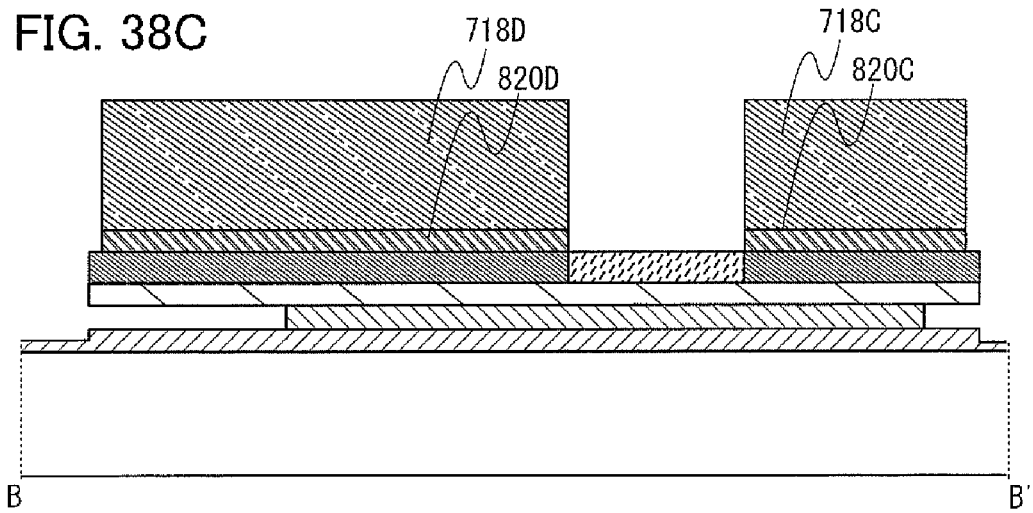
Figure 42A:
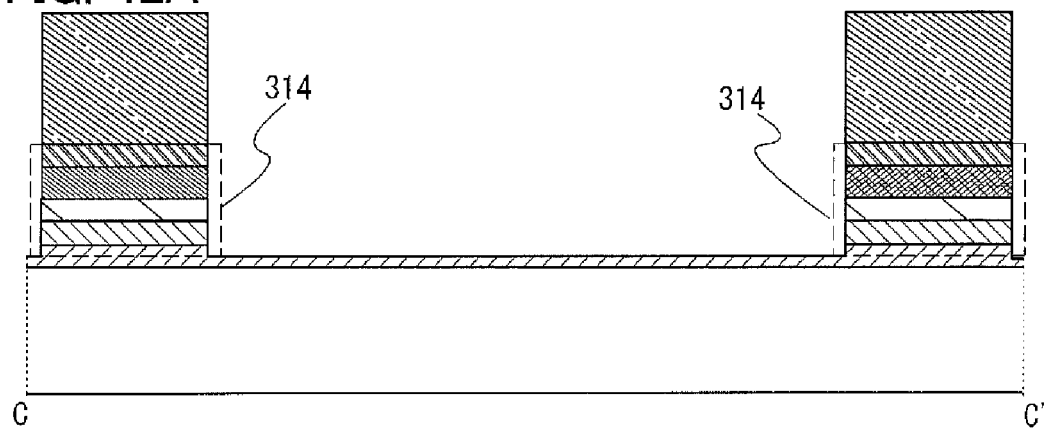
FIGS. 42A to 42C illustrate an example of a method for manufacturing a thin film transistor and a display device.
Figure 42B:
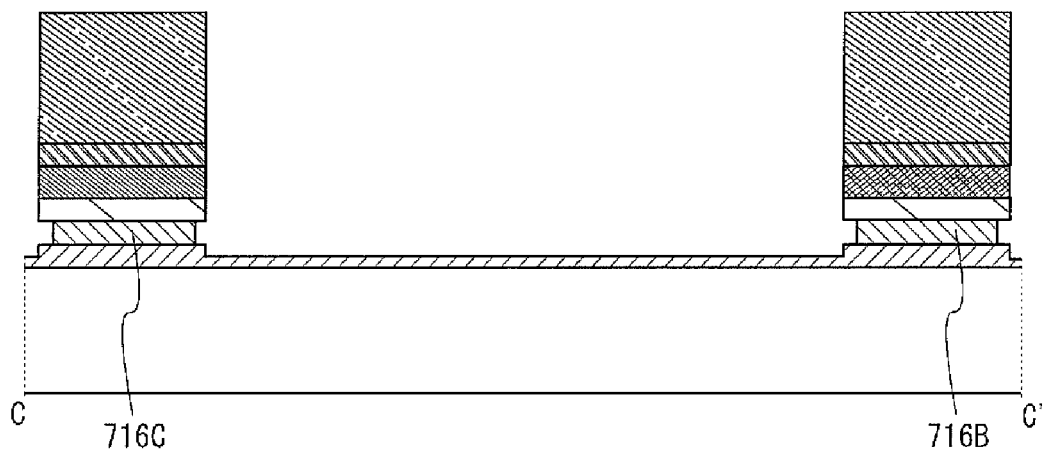
Figure 42C:
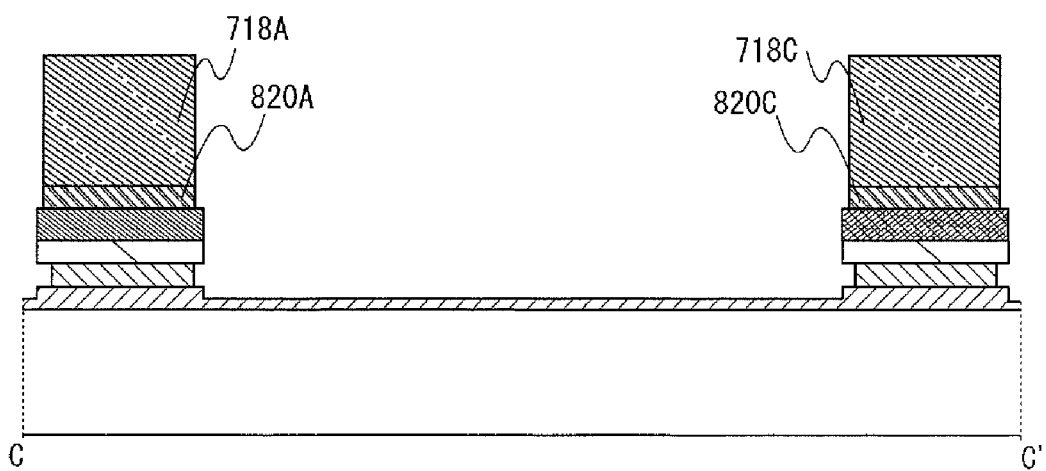

In Embodiment 4, the process described using FIGS. 34C, 38C, and 42C is called a "third etching."

The source and drain electrode layers 820 (820A to 820D) is any one of the source electrode of the thin film transistor, the drain electrode of the thin film transistor, the source wiring, the power supply line, the other electrode of the capacitor, or the electrode which connects the thin film transistor to the one electrode of the light-emitting element, or the like.

The source and drain electrode layers 820A mean the source wiring 37, the one electrode of the source electrode or the drain electrode of the first transistor 32, or the like.

The source and drain electrode layers 820B mean the other electrode of the source electrode or the drain electrode of the first transistor 32 or the like.

The source and drain electrode layers 820C mean an electrode layer of the power supply line 35, the one electrode of the source electrode or the drain electrode of the second transistor 33, the one electrode of the capacitor 31, or the like.

The source and drain electrode layers 820D mean the other electrode of the source electrode or the drain electrode of the second transistor 33, the one electrode of the light-emitting element 34, or the like.

The third resist mask 718A overlaps the source and drain electrode layers 820A.

The third resist mask 718B overlaps the source and drain electrode layers 820B.

The third resist mask 718C overlaps the source and drain electrode layers 820C.

The third resist mask 718D overlaps the source and drain electrode layers 820D.

For the etching of the second conductive film 310 in the thin-film stack 314, either wet etching or dry etching may be employed.

Then, the third resist mask 718 (718A to 718D) is removed to complete thin film transistors (see FIGS. 32, 35A, 39A, and 43A).

As described above, a thin film transistor can be manufactured using three photomasks (multi-tone masks).

A third insulating film is formed to cover the thin film transistor which is formed in the above-described manner.

Figure 35A:
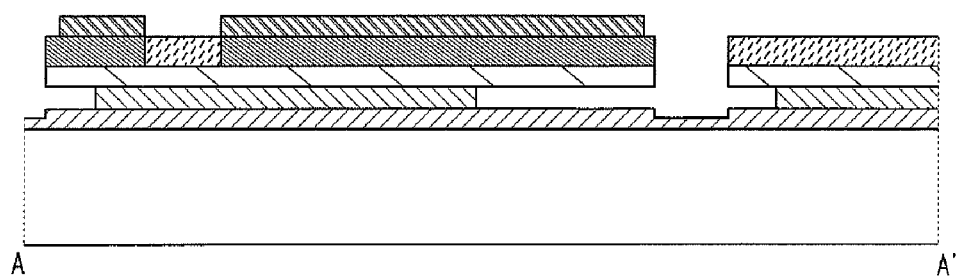
FIGS. 35A to 35C illustrate an example of a method for manufacturing a thin film transistor and a display device.
Figure 35B:
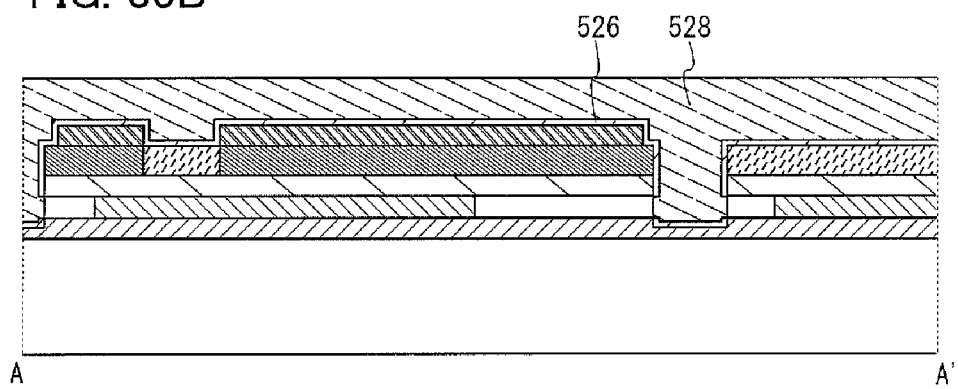
Figure 35C:
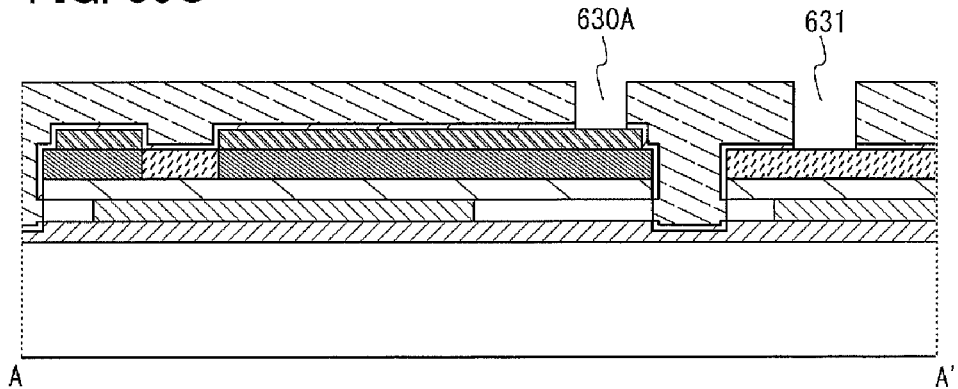
Figure 36A:
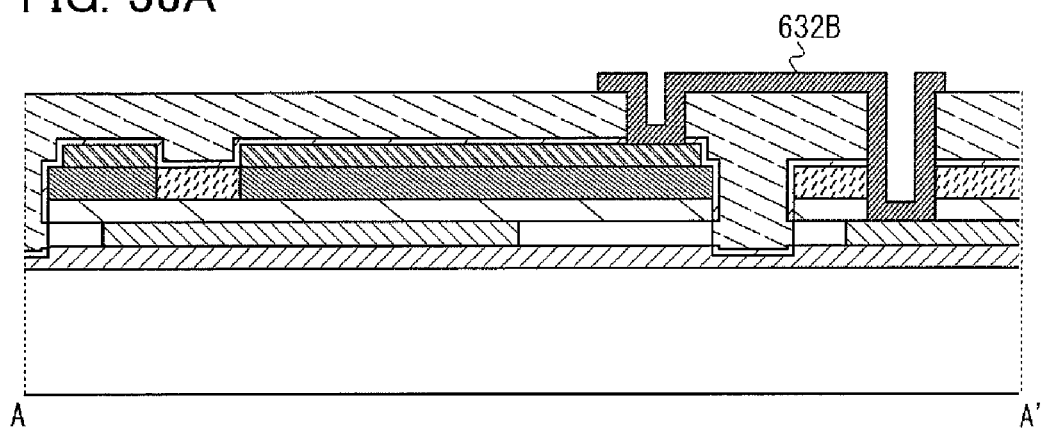
FIGS. 36A to 36C illustrate an example of a method for manufacturing a thin film transistor and a display device.
Figure 36B:
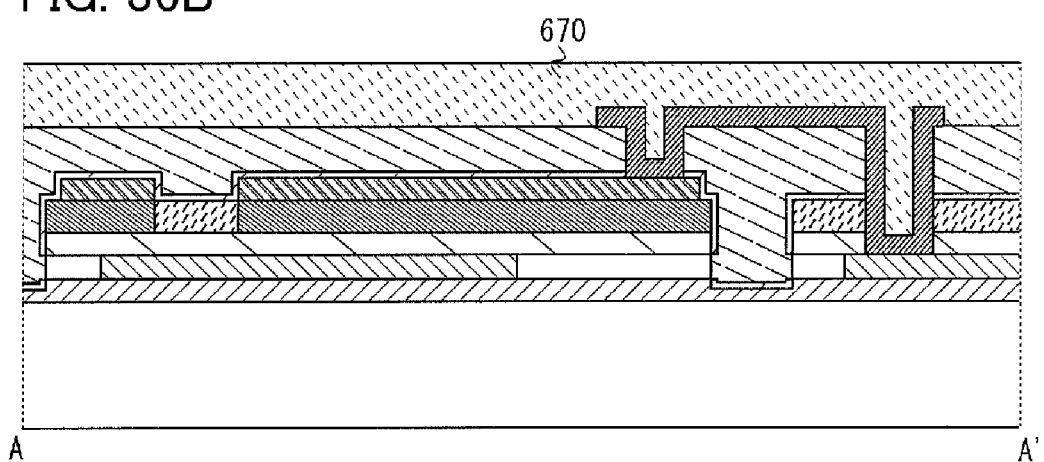
Figure 36C:
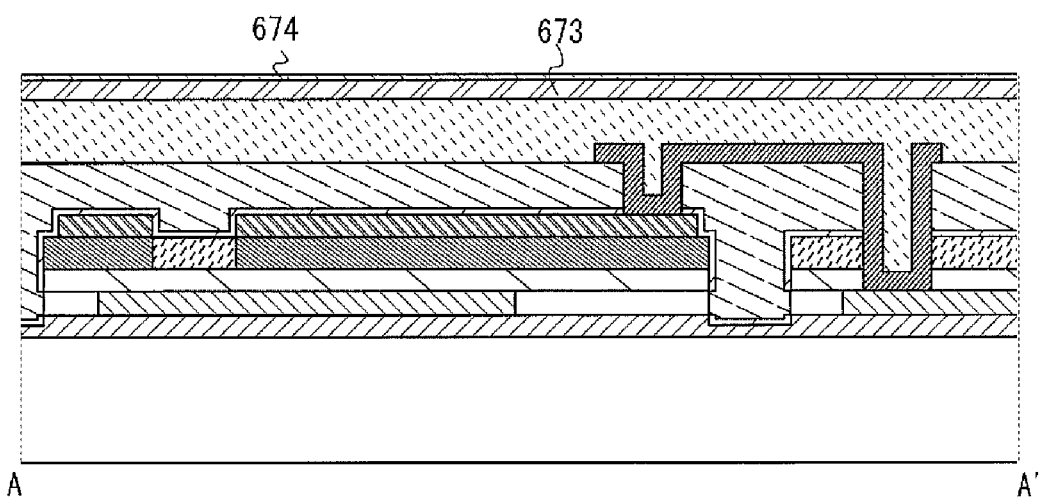
Figure 37A:
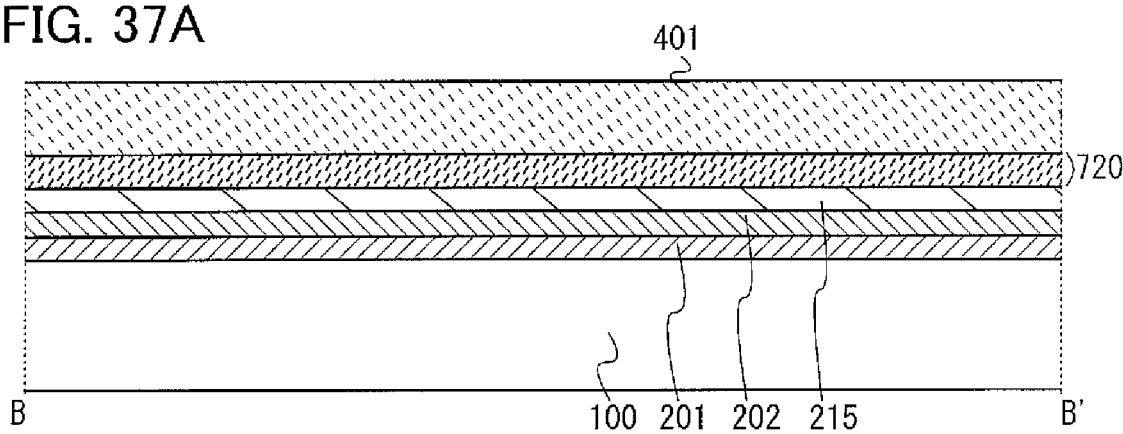
FIGS. 37A to 37C illustrate an example of a method for manufacturing a thin film transistor and a display device.
Figure 37B:
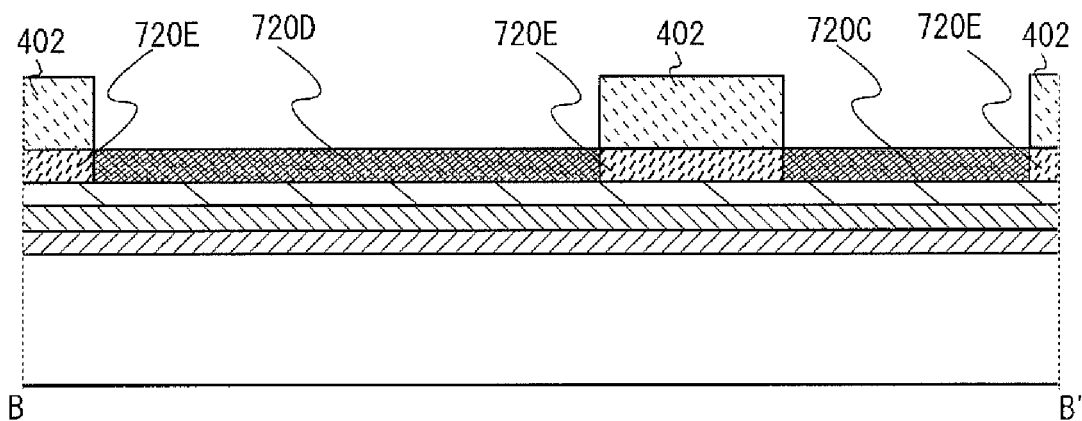
Figure 37C:
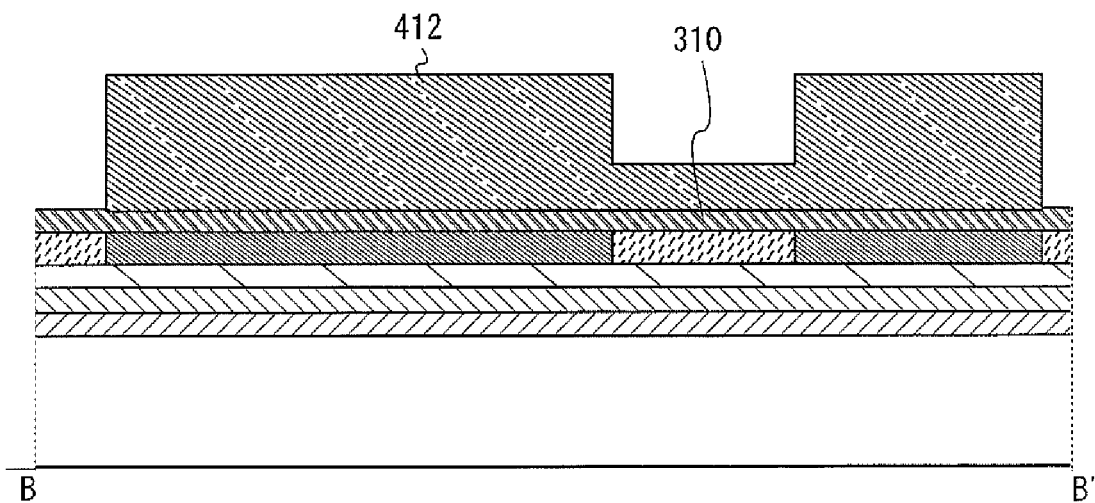
Figure 39A:
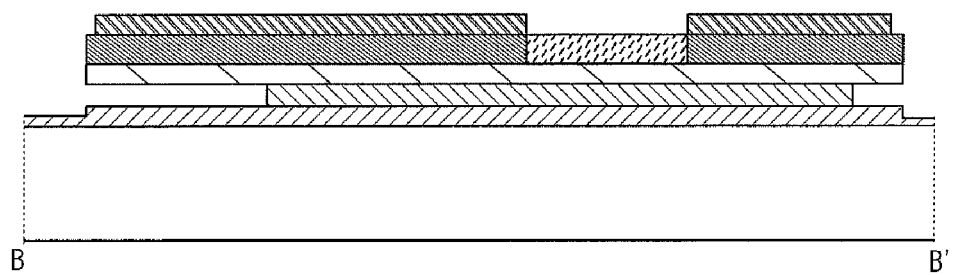
FIGS. 39A to 39C illustrate an example of a method for manufacturing a thin film transistor and a display device.
Figure 39B:
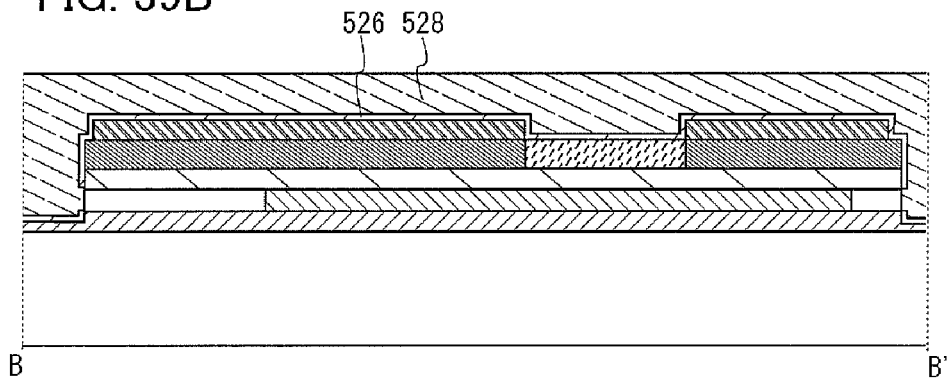
Figure 39C:
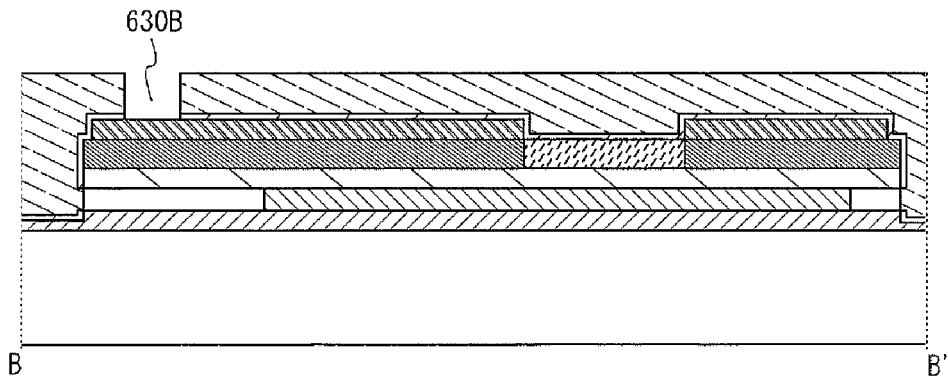
Figure 40A:
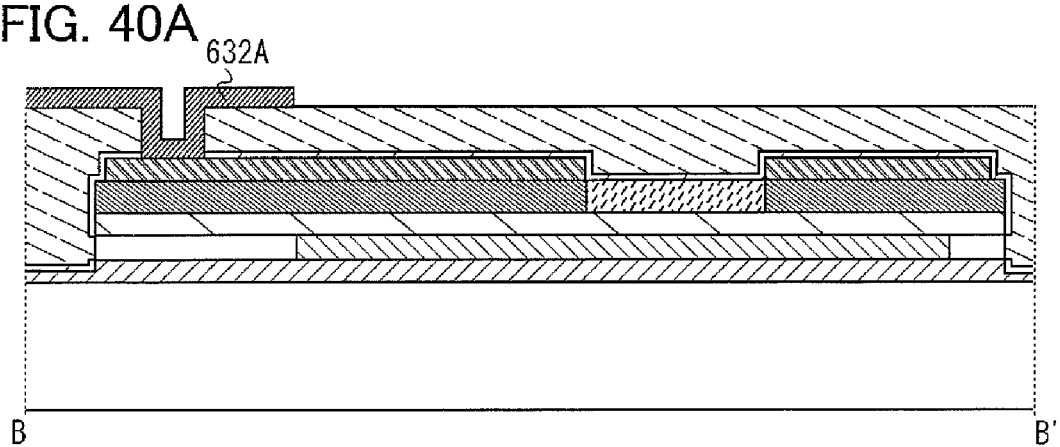
FIGS. 40A to 40C illustrate an example of a method for manufacturing a thin film transistor and a display device.
Figure 40B:
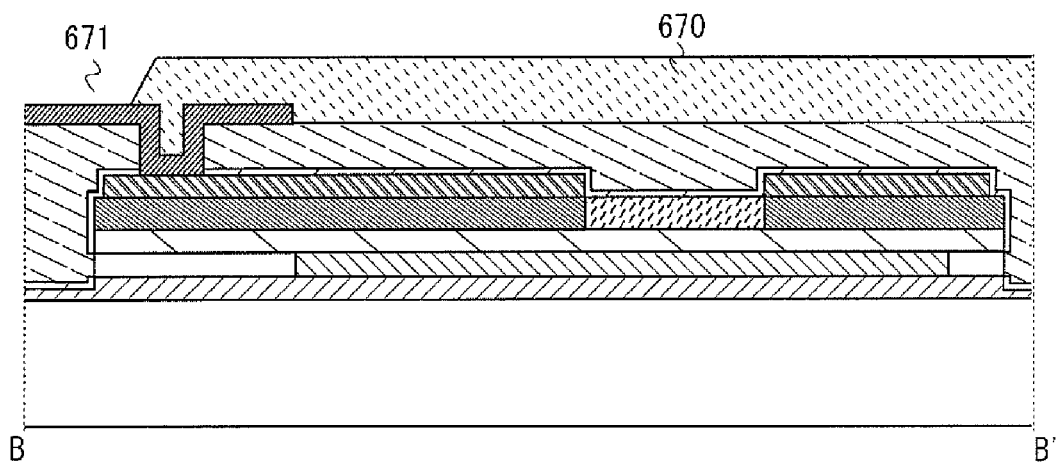
Figure 40C:
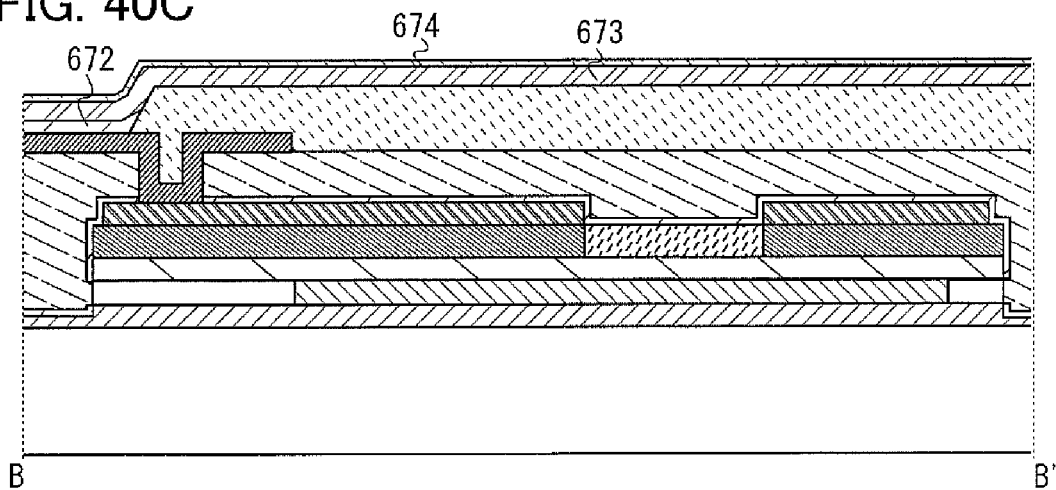
Figure 41A:
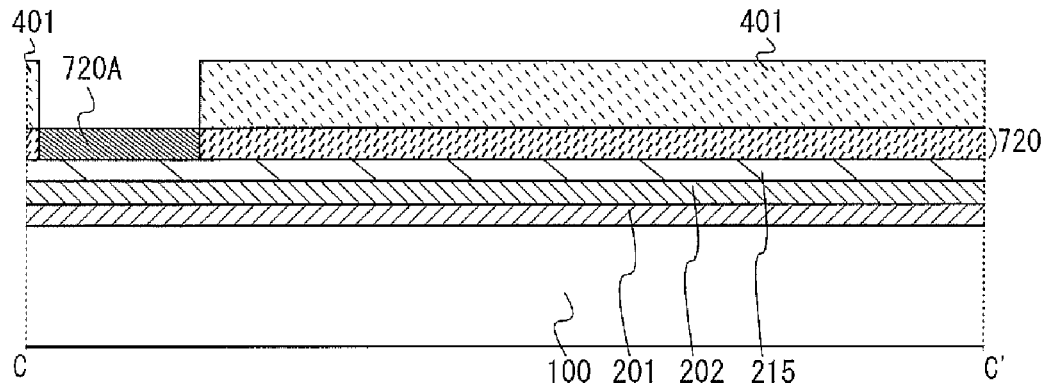
FIGS. 41A to 41C illustrate an example of a method for manufacturing a thin film transistor and a display device.
Figure 41B:
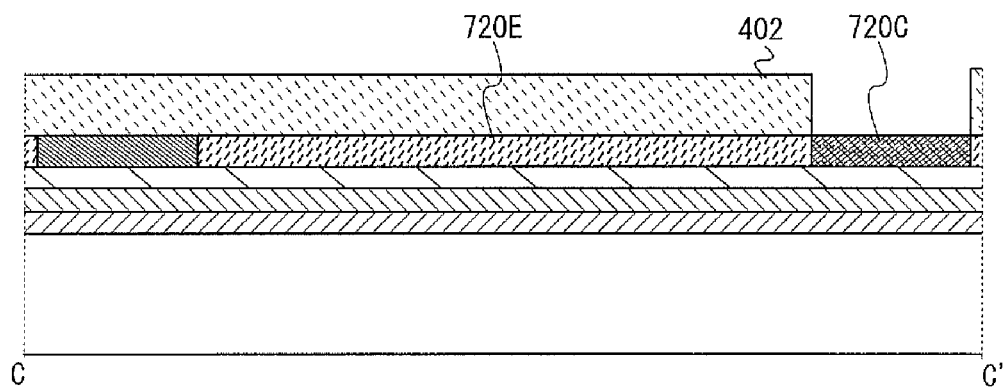
Figure 41C:
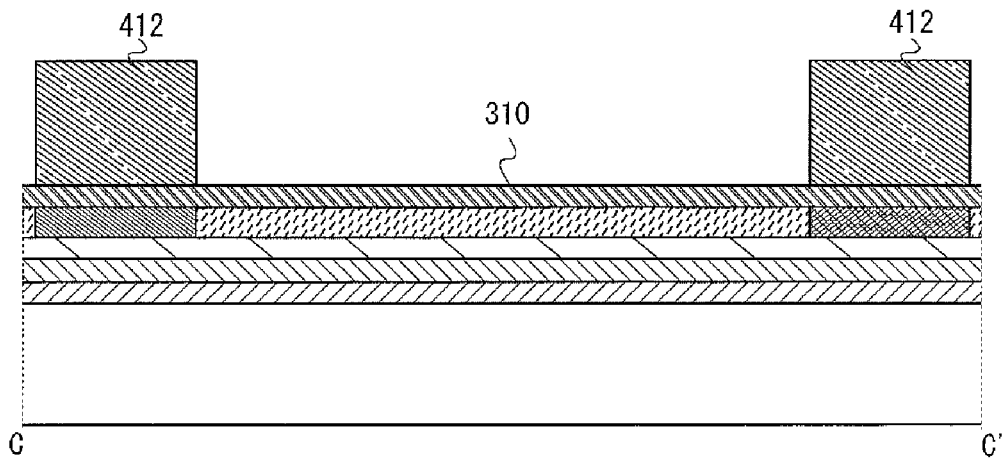
Figure 43A:
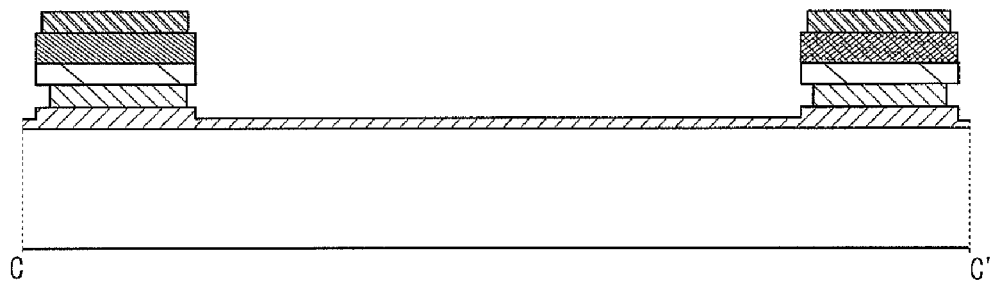
FIGS. 43A to 43C illustrate an example of a method for manufacturing a thin film transistor and a display device.
Figure 43B:
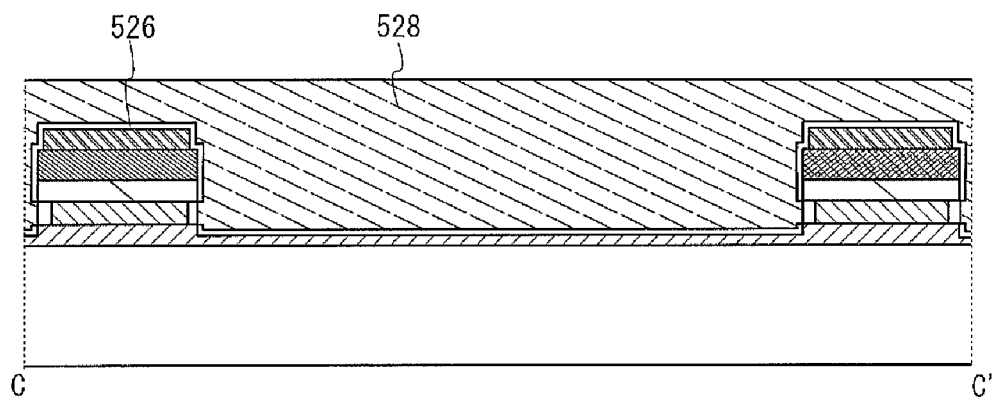
Figure 43C:
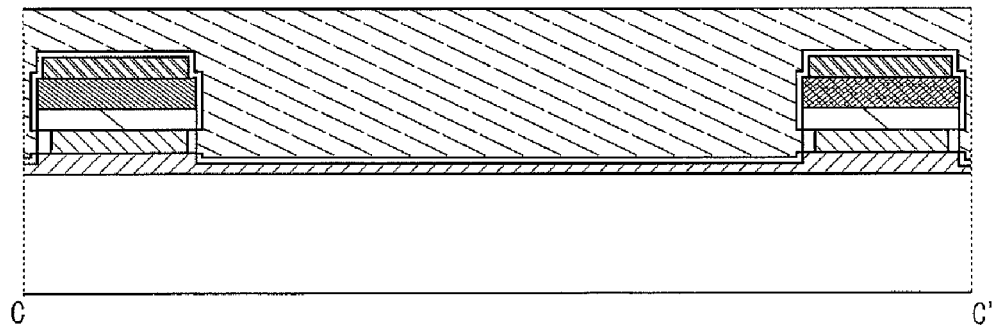
Figure 44A:
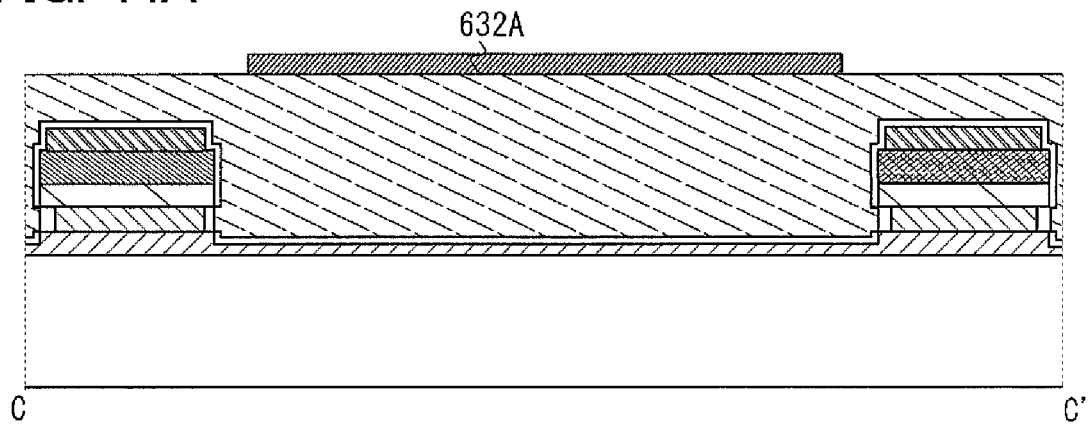
FIGS. 44A to 44C illustrate an example of a method for manufacturing a thin film transistor and a display device.
Figure 44B:
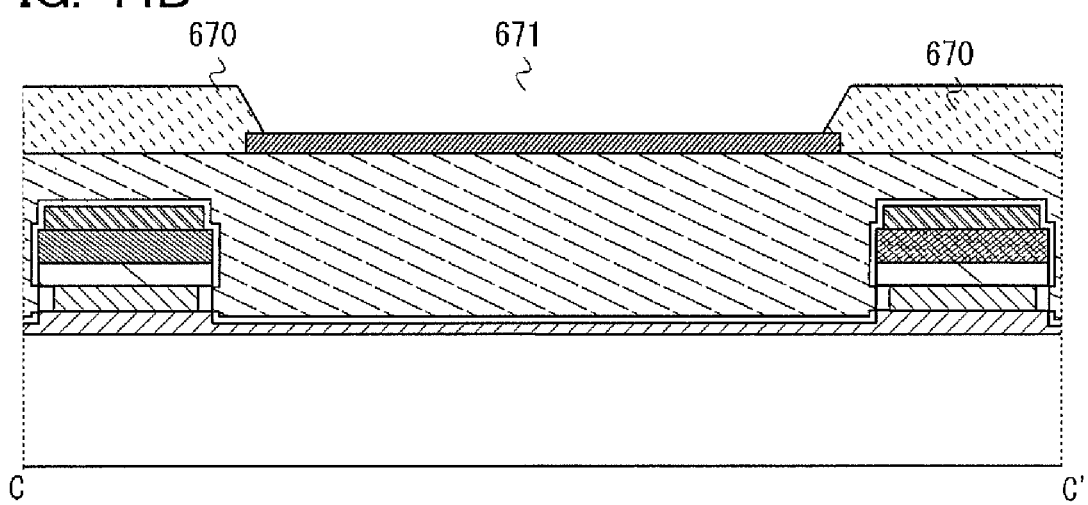
Figure 44C:
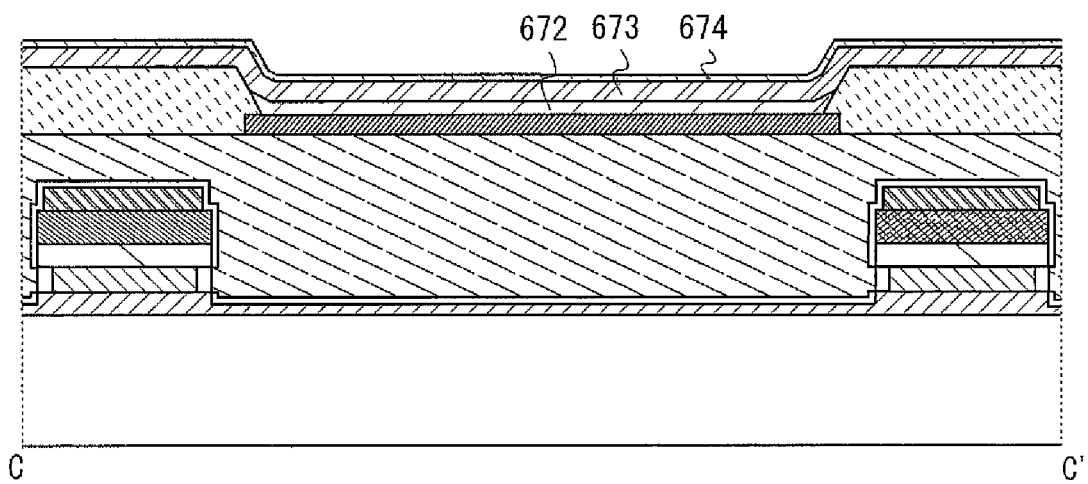

Although the third insulating film may be formed using only a first protection film 526, the third insulating film is formed using the first protection film 526 and a second protection film 528 in this embodiment (see FIGS. 35B, 39B, and 43B).

The first protection film 526 may be formed using silicon nitride containing hydrogen or silicon oxynitride containing hydrogen to prevent the semiconductor layer from being contaminated by entering and diffusion of impurities such as a metal into the semiconductor layer.

As a method for manufacturing the first protection film 526, a CVD method, a sputtering method, and the like can be given; however, the method is not limited thereto.

In the case where the first protection film 526 is formed to have a thickness which is far smaller than the thickness of the gate electrode layer 716 by a CVD method or the like, the first protection film 526 is less formed or is not formed near the cavity on the side surface of the gate electrode layer 716 as shown in FIGS. 35B, 39B, and 43B.

On the other hand, in the case where the thickness of the first protection film 526 is sufficiently large, the first protection film 526 can be formed even near the cavity on the side surface of the gate electrode layer 716.

The second protection film 528 is formed by a method by which the surface thereof becomes roughly planar.

The surface of the second protection film 528 is made to be roughly planar, thereby, for example, preventing a first pixel electrode layer 632 (632A and 632B) formed over the second protection film 528 from being disconnected.

Therefore, "roughly planar" in this embodiment is as planar as the above-described object can be achieved, and high planarity is not needed.

It is preferable that the second protection film 528 include a stack of the above-described protection film formed by a method by which the surface thereof becomes roughly planar and a protection film which covers that protection film and prevents entering and release of moisture.

In particular, when the second protection film is formed using an organic compound, it is preferable to stack a protection film which prevents entering and release of moisture.

This protection film which prevents entering and release of moisture provided can prevent deterioration of a light-emitting element which is formed later, as compared to the case where this protection film is not provided.

Specifically, the protection film which prevents entering and release of moisture is preferably formed using silicon nitride, silicon oxynitride, aluminum oxynitride, aluminum nitride, or the like.

As a method for forming the protection film, a sputtering method is preferably used.

Next, a first opening 630 (openings 630A and 630B) and a second opening 631 are formed in the third insulating film (see FIGS. 32, 35C, 39C, and 43C).

The first opening 630 (630A and 630B) is formed so as to reach at least a surface of the source and drain electrode layers.

The second opening 631 is formed so as to reach at least a surface of the gate electrode layer.

The method for forming the first opening 630 and the second opening 631 is not limited to any particular method and may be selected as appropriate depending on the diameter of the first opening 630 or the like.

The first opening 630 is formed so as to reach the source and drain electrode layers 820; as shown in FIG. 32, a plurality of first openings 630 are provided at appropriate portions.

The first opening 630A is provided over the source and drain electrode layers 820B; and the first opening 630B is provided over the source and drain electrode layers 820D.

The second opening 631 is provided so as to reach the gate electrode layer 716.

That is, the second opening 631 is provided by removing not only the third insulating film but also appropriate portions of the second insulating film 215 and the single crystal semiconductor layer 720.

Note that one photomask is used when the openings are formed by a photolithography method.

Next, the first pixel electrode layer 632 (632A and 632B) is formed over the third insulating film (see FIGS. 32, 36A, 40A, and 44A).

The first pixel electrode layer 632 is formed so as to be connected to the source and drain electrode layers 820 and the gate electrode layer 716 through the first opening 630 and the second opening 631, respectively.

Specifically, the first pixel electrode layer 632A is formed so as to be connected to the source and drain electrode layers 820D through the first opening 630D.

The first pixel electrode layer 632B is formed so as to be connected to the source and drain electrode layers 820B through the first opening 630A and to the gate electrode layer 716B through the second opening 631.

Note that the first pixel electrode layer 632 may be a single layer or a stacked-layer film including a plurality of films.

One photomask is used when the first pixel electrode layer 632 is formed by a photolithography method.

Since a p-channel thin film transistor is included as the thin film transistor connected to the pixel electrode layer 632A, the first pixel electrode layer 632 is preferably formed using a material that functions as an anode.

As the material that functions as an anode, a material that has a high work function and is a conductive material having a light-shielding property is preferably used.

For example, aluminum, titanium, titanium nitride, tantalum, tantalum nitride, silver, and the like can be given; a stacked-layer structure thereof is preferably used.

Next, a bank 670 is formed over the third insulating film and a side surface (an end portion) of the first pixel electrode layer 632A.

The bank has an opening 671 such that the first pixel electrode layer 632A is exposed through the opening 671.

The bank is formed using an organic resin film, an inorganic insulating film, or organic polysiloxane.

when the bank is formed using an organic resin film, it is preferable that the bank include a stack in which a protection film which prevents entering and release of moisture from the organic resin film is stacked, in order to prevent deterioration of a light-emitting element which is formed later.

Specifically, the first layer may be formed using polyimide, polyamide, polyimide amide, acrylic, or benzocyclobutene, and silicon nitride, silicon oxynitride, aluminum oxynitride, or aluminum nitride may be deposited thereon as the second layer.

In particular, it is preferable that the protection film be formed using a photosensitive material as follows: an opening is formed over the first pixel electrode layer 632A such that a sidewall of the opening slopes with continuous curvature; and the protection film which prevents entering and release of moisture is formed so as to have a sloping surface to cover the top and side surfaces of the opening.

Next, an EL layer 672 is formed so as to be in contact with the first pixel electrode layer 632A in the opening of the bank.

The EL layer 672 may be a single layer or a stacked-layer film in which a plurality of layers is stacked.

The EL layer 672 includes at least a light-emitting layer.

Then, a second pixel electrode layer 673 is formed using a material that functions as a cathode, to cover the EL layer 672.

The second pixel electrode layer 673 corresponds to the common electrode 40 shown in FIG. 27.

The second pixel electrode layer 673 can be formed using a conductive material having a light-transmitting property and a low work function.

The thickness of the second pixel electrode layer 673 is set to as small as light is transmitted therethrough.

For example, Al, MgAg, or the like which has a thickness of 5 to 20 nm may be used.

The second pixel electrode layer 673 may be a single layer or a stacked-layer film in which a plurality of layers is stacked.

The second pixel electrode layer 673 may be formed by a sputtering method, a CVD method, or the like; the forming method thereof is not limited to a particular method.

The first pixel electrode layer 632A, the EL layer 672, and the second pixel electrode layer 673 overlap each other in the opening of the bank, thereby forming a light-emitting element.

The light-emitting element corresponds to the light-emitting element 34 in FIG. 27.

Then, it is preferable to form a third protection film 674 over the second pixel electrode layer 673 and the bank 670 so that oxygen, hydrogen, moisture, carbon dioxide, and the like do not enter the light-emitting element.

As a material of the third protection film 674, a material having a function of preventing entering and release of moisture is selected like the second protection film 528.

The third protection film is preferably formed using silicon nitride, silicon oxynitride, aluminum oxynitride, aluminum nitride, or the like.

Further, it is provided that a silicon nitride film, a DLC film, or the like be provided to cover the third protection film.

Then, though not shown in the drawing, it is preferable to further perform packaging (sealing) with a protection film (e.g., a bonding film or an ultraviolet curing resin film) or a covering material in order to prevent exposure to the outside air.

It is preferable to use a material which has high airtightness and causes degasification as little as possible to provide the protection film or the covering material.

Through the above-described process, components up to the light-emitting element of a top-emission EL display device can be formed.

However, the EL display device that is one embodiment of the present invention is not limited to the above description: the present invention can be applied to a bottom-emission EL display device or a dual-emission EL display device.

In the bottom-emission structure or the dual-emission structure, a conductive material having a light-transmitting property may be used as the first pixel electrode layer 632.

Note that the materials and the formation methods of the protection films and the like described above are not limited to those described above as long as light emission of the EL layer is not interfered and deterioration and the like can be prevented.

In the top-emission structure, the first pixel electrode layer 632A may be formed so as to cover the region where the pixel circuit is formed.

In that case, first, the conductive layer corresponding to the first pixel electrode layer 632B may be formed; an insulating film having the first opening 530D may be formed over the conductive layer; and the first pixel electrode layer 532A may be formed so as to be connected to the source and drain electrode layers 820D through the first opening 630D.

The first pixel electrode layer 632A which is formed so as to cover the region where the pixel circuit is formed can enlarge the light-emitting region, so that images can be displayed with higher definition.

Note that although an organic EL element is described as a light-emitting element in Embodiment 4, an inorganic EL element can alternatively be used as a light-emitting element.

Through the above-described manner, an EL display device can be manufactured.

As described above, the number of photomasks used in forming a thin film transistor is reduced, which can lead to a large reduction of the number of steps for manufacturing a thin film transistor and/or an EL display device.

Further, the number of steps for manufacturing a thin film transistor can be significantly reduced without involving a complicated step such as backside light exposure, resist reflow, or lift-off.

Therefore, the number of steps for manufacturing an EL display device can be significantly reduced without involving a complicated step.

Moreover, the number of steps for manufacturing a thin film transistor can be significantly reduced while maintaining electrical characteristics of the thin film transistor.

According to the method for manufacturing a thin film transistor described above, patterning in manufacturing a thin film transistor can be completed with the use of one photomask, so that misalignment of a photomask for etching can be prevented.

Furthermore, the manufacturing cost of an EL display device can be significantly reduced.

Further, since a single crystal semiconductor layer is used as a semiconductor film, an EL display device with high integration, high operation speed, and low power consumption can be manufactured.

Embodiment 5

In Embodiment 5, electronic devices in which a display panel or a display device manufactured by any of the methods described in Embodiments 1 to 4 is incorporated as a display portion will be described with reference to FIGS. 45A and 45B, FIG. 46, and FIGS. 47A to 47C. As such electronic devices, for example, cameras such as video cameras or digital cameras; head mounted displays (goggle type displays); car navigation systems; projectors; car stereos; personal computers; and portable information terminals (such as mobile computers, mobile phones, and e-book readers) can be given. Examples of the electronic device are illustrated in FIGS. 45A and 45B.

Figure 45A:
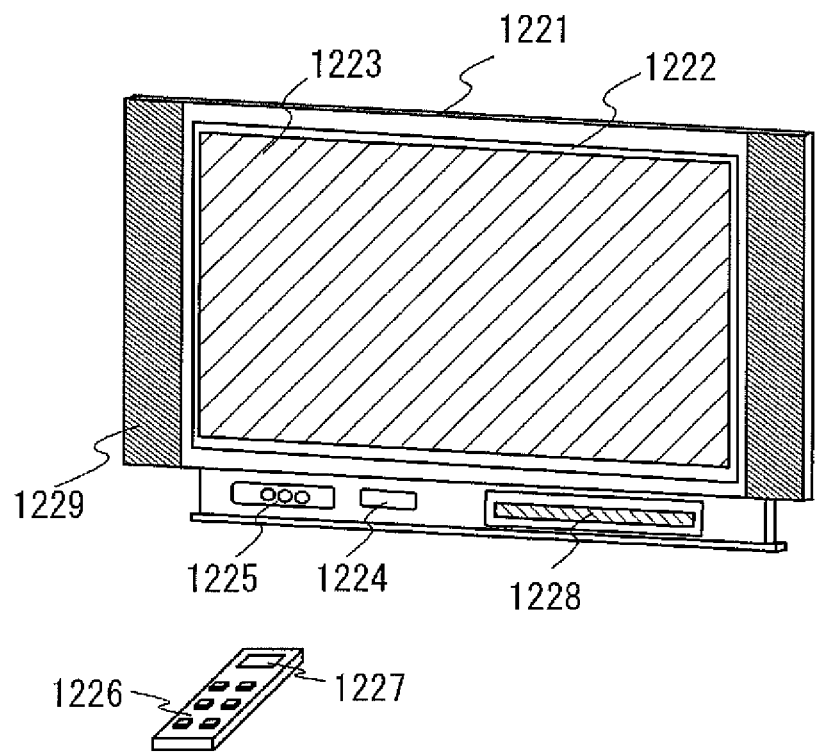
FIGS. 45A and 45B illustrate electronic devices each using a display device.
Figure 45B:
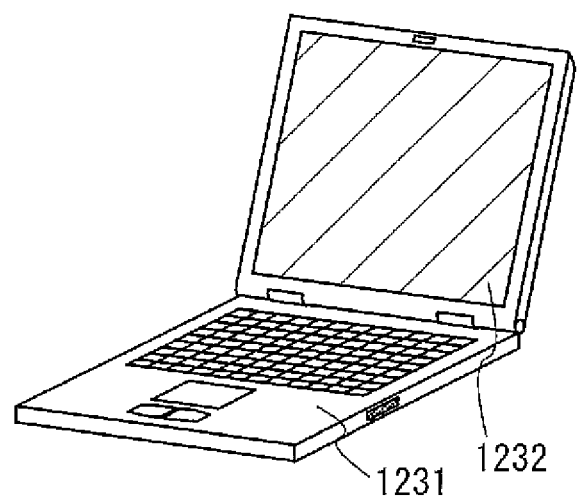

FIG. 45A illustrates a television device. A television device illustrated in FIG. 45A can be completed by incorporating a display panel manufactured using the present invention into a housing. A main screen 1223 is formed using the display panel manufactured by any of the manufacturing methods described in Embodiments 1 to 4, and a speaker portion 1229, operation switches, and the like are provided as its accessory equipment.

As illustrated in FIG. 45A, a display panel 1222 manufactured by any of the manufacturing methods described in Embodiments 1 to 4 is incorporated into a housing 1221, and general TV broadcast can be received by a receiver 1225. When the television device is connected to a communication network by wired or wireless connections via a modem 1224, one-way (from a sender to a receiver) or two-way (between a sender and a receiver or between receivers) information communication can be performed. The television device can be operated using switches incorporated into the housing or by a remote control device 1226 provided separately. A display portion 1227 which displays output information may be provided for the remote control device 1226.

Further, the television device may include a sub-screen 1228 formed using a second display panel for displaying channels, volume, and the like, in addition to the main screen 1223.

Figure 46:
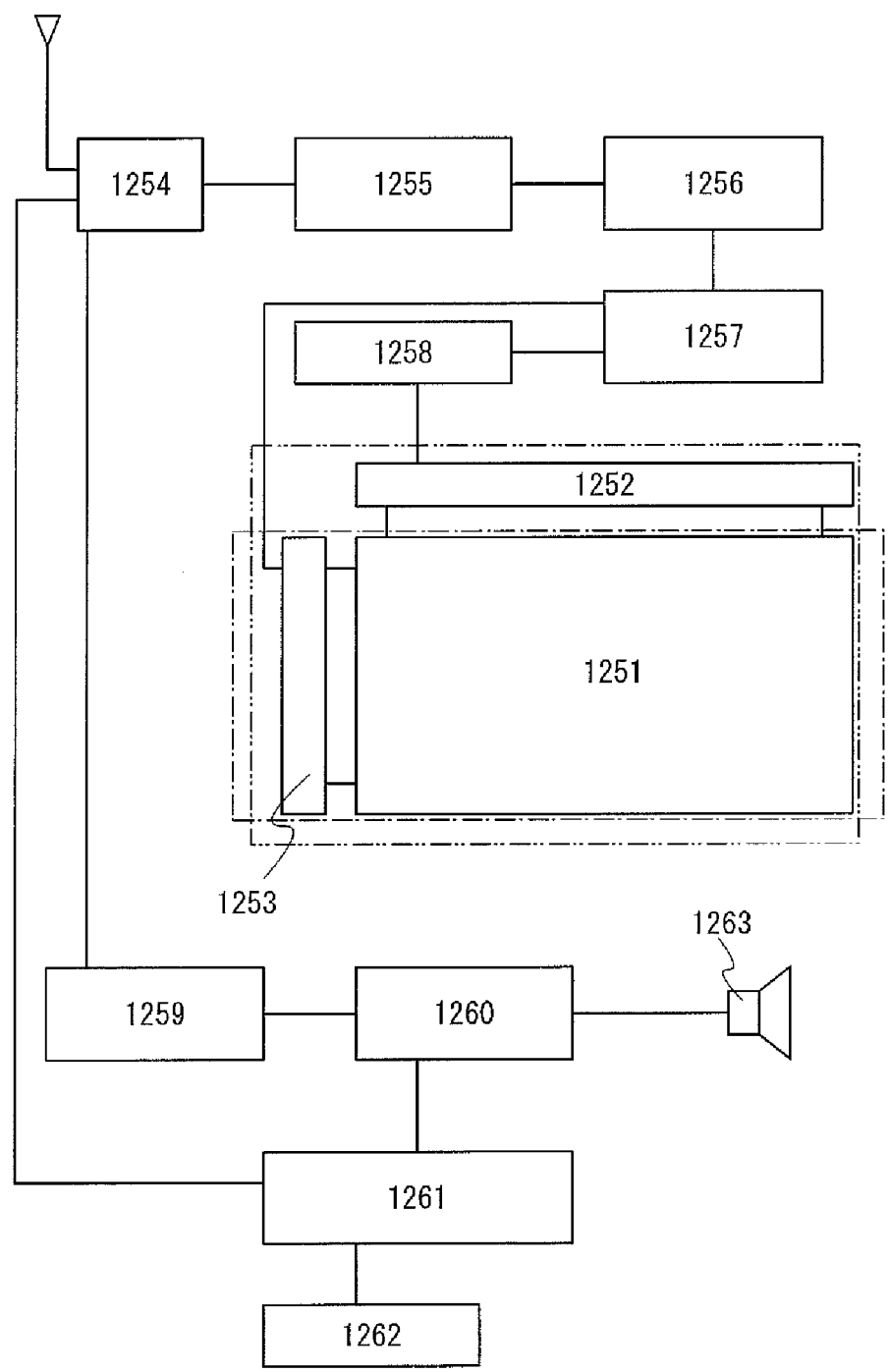
FIG. 46 illustrates an electronic device using a display device.

FIG. 46 is a block diagram of a main structure of a television device. A pixel portion 1251 is formed in a display region. A signal line driver circuit 1252 and a scan line driver circuit 1253 may be mounted on the display panel 1250 by a COG method.

As structures of other external circuits, a video signal amplifier circuit 1255 amplifying a video signal among signals received by a tuner 1254, a video signal processing circuit 1256 converting signals output from the video signal amplifier circuit 1255 into chrominance signals corresponding to respective colors of red, green, and blue, a control circuit 1257 for converting the video signal into a signal which meets input specifications of a driver IC, and the like are provided on the input side of the video signal. The control circuit 1257 outputs signals to each of the scan line side and the signal line side. In the case of digital drive, a signal dividing circuit 1258 may be provided on the signal line side and an input digital signal may be divided into integral pieces and supplied.

Among signals received by the tuner 1254, audio signals are transmitted to an audio signal amplifier circuit 1259, and an output thereof is supplied to a speaker 1263 through an audio signal processing circuit 1260. A control circuit 1261 receives control information on receiving station (receiving frequency) and volume from an input portion 1262 and transmits signals to the tuner 1254 and the audio signal processing circuit 1260.

The present invention is not limited to the television device and can also be applied to a large-size display medium such as an information display board at a train station, an airport, and the like, or an advertisement display board on the street, as well as a monitor of a personal computer. By using the present invention, productivity of these display mediums can be improved.

When the display panel or display device manufactured by any of the manufacturing methods of a display device described in Embodiments 1 to 4 is applied to the main screen 1223 and/or the sub-screen 1228, productivity of television devices can be increased.

A mobile computer illustrated in FIG. 45B includes a main body 1231, a display portion 1232, and the like. When the display panel or display device manufactured by any of the manufacturing methods of a display device described in Embodiments 1 to 4 is applied to the display portion 1232, productivity of computers can be increased.

Figure 47A:
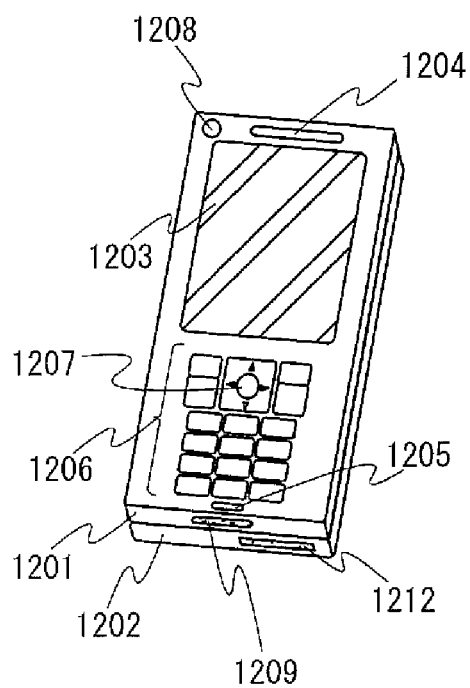
FIGS. 47A to 47C illustrate an electronic device using a display device.
Figure 47B:
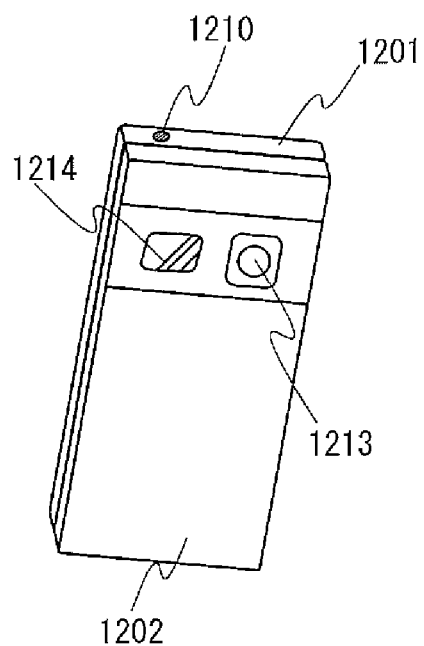
Figure 47C:
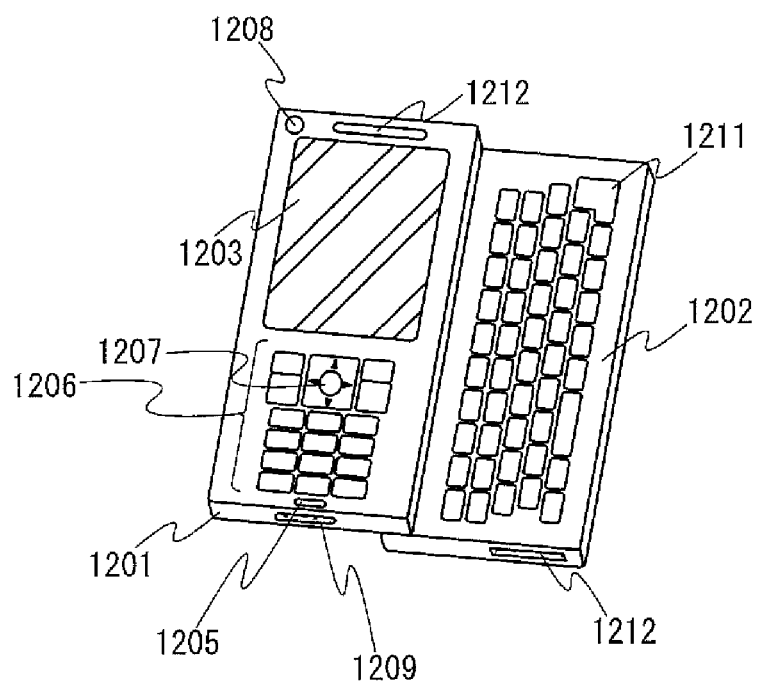

FIGS. 47A to 47C illustrate an example of a mobile phone to which the present invention is applied. FIG. 47A is a front view, FIG. 47B is a rear view, and FIG. 47C is a front view when two housings are slide out. A mobile phone 1200 includes two housings 1201 and 1202. The mobile phone 1200 is a so-called smartphone which has both functions of a mobile phone and a portable information terminal, and incorporates a computer and can process a variety of data processing in addition to voice calls.

The mobile phone 1200 includes the housing 1201 and the housing 1202. The housing 1201 includes a display portion 1203, a speaker 1204, a microphone 1205, operation keys 1206, a pointing device 1207, a front camera lens 1208, a jack 1209 for an external connection terminal, an earphone terminal 1210, and the like, while the housing 1202 includes a keyboard 1211, an external memory slot 1212, a rear camera 1213, a light 1214, and the like. In addition, an antenna is incorporated in the housing 1201.

In addition to the above-described structure, a wireless IC chip, a small-size memory device, or the like may be incorporated in the mobile phone 1200.

The housings 1201 and 1202 overlapped with each other (illustrated in FIG. 47A) can slide out to be developed as illustrated in FIG. 47C. The display panel or display device manufactured by any of the manufacturing methods of a display device described in Embodiments 1 to 4 can be incorporated in the display portion 1203. Since the display portion 1203 and the front camera lens 1208 are provided in the same plane, the mobile phone 1200 can be used as a videophone. A still image and a moving image can be taken by the rear camera 1213 and the light 1214 by using the display portion 1203 as a viewfinder.

By using the speaker 1204 and the microphone 1205, the mobile phone 1200 can be used as an audio recording device (sound recorder) or an audio reproducing device. With use of the operation keys 1206, operation of incoming and outgoing calls, simple information input for electronic mail or the like, scrolling of a screen displayed on the display portion, cursor motion for selecting information displayed on the display portion, and the like are possible.

If much information needs to be handled, such as the case of creating documents and using the mobile phone 1200 as a portable information terminal, the use of the keyboard 1211 is convenient. The housings 1201 and 1202 overlapped with each other (FIG. 47A) can be slide out to be developed as illustrated in FIG. 47C. In the case where the mobile phone 1200 is used as a portable information terminal, smooth operation with the keyboard 1211 and the pointing device 1207 can be performed. The jack 1209 for an external connection terminal can be connected to various cables such as an AC adopter or a USB cable, whereby the mobile phone 1200 can be charged or can perform data communication with a personal computer or the like. Moreover, by inserting a recording medium into the external memory slot 1212, the mobile phone 1200 can deal with storing and moving a large capacity of data.

In the rear surface of the housing 1202 (FIG. 47B), the rear camera 1213 and the light 1214 are provided, and a still image and a moving image can be taken by using the display portion 1203 as a viewfinder.

Further, the mobile phone 1200 may have an infrared communication function, a USB port, a function of receiving one segment television broadcast, a non-contact IC chip, an earphone jack, or the like, in addition to the above-described functions and structures.

Since various electronic devices described in Embodiment 5 can be manufactured by any of the manufacturing methods of a thin film transistor and a display device described in Embodiments 1 to 4, productivity of these electronic devices can be increased by using the present invention.

Accordingly, by using the present invention, the manufacturing cost of these electronic devices can be significantly reduced.

Embodiment 6

In Embodiment 6, examples of a semiconductor device which is manufactured using the thin film transistor of the present invention will be described.

Figure 48:
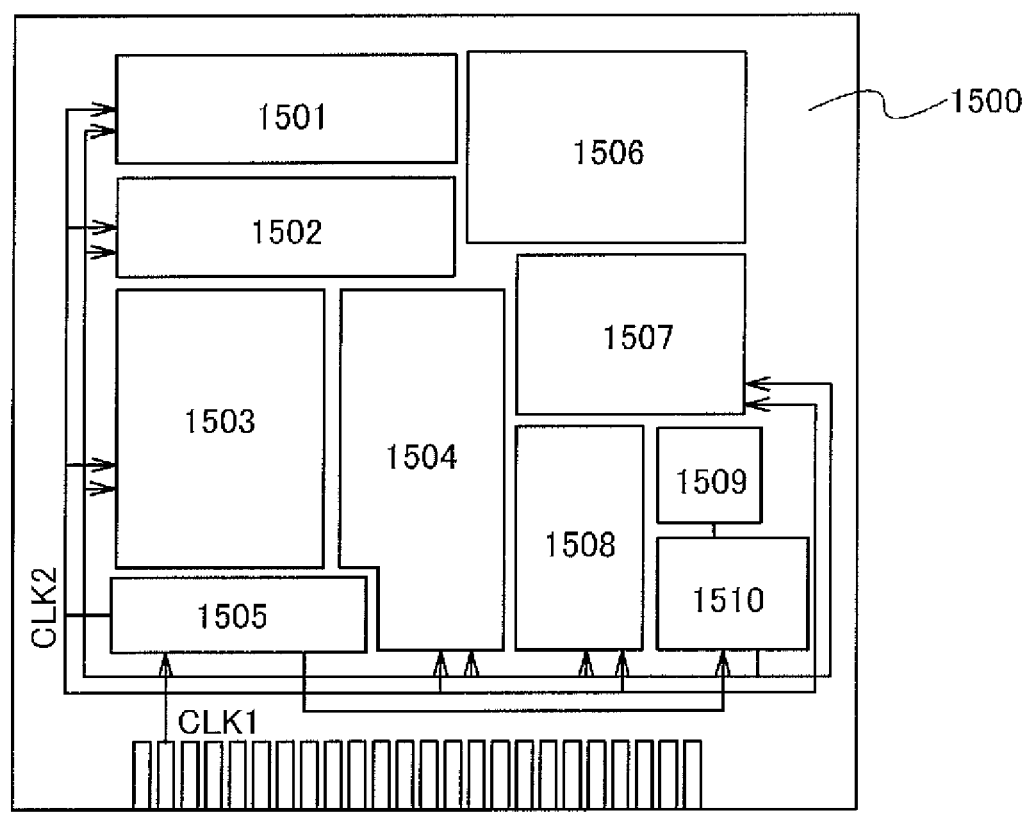
FIG. 48 is a block diagram of one mode of a microprocessor.

FIG. 48 shows an example of a microprocessor 1500 as an example of a semiconductor device. The microprocessor 1500 is manufactured using the semiconductor substrate formed according to the present invention as described above. The microprocessor 1500 includes an arithmetic logic unit (ALU) 1501, an ALU controller 1502, an instruction decoder 1503, an interrupt controller 1504, a timing controller 1505, a register 1506, a register controller 1507, a bus interface (Bus I/F) 1508, a read only memory (ROM) 1509, and a memory interface (ROM I/F) 1510.

An instruction inputted to the microprocessor 1500 through the bus interface 1508 is inputted to the instruction decoder 1503 and decoded. Then, the instruction is inputted to the ALU controller 1502, the interrupt controller 1504, the register controller 1507, and the timing controller 1505. The ALU controller 1502, the interrupt controller 1504, the register controller 1507, and the timing controller 1505 perform various controls on the basis of the decoded instruction. Specifically, the ALU controller 1502 generates a signal for controlling the operation of the arithmetic logic unit 1501. The interrupt controller 1504 judges an interrupt request from an external input/output device, a peripheral circuit, and/or the like on the basis of its priority and the mask state, and processes the request while a program is executed in the microprocessor 1500. The register controller 1507 generates an address of the register 1506, and reads/writes data from/to the register 1506 depending on the state of the microprocessor 1500. The timing controller 1505 generates signals for controlling timing of driving of the arithmetic logic unit 1501, the ALU controller 1502, the instruction decoder 1503, the interrupt controller 1504, and the register controller 1507. For example, the timing controller 1505 is provided with an internal clock generator for generating an internal clock signal CLK2 based on a reference clock signal CLK1, and supplies the clock signal CLK2 to each of the above-mentioned various circuits. Note that the microprocessor 1500 shown in FIG. 48 is an example in which the structure is simplified for illustration; a microprocessor can have various structures depending on the use.

The microprocessor 1500 like this can achieve not only an increase in processing speed but also a reduction in power consumption because an integrated circuit is formed using semiconductor layers with uniform crystal orientation (single crystal semiconductor layers) which are bonded to a substrate having an insulating surface or an insulating substrate.

Figure 49:
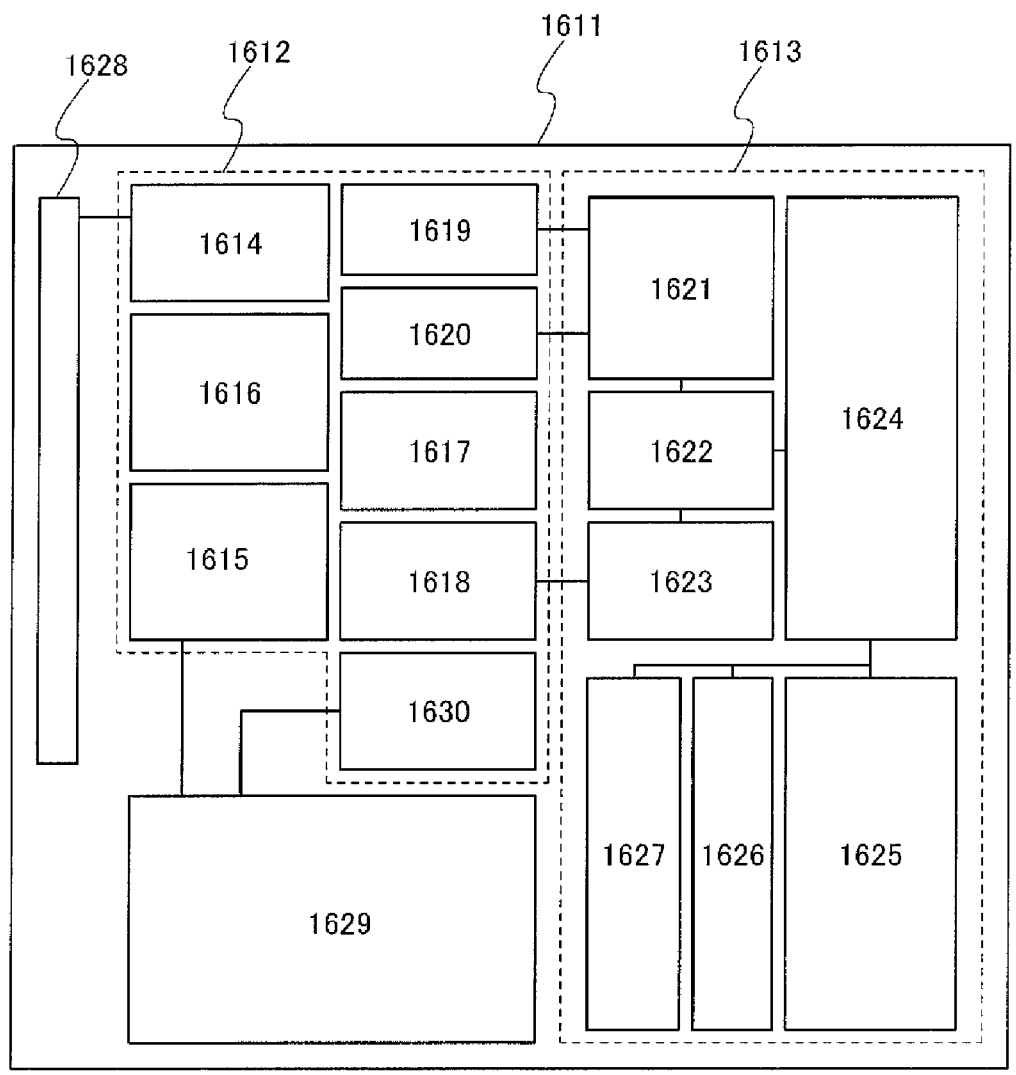
FIG. 49 is a block diagram of one mode of an RFCPU.

Next, an example of a semiconductor device with a calculation function capable of wirelessly transmitting and receiving data is described using FIG. 49. FIG. 49 illustrates an example of a computer (hereinafter referred to as a "RFCPU") which is operated by transmitting and receiving signals to/from an external device via wireless communication. An RFCPU 1611 includes an analog circuit portion 1612 and a digital circuit portion 1613. The analog circuit portion 1612 has a resonance circuit 1614 with a resonance capacitor, a rectifier circuit 1615, a constant voltage circuit 1616, a reset circuit 1617, an oscillator circuit 1618, a demodulator circuit 1619, and a modulator circuit 1620. The digital circuit portion 1613 includes a RF interface 1621, a control register 1622, a clock controller 1623, an interface 1624, a central processing unit 1625, a random access memory 1626, and a read-only memory 1627.

An operation of the RFCPU 1611 having such a structure is roughly described below. The resonance circuit 1614 generates an induced electromotive force on the basis of a signal received by an antenna 1628. The induced electromotive force is stored in a capacitor portion 1629 through the rectifier circuit 1615. The capacitor portion 1629 is preferably formed using a capacitor such as a ceramic capacitor or an electric double-layer capacitor. The capacitor portion 1629 does not need to be integrated with the RFCPU 1611 and it is also possible that the capacitor portion 1629 may be mounted as a different component on a substrate having an insulating surface included in the RFCPU 1611.

The reset circuit 1617 generates a signal that resets the digital circuit portion 1613 to be initialized. For example, a signal that rises after the increase in the power supply voltage is generated as a reset signal. The oscillator circuit 1618 changes the frequency and duty ratio of a clock signal depending on a control signal generated by the constant voltage circuit 1616. The demodulator circuit 1619 formed using a lowpass filter, for example, binarizes variation of the amplitude of a reception signal with the amplitude shift keying (ASK) system. The modulator circuit 1620 changes the amplitude of a transmission signal with the amplitude shift keying (ASK) system to transmit data. The modulator circuit 1620 changes the resonance point of the resonance circuit 1614, thereby changing the amplitude of communication signals. The clock controller 1623 generates a control signal for changing the frequency and the duty ratio of the clock signal in accordance with the power supply voltage or current consumption in the central processing unit 1625. The power supply voltage is monitored by a power supply control circuit 1630.

A signal inputted to the RFCPU 1611 through the antenna 1628 is demodulated in the demodulator circuit 1619 and is divided into a control command, data, and the like by the RF interface 1621. The control command is stored in the control register 1622. The control command includes reading of data stored in the read-only memory 1627, writing of data to the random access memory 1626, an arithmetic instruction to the central processing unit 1625, and the like. The central processing unit 1625 accesses the read-only memory 1627, the random access memory 1626, and the control register 1622 via the interface 1624. The interface 1624 has a function of generating an access signal for any of the read-only memory 1627, the random access memory 1626, and the control register 1622 on the basis of an address the central processing unit 1625 requests.

As an arithmetic method of the central processing unit 1625, a method may be employed in which the read only memory 1627 stores an OS (operating system) program and a program is read and executed upon start up. Alternatively, a method may be employed in which a circuit dedicated to arithmetic is formed and an arithmetic process is conducted using hardware. In a method in which both hardware and software are used, a method can be employed in which a part of process is conducted in the circuit dedicated to arithmetic and the other part of the arithmetic process is conducted by the central processing unit 1625 using a program.

The RFCPU 611 like this can achieve not only an increase in processing speed but also a reduction in power consumption because an integrated circuit is formed using semiconductor layers with uniform crystal orientation (single crystal semiconductor layers) which are bonded to a substrate having an insulating surface or an insulating substrate. Accordingly, the operation for a long period of time of use can be ensured even when the capacitor portion 1629 which supplies power is downsized.

The transistor formed using a single crystal semiconductor layer is superior to an amorphous silicon transistor in all operation characteristics such as current drive capability; therefore, the transistor can be downsized. Further, since a microprocessor and a RFCPU like the ones shown in FIG. 48 and FIG. 49 can be formed, a function as a computer can be equipped with a display panel. Moreover, a display which is capable of inputting and outputting data without contact can be manufactured.

This application is based on Japanese Patent Application serial no. 2009-030647 filed with Japan Patent Office on Feb. 13, 2009, the entire contents of which are hereby incorporated by reference.

What is claimed is:

1. A method for manufacturing a semiconductor device, comprising the steps of:
   forming a first insulating film over a single crystal semiconductor substrate;
   irradiating the single crystal semiconductor substrate provided with the first insulating film with an accelerated ion, so that a fragile region is formed at a predetermined depth from a top surface of the single crystal semiconductor substrate;
   forming a first conductive film over the first insulating film;
   forming a second insulating film over the first conductive film;
   attaching the second insulating film to a base substrate, and performing a thermal treatment to separate the single crystal semiconductor substrate in the fragile region, so that a single crystal semiconductor layer is formed over the base substrate;
   forming a first resist mask at least over a region which forms a channel formation region of the single crystal semiconductor layer;
   selectively adding an impurity element having one conductivity type to a region of the single crystal semiconductor layer, which is not covered with the first resist mask;
   removing the first resist mask after adding the impurity element;
   forming a second conductive film over the single crystal semiconductor layer after removing the first resist mask;
   forming a second resist mask having a depression over the second conductive film;
   performing a first etching on the first insulating film, the first conductive film, the second insulating film, the single crystal semiconductor layer, and the second conductive film by using the second resist mask to expose at least the first conductive film;
   performing a second etching with accompanying a side-etching on a part of the first conductive film to form a pattern of a gate electrode layer;
   forming a third resist mask by making the second resist mask recede to expose a part of the second conductive film, which overlaps the depression of the second resist mask; and
   performing a third etching on the part of the second conductive film by using the third resist mask to form a source and drain electrode layers.

2. The method for manufacturing a semiconductor device, according to claim 1, wherein the first etching is a dry etching and the second etching is a wet etching.

3. The method for manufacturing a semiconductor device, according to claim 1, wherein the resist mask having the depression is formed using a multi-tone mask.

4. The method for manufacturing a semiconductor device, according to claim 1, wherein the pattern of the gate electrode layer corresponds to a gate electrode, a gate wiring, a capacitor electrode, and a capacitor wiring.

5. A method for manufacturing a semiconductor device, comprising the step of selectively forming a pixel electrode so as to be connected to the source and drain electrode layers of the semiconductor device manufactured by the method according to claim 1.

6. A method for manufacturing a semiconductor device, comprising the steps of:
   forming a first insulating film over a single crystal semiconductor substrate;
   irradiating the single crystal semiconductor substrate provided with the first insulating film with an accelerated ion, so that a fragile region is formed at a predetermined depth from a top surface of the single crystal semiconductor substrate;
   forming a first conductive film over the first insulating film;
   forming a second insulating film over the first conductive film;
   attaching the second insulating film to a base substrate, and performing a thermal treatment to separate the single crystal semiconductor substrate in the fragile region, so that a single crystal semiconductor layer is formed over the base substrate;
   forming a semiconductor film containing an impurity element having one conductivity type over the single crystal semiconductor layer;
   forming a second conductive film over the semiconductor film containing the impurity element;
   forming a first resist mask having a depression over the second conductive film;
   performing a first etching on the first insulating film, the first conductive film, the second insulating film, the single crystal semiconductor layer, the semiconductor film containing the impurity element, and the second conductive film by using the first resist mask to expose at least the first conductive film;
   performing a second etching with accompanying a side-etching on a part of the first conductive film to form a pattern of a gate electrode layer;
   forming a second resist mask by making the first resist mask recede to expose a part of the second conductive film, which overlaps the depression of the first resist mask; and
   performing a third etching on the part of the second conductive film and a part of the semiconductor film containing the impurity element by using the second resist mask to form a source and drain electrode layers and a source and drain regions.

7. The method for manufacturing a semiconductor device, according to claim 6, wherein the first etching is a dry etching and the second etching is a wet etching.

8. The method for manufacturing a semiconductor device, according to claim 6, wherein the resist mask having the depression is formed using a multi-tone mask.

9. The method for manufacturing a semiconductor device, according to claim 6, wherein the pattern of the gate electrode layer corresponds to a gate electrode, a gate wiring, a capacitor electrode, and a capacitor wiring.

10. A method for manufacturing a semiconductor device, comprising the step of selectively forming a pixel electrode so as to be connected to the source and drain electrode layers of the semiconductor device manufactured by the method according to claim 6.

11. A method for manufacturing a semiconductor device, comprising the steps of:
  forming a first insulating film over a single crystal semiconductor substrate;
  irradiating the single crystal semiconductor substrate provided with the first insulating film with an accelerated ion, so that a fragile region is formed at a predetermined depth from a top surface of the single crystal semiconductor substrate;
  forming a first conductive film over the first insulating film;
  forming a second insulating film over the first conductive film;
  attaching the second insulating film to a base substrate, and performing a thermal treatment to separate the single crystal semiconductor substrate in the fragile region, so that a single crystal semiconductor layer is formed over the base substrate;
  forming a first resist mask at least over a region which forms a channel formation region of the single crystal semiconductor layer;
  selectively adding a first impurity element having one conductivity type to a region of the single crystal semiconductor layer, which is not covered with the first resist mask;
  removing the first resist mask after adding the first impurity element;
  forming a second resist mask at least over the region which forms the channel formation region of the single crystal semiconductor layer after removing the first resist mask;
  selectively adding a second impurity element having a conductivity type which is opposite to the one conductivity type of the impurity element to a region of the single crystal semiconductor layer, which is not covered with the second resist mask;
  removing the second resist mask after adding the second impurity element;
  forming a second conductive film over the single crystal semiconductor layer after removing the second resist mask;
  forming a third resist mask having a depression over the second conductive film;
  performing a first etching on the first insulating film, the first conductive film, the second insulating film, the single crystal semiconductor layer, and the second conductive film by using the third resist mask to expose at least the first conductive film;
  performing a second etching with accompanying a side-etching on a part of the first conductive film to form a pattern of a gate electrode layer;
  forming a fourth resist mask by making the third resist mask recede to expose a part of the second conductive film, which overlaps a depression of the second resist mask; and
  performing a third etching on the part of the second conductive film by using the fourth resist mask to form a source and drain electrode layers.

12. The method for manufacturing a semiconductor device, according to claim 11, wherein the first etching is a dry etching and the second etching is a wet etching.

13. The method for manufacturing a semiconductor device, according to claim 11, wherein the resist mask having the depression is formed using a multi-tone mask.

14. The method for manufacturing a semiconductor device, according to claim 11, wherein the pattern of the gate electrode layer corresponds to a gate electrode, a gate wiring, a capacitor electrode, and a capacitor wiring.

15. A method for manufacturing a semiconductor device, comprising the step of selectively forming a pixel electrode so as to be connected to the source and drain electrode layers of the semiconductor device manufactured by the method according to claim 11.

* * * * *